(12) United States Patent
Kish, Jr. et al.

(10) Patent No.: US 7,079,720 B2
(45) Date of Patent: Jul. 18, 2006

(54) METHOD OF OPERATING AN ARRAY OF LASER SOURCES INTEGRATED IN A MONOLITHIC CHIP OR IN A PHOTONIC INTEGRATED CIRCUIT (PIC)

(75) Inventors: Fred A. Kish, Jr., Palo Alto, CA (US); Charles H. Joyner, Sunnyvale, CA (US); David F. Welch, Menlo Park, CA (US); Robert B. Taylor, Windsor Mill, MD (US); Alan C. Nilsson, Mountain View, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 10/917,798

(22) Filed: Aug. 13, 2004

(65) Prior Publication Data

US 2005/0018721 A1 Jan. 27, 2005

Related U.S. Application Data

(62) Division of application No. 10/267,330, filed on Oct. 8, 2002.

(60) Provisional application No. 60/328,207, filed on Oct. 9, 2001, provisional application No. 60/328,332, filed on Oct. 9, 2001, provisional application No. 60/370,345, filed on Apr. 5, 2002, provisional application No. 60/378,010, filed on May 10, 2002, provisional application No. 60/367,595, filed on Mar. 25, 2002.

(51) Int. Cl.
*G02B 6/12* (2006.01)

(52) U.S. Cl. .............................. 385/14; 372/26; 372/32; 372/50; 398/91

(58) Field of Classification Search .................... 385/2, 385/3, 8–10, 14, 24, 31, 33, 34, 37, 46; 372/26, 372/20, 32, 50; 398/1, 9, 87, 91, 79, 42, 398/196
See application file for complete search history.

(56) References Cited

U.S. PATENT DOCUMENTS

| 4,835,782 A | 5/1989 | Kaede et al. .................. 372/32 |
| 5,341,391 A | 8/1994 | Ishimura ....................... 372/46 |
| 5,383,208 A | 1/1995 | Queniat et al. ................ 372/29 |
| 5,394,489 A | 2/1995 | Koch ........................... 385/14 |
| 5,418,183 A | 5/1995 | Joyner et al. ................ 437/129 |

(Continued)

FOREIGN PATENT DOCUMENTS

EP 1047969 B1 11/2000

(Continued)

OTHER PUBLICATIONS

Thomas L. Koch et al., "Semiconductor Photonic Integrated Circuits", *IEEE Journal of Quantum Electronics*, vol. 27(3), pp. 641-653, Mar. 1991.

(Continued)

*Primary Examiner*—Frank G. Font
*Assistant Examiner*—James P. Hughes
(74) *Attorney, Agent, or Firm*—W. Douglas Carothers, Jr.

(57) ABSTRACT

A method of operating an array of laser sources integrated as an array in a single monolithic chip where the steps include designing the laser sources to have different target emission wavelengths so that together they form a spectral emission wavelength grid, coupling outputs from the laser sources to an array of gain/loss elements also integrated on the single monolithic chip, one each receiving the output from a respective laser source; and adjusting the outputs with the gain/loss elements so that the power levels across the laser source array are substantially uniform.

30 Claims, 19 Drawing Sheets

U.S. PATENT DOCUMENTS

| | | | |
|---|---|---|---|
| 5,450,431 A | 9/1995 | Glance et al. | |
| 5,530,580 A | 6/1996 | Thompson et al. | 359/248 |
| 5,536,085 A | 7/1996 | Li et al. | 372/50 |
| 5,550,666 A | 8/1996 | Zirngibl | 359/125 |
| 5,600,742 A | 2/1997 | Zirngibl | 385/37 |
| 5,612,968 A | 3/1997 | Zah | 372/50 |
| 5,617,234 A | 4/1997 | Koga et al. | 359/131 |
| 5,631,768 A | 5/1997 | Bruno | 359/333 |
| 5,663,823 A | 9/1997 | Suzuki | 359/182 |
| 5,663,824 A | 9/1997 | Koch et al. | 359/184 |
| 5,745,270 A | 4/1998 | Koch | 359/124 |
| 5,745,613 A | 4/1998 | Fukuchi et al. | 385/24 |
| 5,784,183 A | 7/1998 | Aoki et al. | 359/124 |
| 5,805,755 A | 9/1998 | Amersfoort et al. | 385/131 |
| 5,825,792 A | 10/1998 | Villeneuve et al. | 372/32 |
| 5,870,512 A | 2/1999 | Koch et al. | 385/14 |
| 5,875,273 A | 2/1999 | Mizrahi et al. | 385/37 |
| 5,889,906 A | 3/1999 | Chen | 385/28 |
| 5,891,748 A | 4/1999 | Sakata | 438/31 |
| 5,894,362 A | 4/1999 | Onaka et al. | 359/124 |
| 5,913,000 A | 6/1999 | Doerr et al. | 385/46 |
| 5,917,625 A | 6/1999 | Ogusu et al. | 359/130 |
| 5,946,331 A | 8/1999 | Amersfoort et al. | 372/23 |
| 5,949,562 A | 9/1999 | Kubota et al. | 359/124 |
| 5,949,566 A | 9/1999 | Takano | 359/180 |
| 5,960,014 A | 9/1999 | Li et al. | 372/20 |
| 5,960,141 A * | 9/1999 | Sasaki et al. | 385/88 |
| 5,963,686 A | 10/1999 | Zheng et al. | 385/27 |
| 5,987,050 A * | 11/1999 | Doerr et al. | 372/108 |
| 6,005,995 A | 12/1999 | Chen et al. | 385/24 |
| 6,055,078 A | 4/2000 | Chen et al. | 359/130 |
| 6,061,158 A | 5/2000 | DeLong | 359/133 |
| 6,104,516 A | 8/2000 | Majima | 359/124 |
| 6,115,403 A | 9/2000 | Brenner et al. | 372/102 |
| 6,118,562 A | 9/2000 | Lee et al. | 359/124 |
| 6,120,190 A | 9/2000 | Leard et al. | 385/88 |
| 6,141,477 A | 10/2000 | Kitamura | 385/131 |
| 6,154,474 A | 11/2000 | Yoshida | 372/38 |
| 6,172,782 B1 | 1/2001 | Kobayashi | 359/128 |
| 6,188,499 B1 | 2/2001 | Majima | 359/193 |
| 6,233,262 B1 | 5/2001 | Mesh et al. | 372/32 |
| 6,236,771 B1 * | 5/2001 | Aoki et al. | 385/2 |
| 6,240,109 B1 | 5/2001 | Shieh | 372/18 |
| 6,261,857 B1 | 7/2001 | Alam et al. | 438/31 |
| 6,271,947 B1 | 8/2001 | Iannone et al. | |
| 6,275,317 B1 | 8/2001 | Doerr et al. | 359/180 |
| 6,278,813 B1 | 8/2001 | Komatsu | 257/458 |
| 6,282,361 B1 | 8/2001 | Nishimura et al. | 385/140 |
| 6,291,813 B1 | 9/2001 | Ackerman et al. | 250/214 |
| 6,301,031 B1 | 10/2001 | Li | 359/124 |
| 6,323,987 B1 | 11/2001 | Rinaudo et al. | 359/260 |
| 6,369,923 B1 | 4/2002 | Kuo et al. | 359/133 |
| 6,424,439 B1 | 7/2002 | King | 359/124 |
| 6,501,773 B1 | 12/2002 | Volz et al. | 372/29.02 |
| 6,542,268 B1 * | 4/2003 | Rotolo et al. | 398/7 |
| 6,661,974 B1 * | 12/2003 | Akiyama et al. | 398/95 |
| 6,700,517 B1 * | 3/2004 | Kellar | 398/101 |
| 2001/0005438 A1 | 6/2001 | Menezo | |
| 2001/0019562 A1 | 9/2001 | Kai et al. | 372/20 |
| 2001/0021207 A1 | 9/2001 | Serizawa | 372/32 |
| 2002/0075245 A1 | 6/2002 | Ash et al. | 359/245 |
| 2002/0126386 A1 | 9/2002 | Jordan et al. | 358/577 |
| 2002/0146191 A1 | 10/2002 | Bloemer et al. | 385/14 |
| 2003/0016413 A1 | 1/2003 | Carrick et al. | |

FOREIGN PATENT DOCUMENTS

| | | |
|---|---|---|
| WO | WO 00/52789 | 9/2000 |
| WO | WO-01/16642 | 3/2001 |
| WO | WO 01/17076 | 3/2001 |
| WO | WO 01/18919 | 3/2001 |
| WO | WO 01/24328 | 4/2001 |

OTHER PUBLICATIONS

S. Sakano, et al., "Tunable DFB Laser with a Striped Thin-Film Heater", *IEEE Photonics Technology Letters*, vol. 4, No. 4, pp. 321-323, Apr. 1992.

M. G. Young, "A 16×1 Wavelength Division Multiplexer with Integrated Distributed Bragg Reflector Lasers and Electroabsorption Modulators", *IEEE Photonics Technology Letters*, vol. 5, No. 8, pp. 908-910, Aug. 1993.

T. Coroy, et al., "Active Wavelength Measurement System Using an InGaAs-InP Quantum-Well Electroabsorption Filtering Detector", *IEEE Photonics Tecnology Letters*, vol. 8, No. 12, pp. 1686-1688, Dec. 1996.

H. Lee, et al., "Multichannel Wavelength Locking Using Transmission Peaks of an AWG for Multichannel Optical Transmission Systems", *IEEE Photonics Technology Letters*, vol. 10, No. 2, pp. 276-278, Feb. 1998.

K. J. Park, et al., "Simple Monitoring Technique for WDM Networks", *Electronic Letters*, vol. 35(5), pp. 415-417, Mar. 4, 1999.

C. H. Joyner, et al., "Low-Threshold Nine-Channel Waveguide Grating Router-Based Continuous Wave Transmitter", *Journal of Lightwave Technology*, vol. 17, No. 4, pp. 647-651, Apr. 1999.

S. Menezo, et al., "10-Wavelength 200-GHz Channel Spacing Emitter Integrating DBR Lasers with a PHASAR on InP for WDM Applications", *IEEE Photonics Technology Letters*, vol. 11, No. 7, pp. 785-787, Jul. 1999.

M. Bouda, "Compact High-Power Wavelength Selectable lasers for WDM Applications", *Conference on Optical Fiber Communication*, Technical Digest series, vol. 1, pp. 178-180, Mar. 7-10, 2000.

K. J. Park, et al., "A Multi-Wavelength Locker for WMD System", *Conference on Optical Fiber Communication* (OFC 2000), pp. WE 4-1 to WE 4-3, Wednesday, Mar. 8, 2000.

B. Pezeshki, et al., "12nm Tunable WDM Source Using an Integrated Laser Array", *Electronic Letters*, vol. 36, No. 9, pp. 788-789, Apr. 27, 2000.

D. Alfano, "System-on-Chip Technology Adds Options for Laser Driver Control", *WDM Solutions*, pp. 43-48, Nov. 2001.

Rajiv Ramaswami and Kumar N. Sivarajan, "Optical Networks", Second Edition, Morgan Kaufmann Publishers, pp. 24-26 and 217-218, 2002.

Beck Mason, et al., "40-Gb/s Tandem Electroabsorption Modulator", *IEEE Photonics Technology Letters*, vol. 14, No. 1, pp. 27-29, Jan. 2002.

Y. Yokoyama et al., "Multi-Wavelength Locker Integrated Wide-Band Wavelength Selectable Light Source Module", NEC Research & Development, Paper 13, pp. 158-161, Feb., 2002.

K. Inoue et al., "Signal Improvement Effect in O/E-E/O Conversion Using an Electro-Absorption (EA) Modulator", *IEEE Photonics Technology Letters*, vol. 9(1), pp. 109-111, Jan., 1997.

M. Zingibl, et al., "Polarization Independent 8×8 Waveguide Grating Multiplexer on InP", *Electronics Letters*, vol. 29(2), pp. 201-202, Jan. 21, 1993.

M.A. Newkirk, et al., "1.5 µm Multiquantum-Well Semiconductor Optical Amplifier with tensile and compressively Strained Wells for Polarization-independent gain", *IEEE*

*Photonics Technology Letters*, vol. 4(4), pp. 406-408, Apr. 1993.

P. Doussiere, et al., "1.55μm Polarization Independent Semiconductor Optical Amplifier with 25 dB Fiber to Fiber Gain", *IEEE Photonics Technology Letters*, vol. 6(2), pp. 170-172, Feb. 1994.

J.B.D. Soole, et al., "Polarization-Independent InP Arrayed Waveguide Filter Using Square Cross-Section Waveguides", *Electronic Letters*, vol. 32(4), pp. 323-324, Feb. 15, 1996.

H. Tanobe, et al., "Temperature Insensitive Arrayed Waveguide Gratings in InP Substrates", *IEEE Photonics Technology Letters*, vol. 10(2), pp. 235-237, Feb. 1998.

D. Wolfson, et al., "Detailed Theoretical Investigation of the Input Power Dynamic Range for Gain-Clamped Semiconductor Optical Amplifier Gates at 10 Gb/s", *IEEE Photonic Technology Letters*, vol., 10(9), pp. 1241-1243, Sep. 1998.

J. Sarathy, et al., "Polarization Insensitive Waveguide Grating Routers in InP", *IEEE Photonics Technology Letters*, vol. 10(12), pp. 1763-1765, Dec. 1998.

J.B.D. Soole, et al., "Monolithic InP/InGaAsP/InP Grating Spectrometer for the 1.48-1.56 MM Wavelength Range", *Applied Physics Letters*, vol. 58(18), pp. 1949-1951, May 6, 1991.

K. Inoue, "Technique to Compensate Waveform Distortion in a Gain-Saturated Semiconductor Optical Amplifier Using a Semiconductor Saturable Absorber", *Electronics Letters*, vol. 34(4), pp. 376-378, Feb., 1998.

Thomas L. Koch et al., "Semiconductor Lasers for Coherent Optical Fiber Communications", *Journal of Lightwave Technology*, vol. 8(3), pp. 274-293 Mar., 1990.

D. A. Ackerman, et al., "A Practical DBR Laser Based Wavelength Selectable DWDM Source", *IEEE LEOS Newsletter*, pp. 7-9, Oct. 2001.

Chung-en Zah et al., "Multiwavelength DFB Laser Arrays With Integrated Combiner and Optical Amplifier for WDM Optical Networks", *IEEE Journal of Selected Topics on Quantum Electronics*, vol. 3(2), pp. 584-597, Apr., 1997.

Raybon et al., "Reconfigurable Optoelectronic Wavelength Translation based on an Integrated Electroabsorption Modulated Laser Array", *IEEE Photonics Technology Letters*, vol. 10(2), pp. 215-217, Feb., 1998.

Masaki Kohtoku, et al., "Polarization Independent Semiconductor Arrayed Waveguide Gratings Using a Deep-Ridge Waveguide Structure", *IEICE Trans. Electron.*, vol. E81-C, No. 8, pp. 1195-1204, Aug. 1998.

Kudo et al., "1.55-μm Wavelength-Selectable Microarray DFB-LD's with Monolithically Integrated MMI Combiner, SOA, and EA-Modulator", *IEEE Photonics Technology Letters*, vol. 12(3), pp. 242-244, Mar. 2000.

K. Affolter, "Integrating Active Components Improves System Design", *WDM Solutions*, pp. 65-67, Jun. 2001.

D. Johnson et al., "Spot-Size Converted Devices for Uncooled Passive Alignment", *IEEE LEOS Newsletter*, pp. 3-7, Aug. 2001.

Y. Suzaki et al., "Multi-Channel Modulation in a DWDM Monolithic Photonic Integrated Circuit", *14th Indium Phosphide and Related Materials Conference, Conference Proceedings*, May 12-16, Stockholm, Sweden, Conference Proceedings, pp. 681-683.

JDS Uniphase Product Bulletin, "Fabry-Perot Wavelocker™", pp. 1-4.

John E. Johnson et al., "Fully Stabilized Electroabsorption-Modulated Tunable DBR Laser Transmitter for Long-Haul Optical Communications", *IEEE Journal on Selected Topics in Quantum Electronics*, vol. 7(2), pp. 168-177, Mar./Apr. 2001.

C. H. Joyner et al., "An 8-Channel Digitally Tunable Transmitter with Electroabsorption Modulated Output by selective-Area Epitaxy", *IEEE Photonics Technology Letters*, vol. 7(9), pp. 1013-1015, Sep., 1995.

Wen-Jeng Ho et al., "InGaAs PIN Photodiodes on Semi-insulating InP Substrates with Bandwidth Exceeding 14 GHz", Solid State Electronics vol. 38(7), pp. 1295-1298, Jul. 1995.

Möller et al. "Mode Stabilization Technique for the Multifrequency Laser", *25th Optical Fiber Communication Conference, Technical Digest*, pp. 187-189, Mar. 7, 2000.

Sakano et al., "Tunable DFB Laser with a Stiped Thin-Film Heater", *IEEE Photonic Technology Letters*, vol. 4(4), Apr. 1992.

K. Nakamura, et al., "Buried Heterostructure DFB Laser Integrated With Ridge Waveguide Electroabsorption Modulator With Over 20 GHz Bandwidth", European Conference on Optical Communications (ECOC '97), vol. 448, pp. 175-178, 1997.

Rahban, "PWM Temp Controller for Thermo-Electric Modules", *LIGHTWAVE*, pp. 81-84, Aug., 2002.

M. Kohtoku et al., "InP-Based 64-Channel Arrayed Waveguide Grating with 50 GHz Channel spacing and up to −20dB Crosstalk"1786-1787, *Electronic Letters*, vol. 33(21), pp. , Oct. 9, 1997.

M. Smit et al., Photonic Integrated Circuits for Advanced Communication Networks, *International Journal of Optoelectronics*, vol. 12(1), pp. 25-30, 1998.

Sasaki et al., "Selective MOVPE Growth and Its Application to Semiconductor Photonic Integrated Circuits", Electronics & Communications in JP, vol. 76(4), pp. 1-11, Apr. 1, 1993.

Young et al., "A 16×1 WDM Transmitter . . . Modulators", Integrated Photonics Research, Washington, D.C., vol. 10, pp. 414-417, Mar. 22-24, 1993.

* cited by examiner

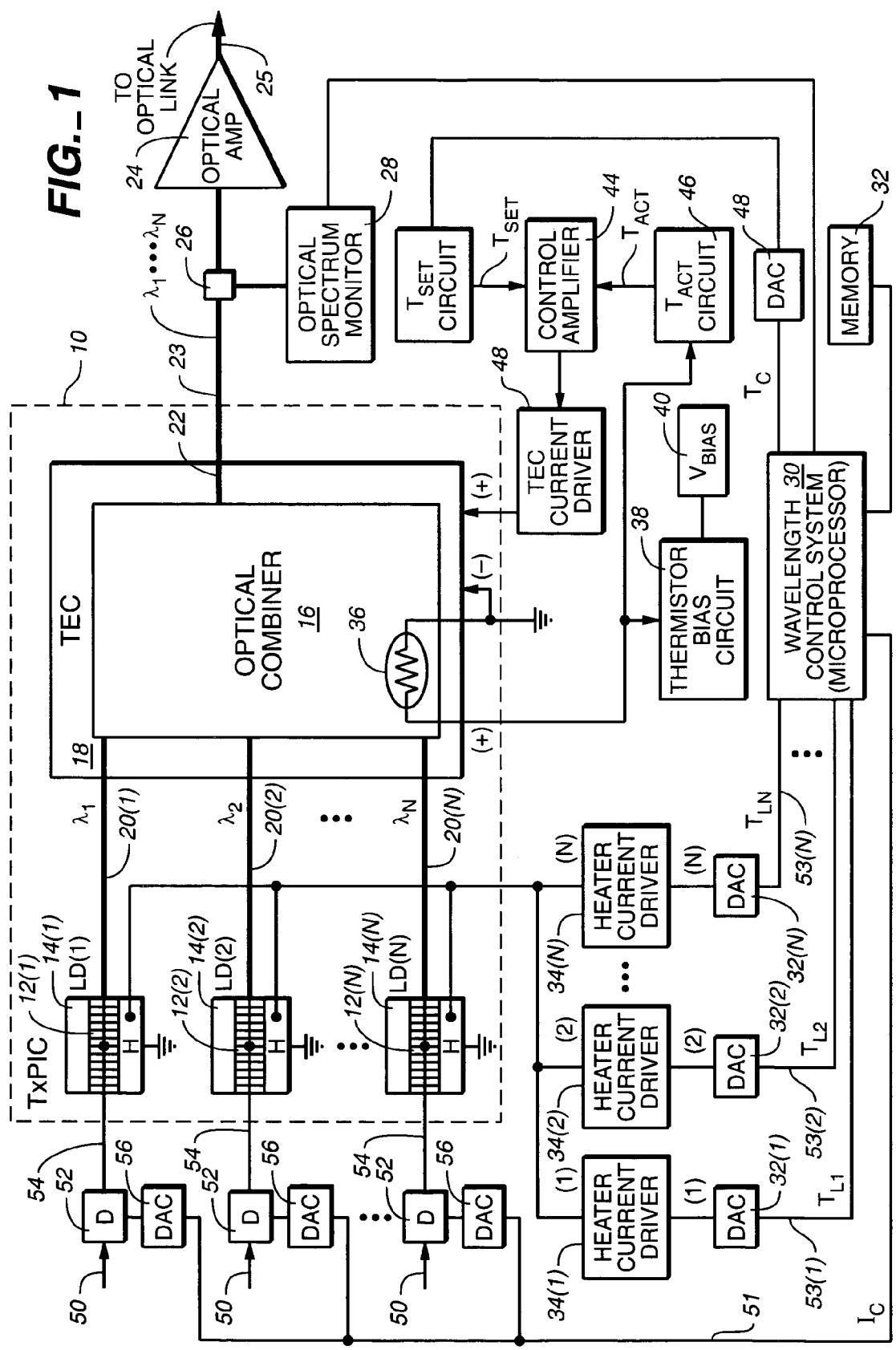

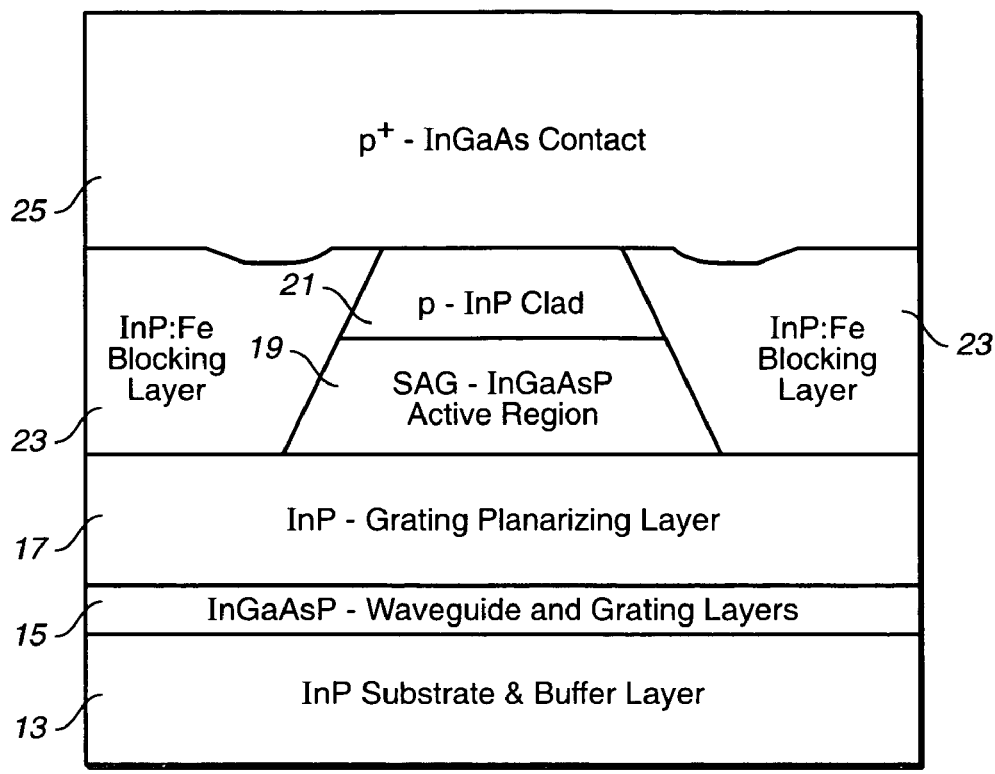
FIG._1A
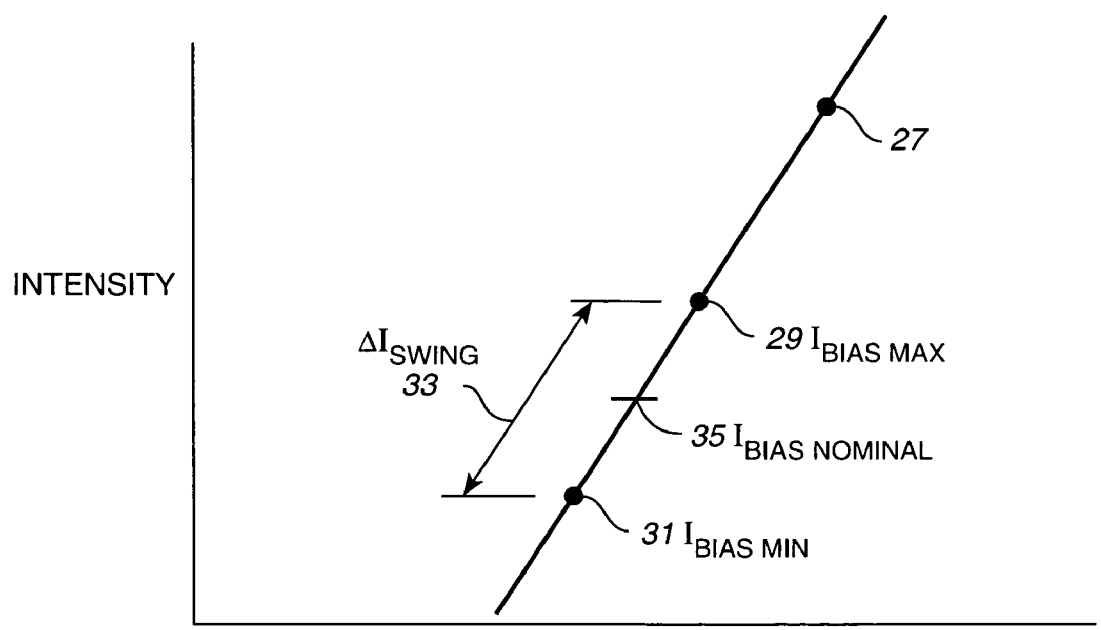
FIG._1B

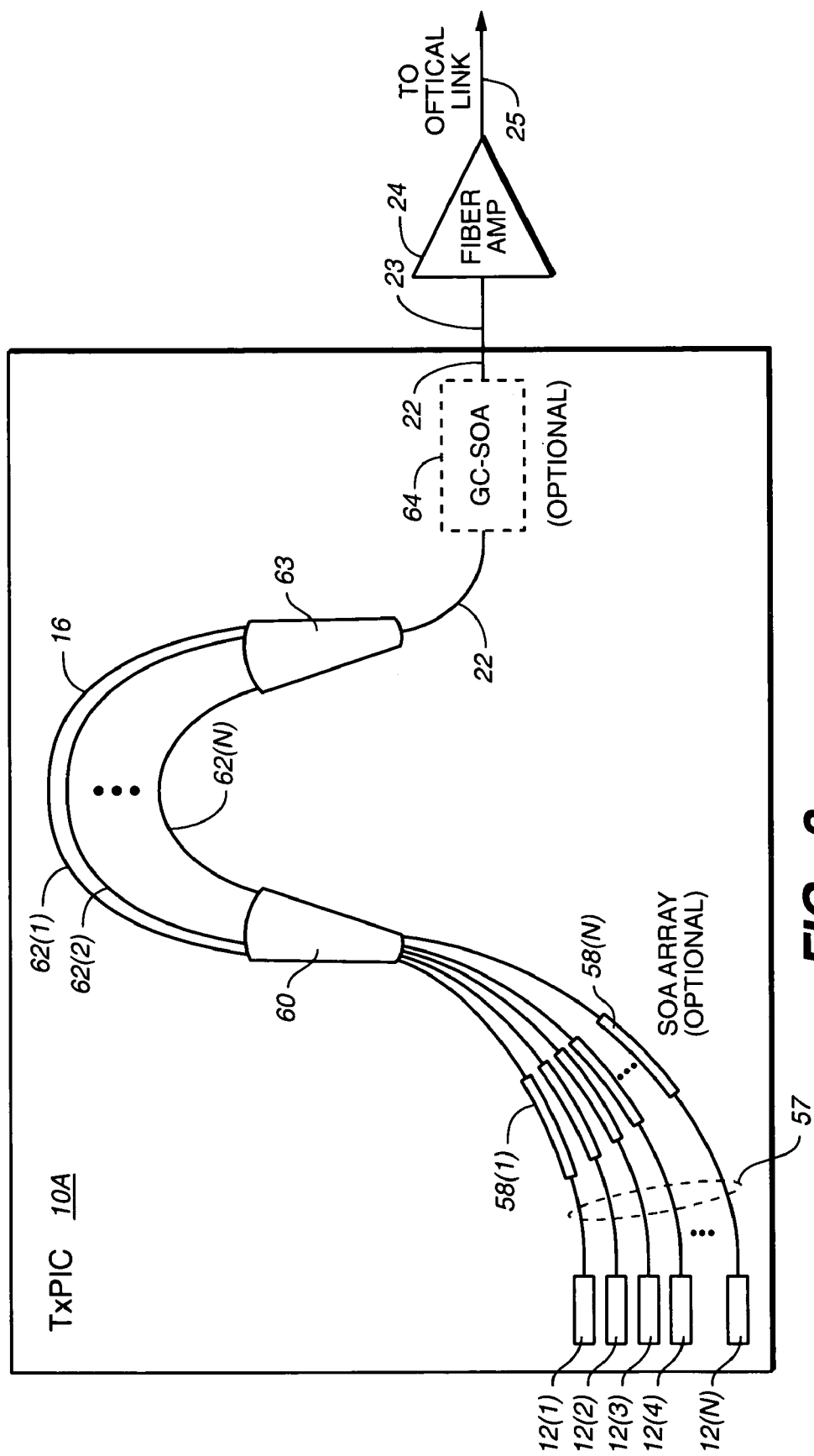
FIG._2

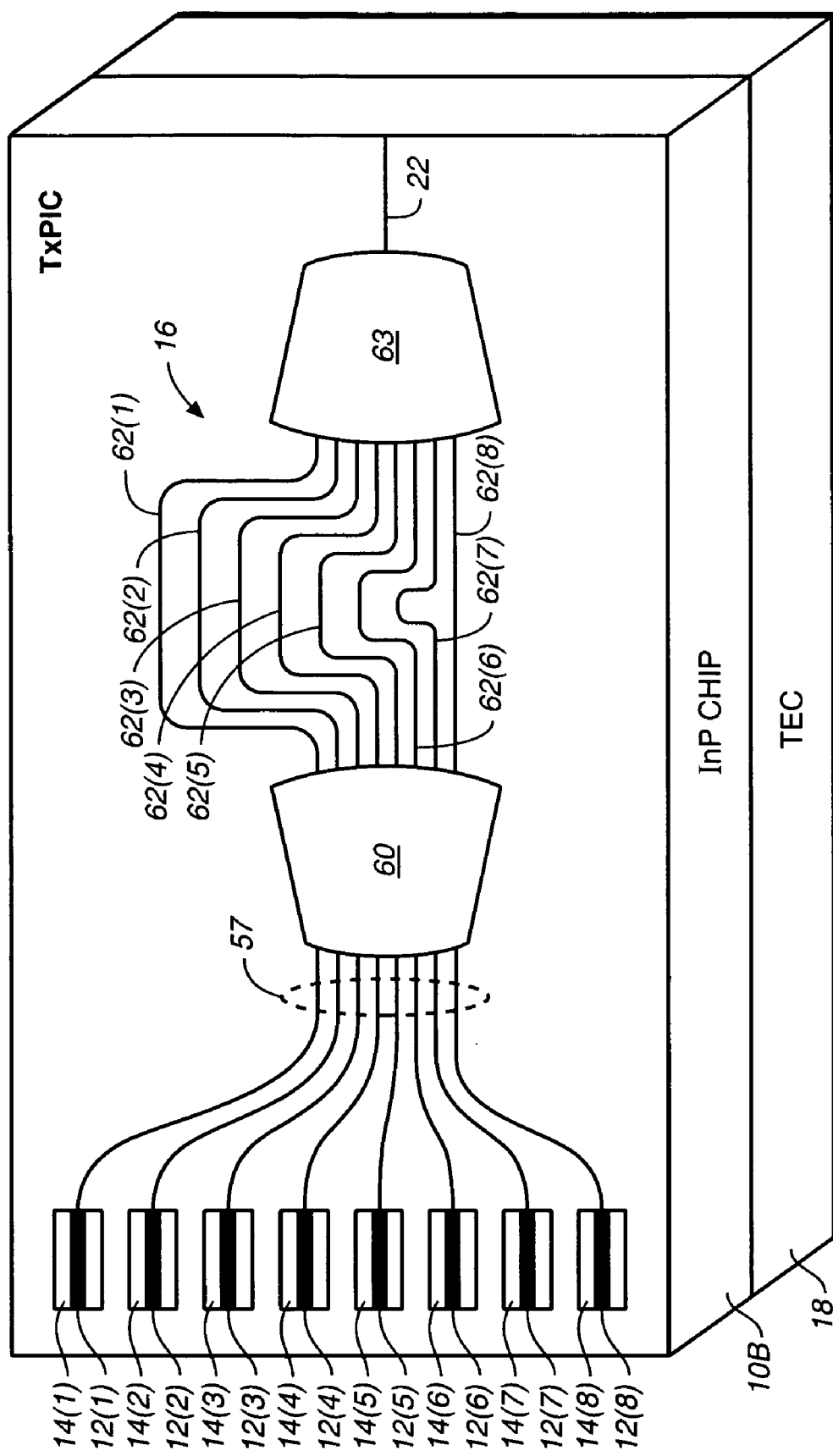
FIG._3

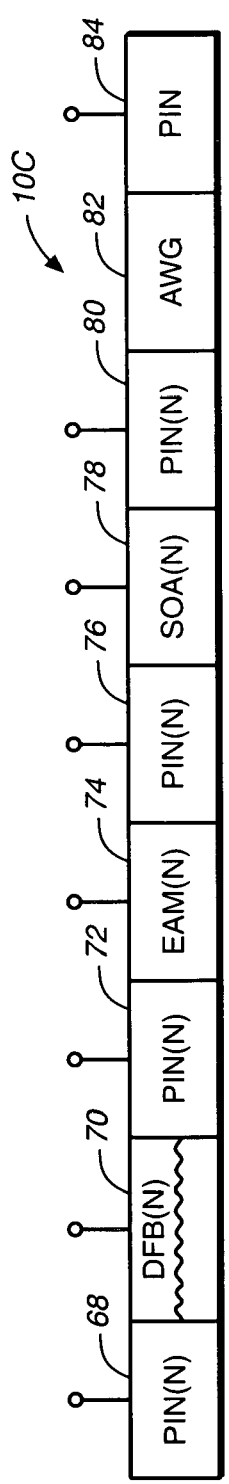
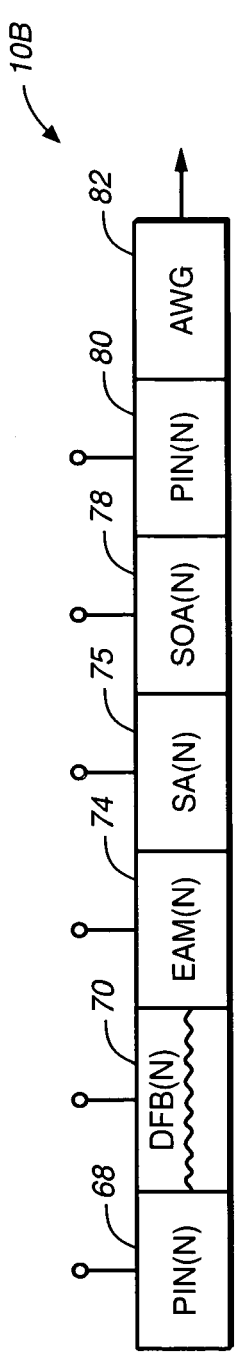
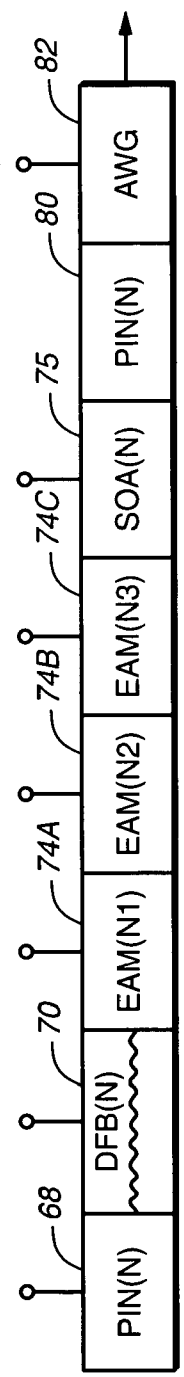
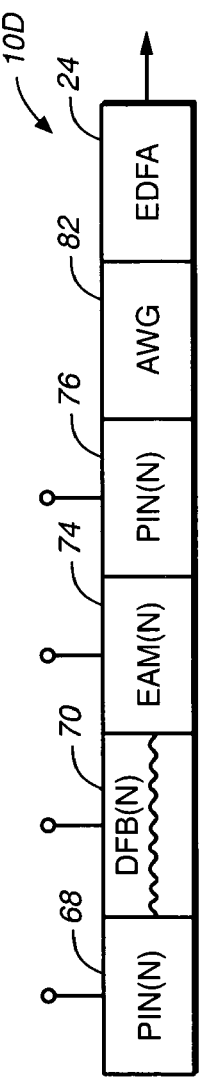
FIG._4A  FIG._4B  FIG._4C  FIG._4D

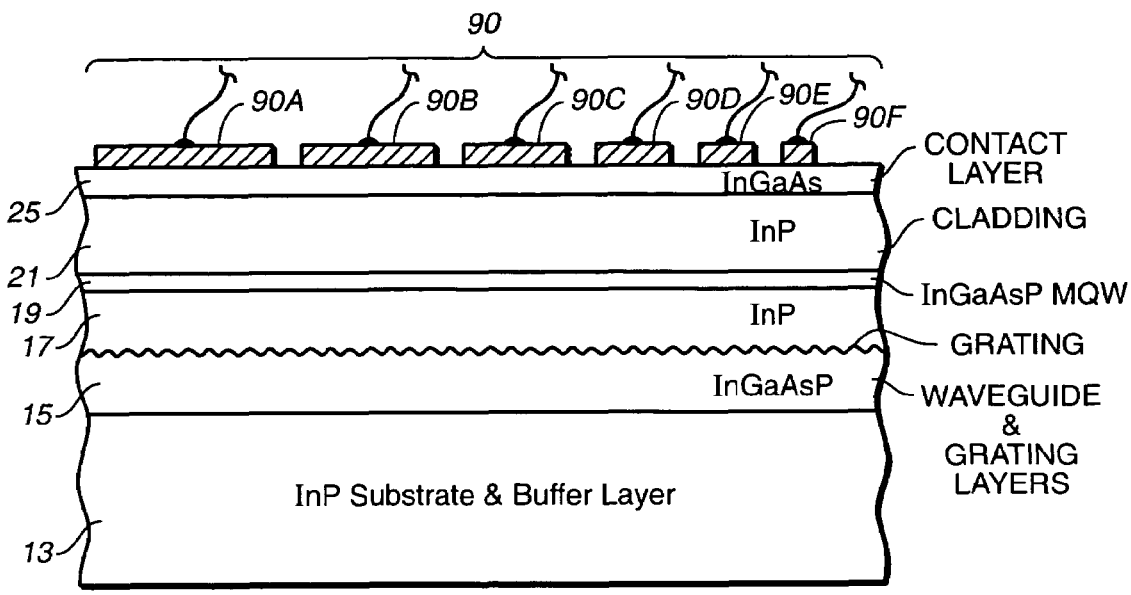
FIG._5A
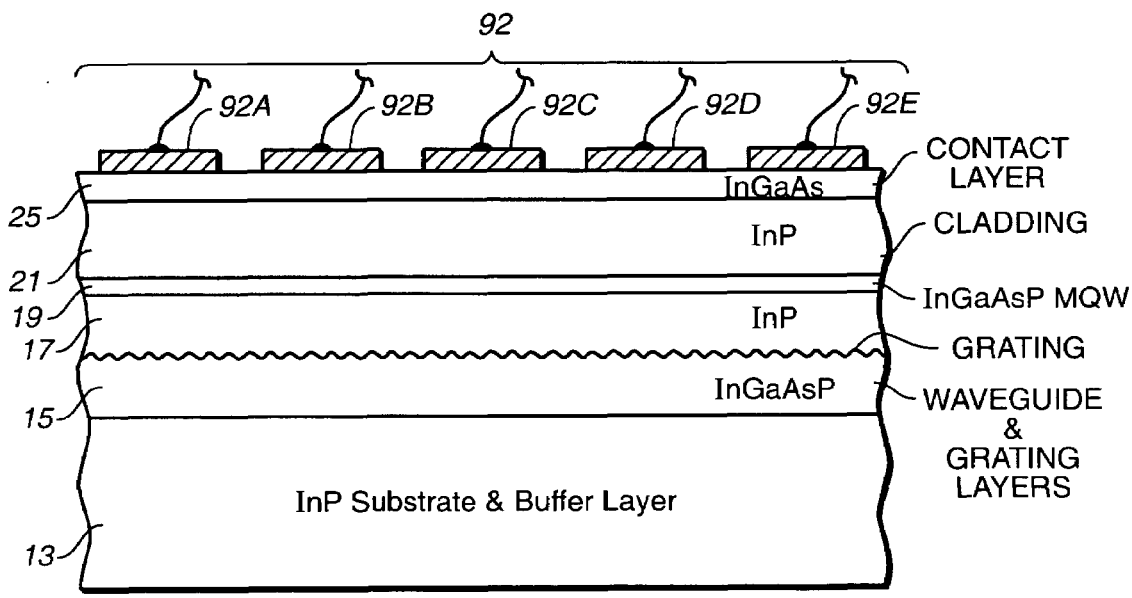
FIG._5B
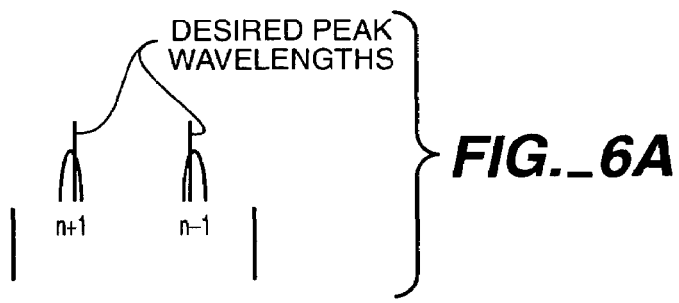
FIG._6A

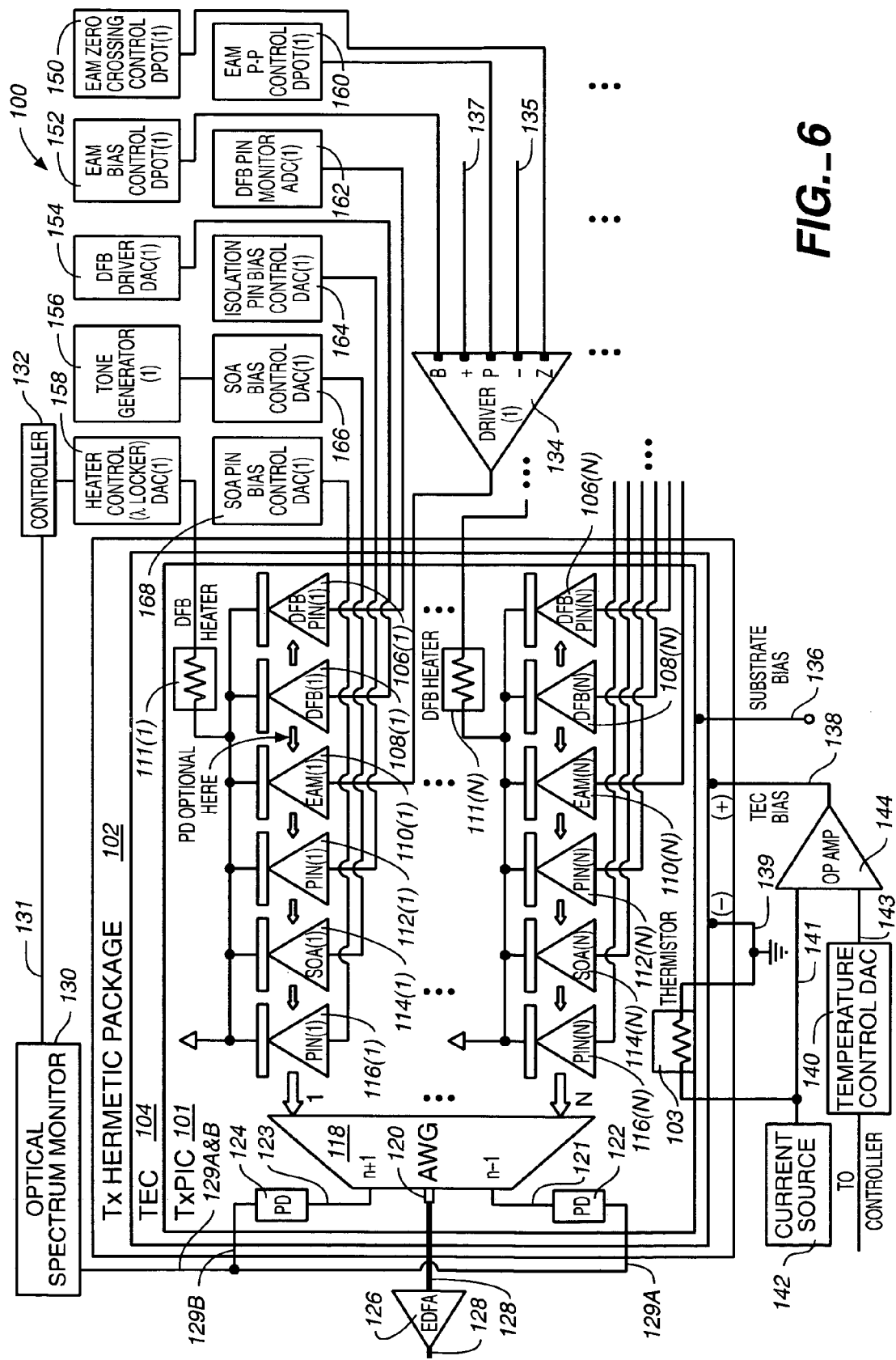
FIG._6

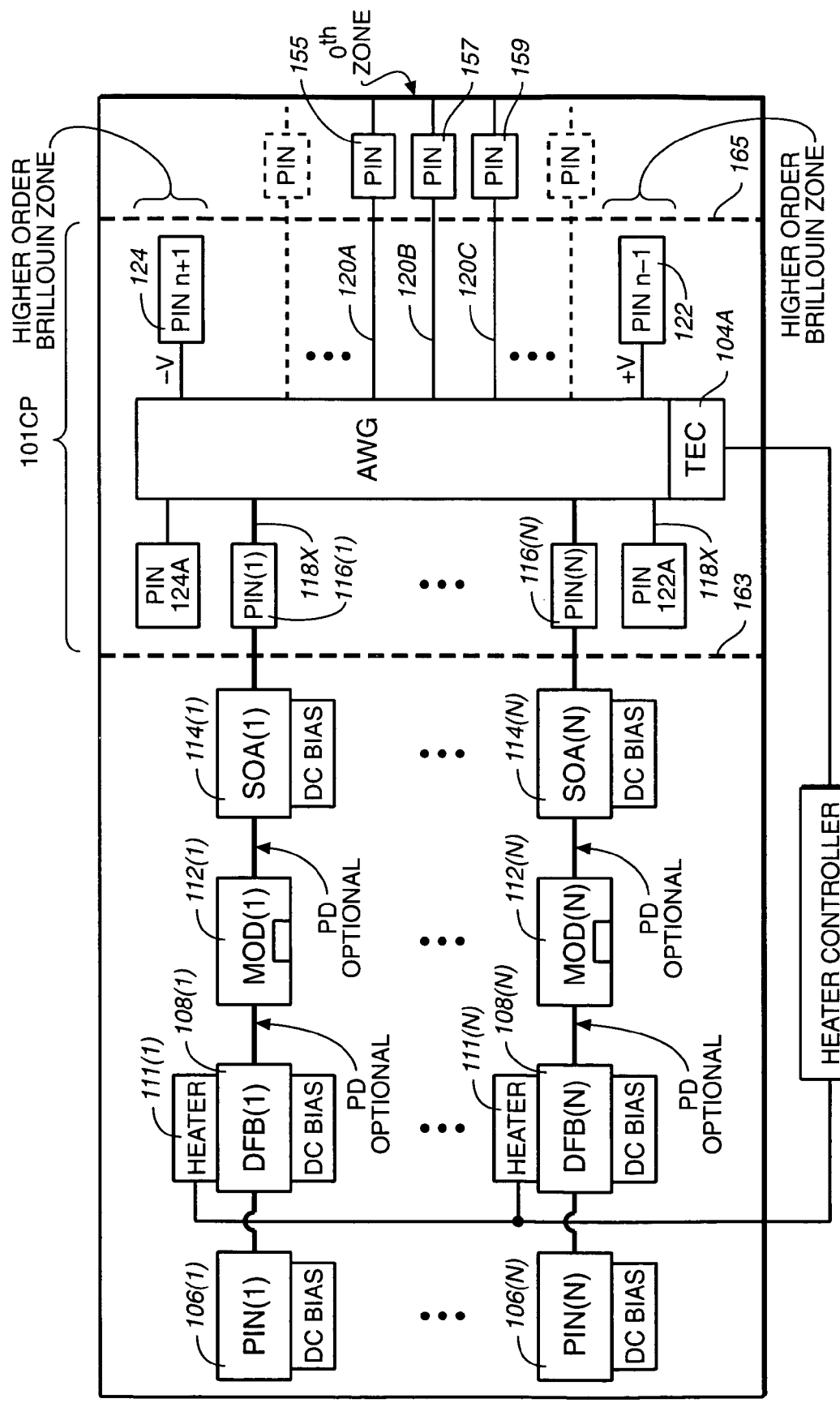
FIG._7

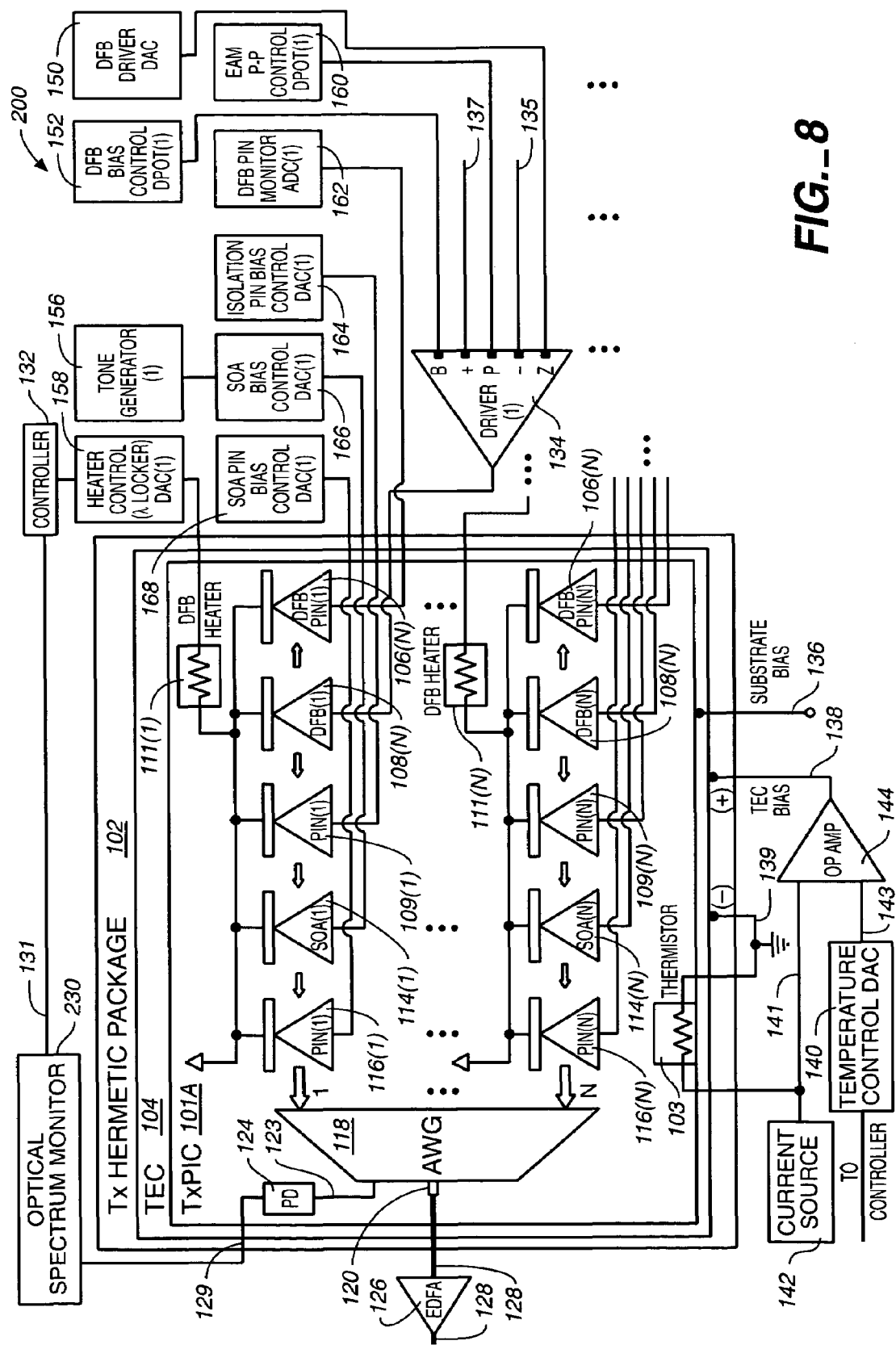
FIG._8

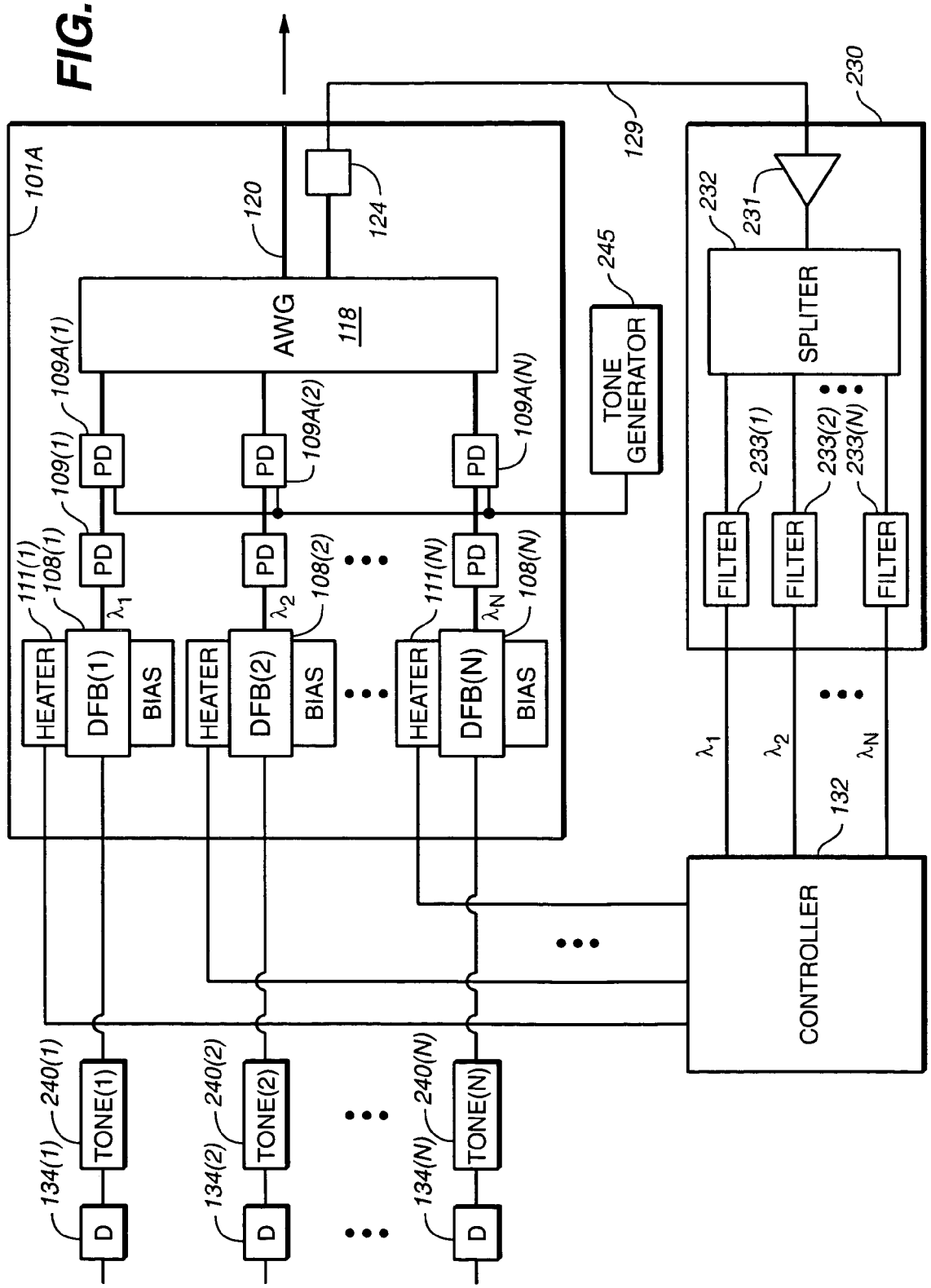
FIG._9

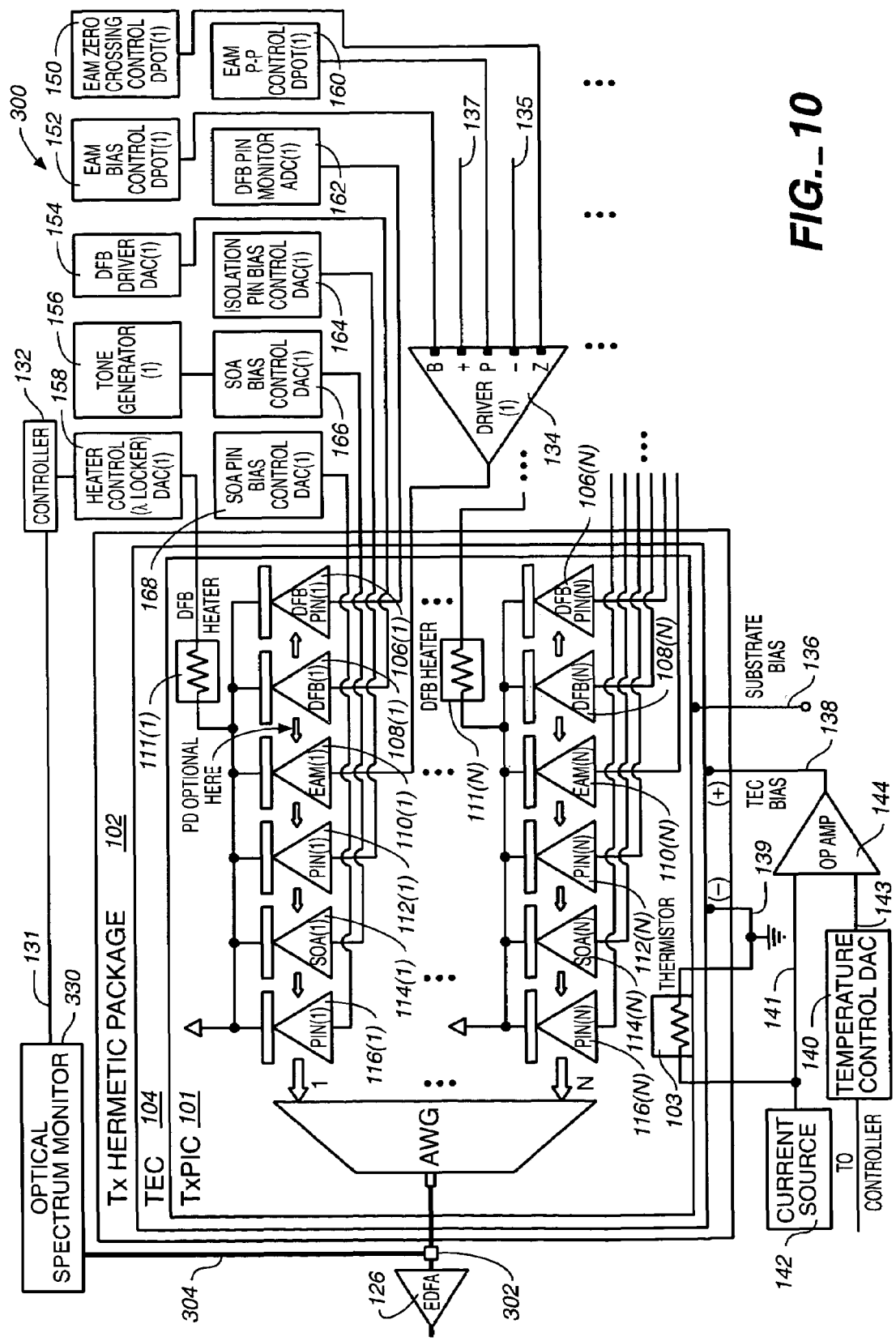
FIG._10

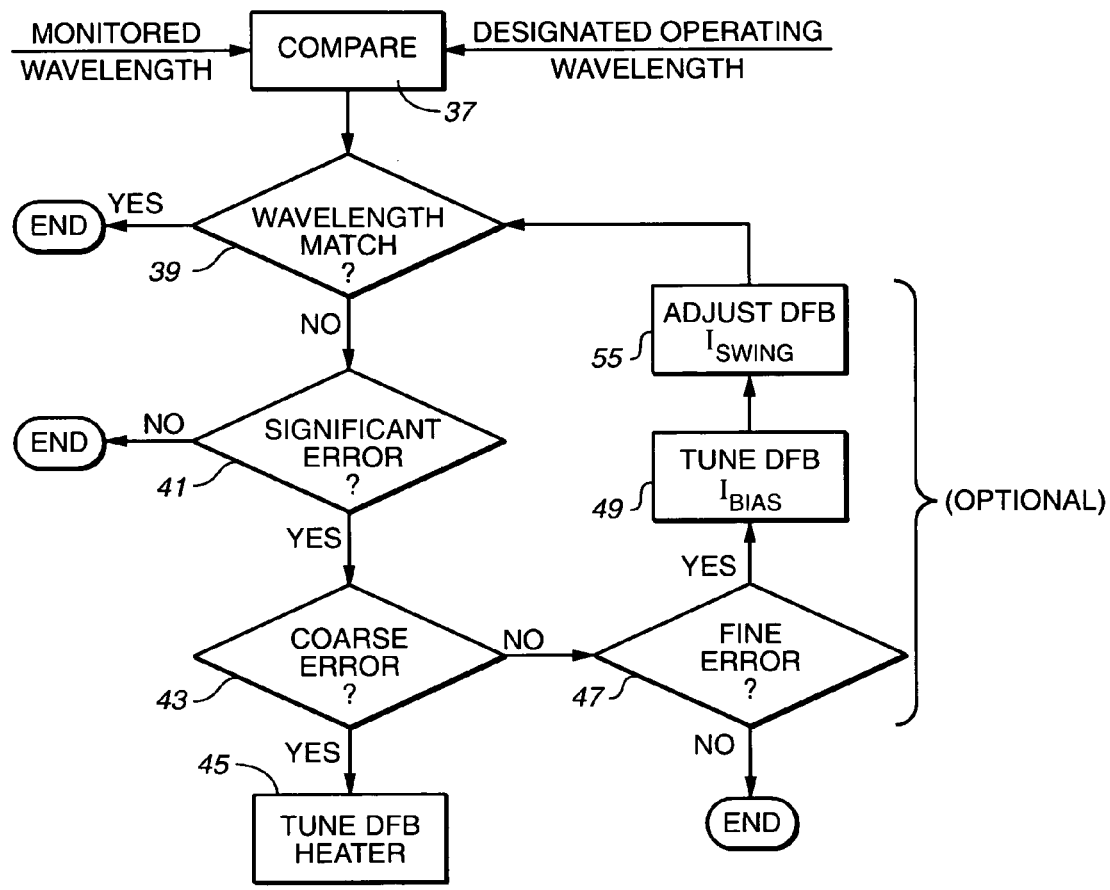
FIG._11

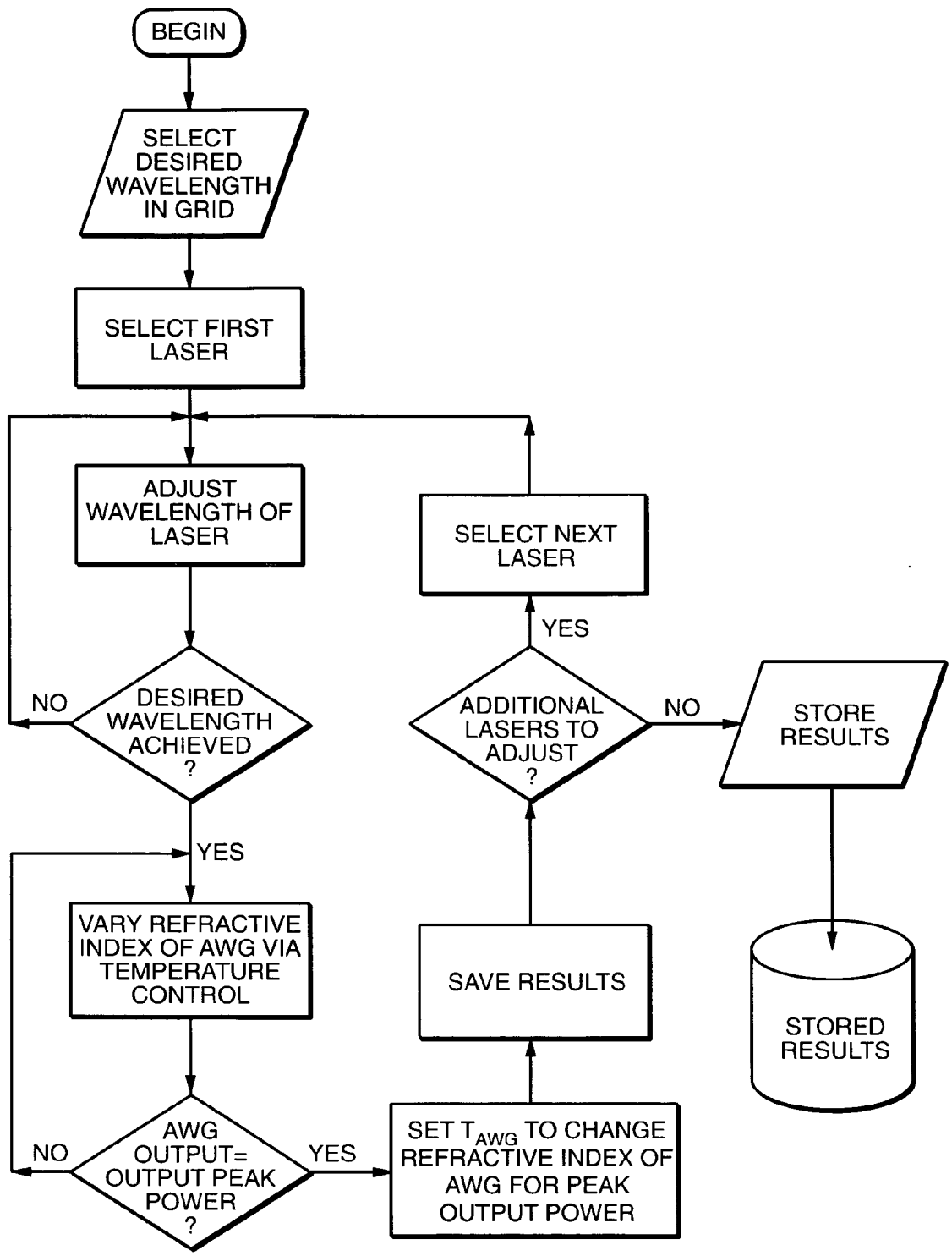
*FIG._12A*

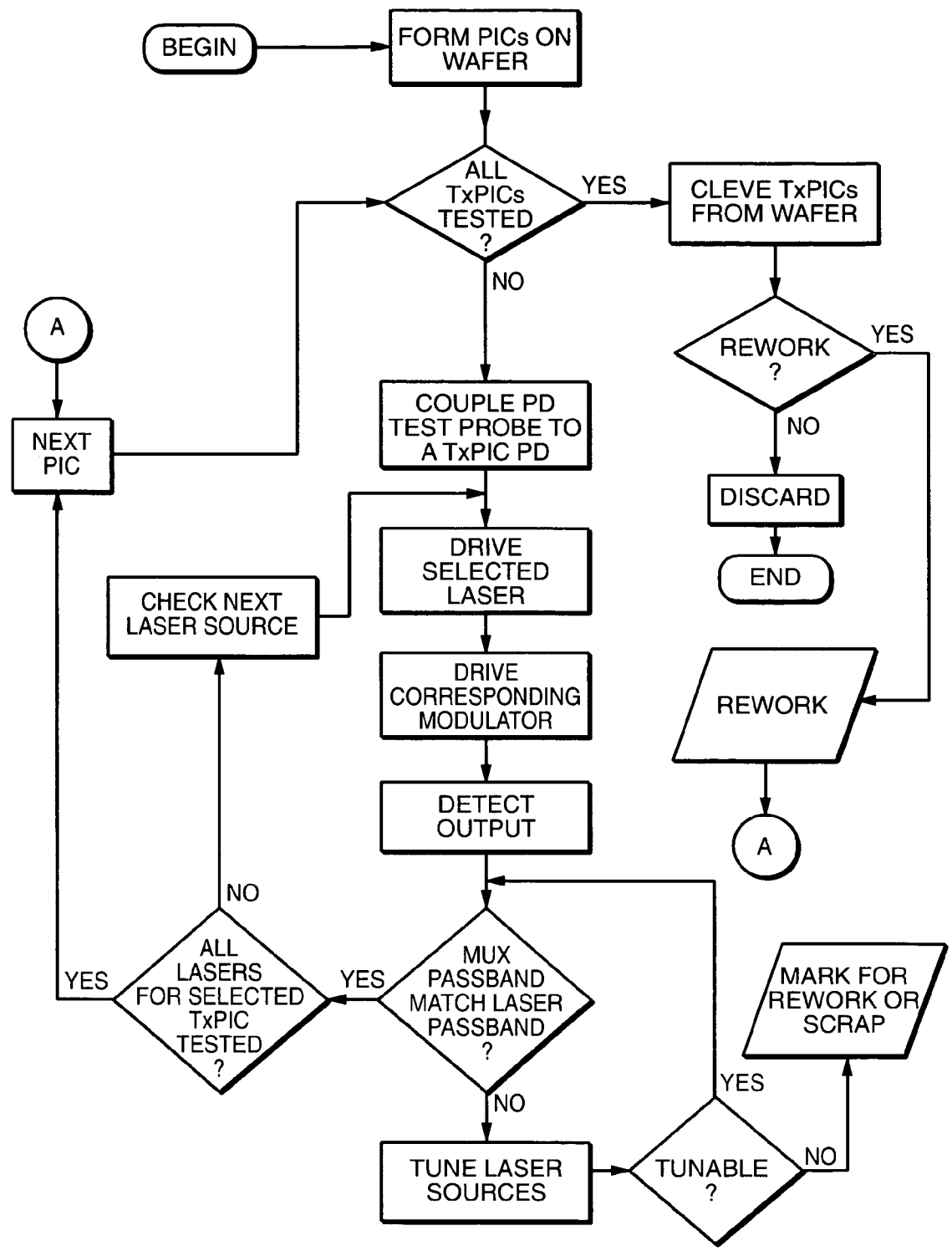
FIG._12B

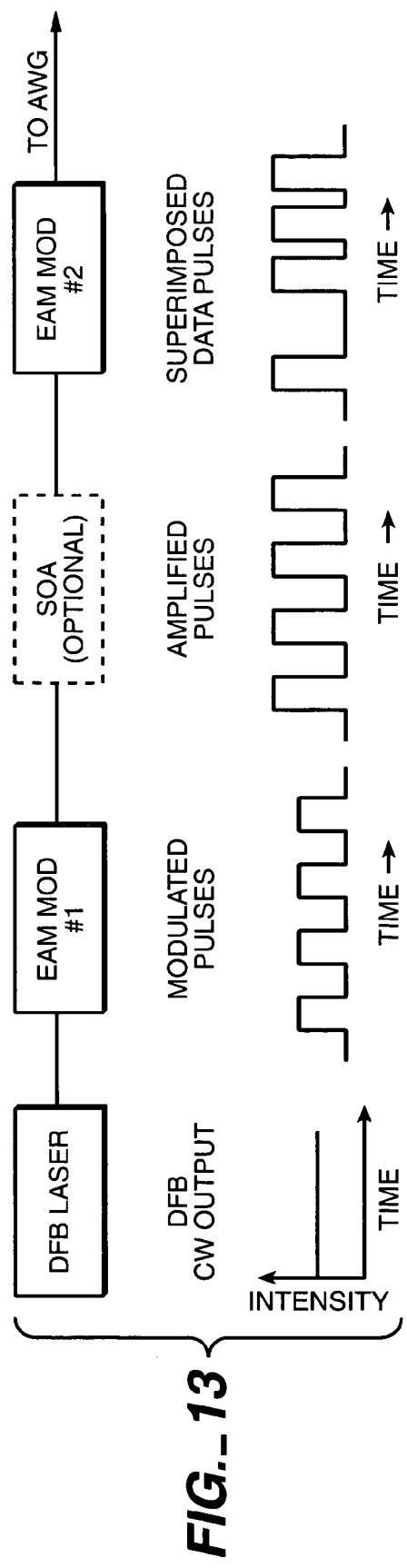
FIG._13
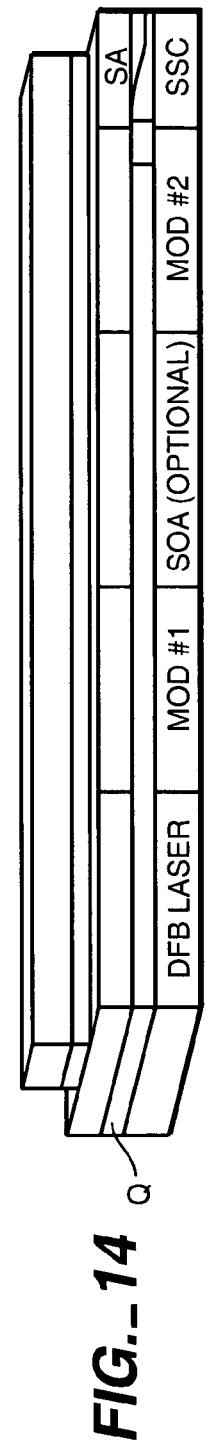
FIG._14

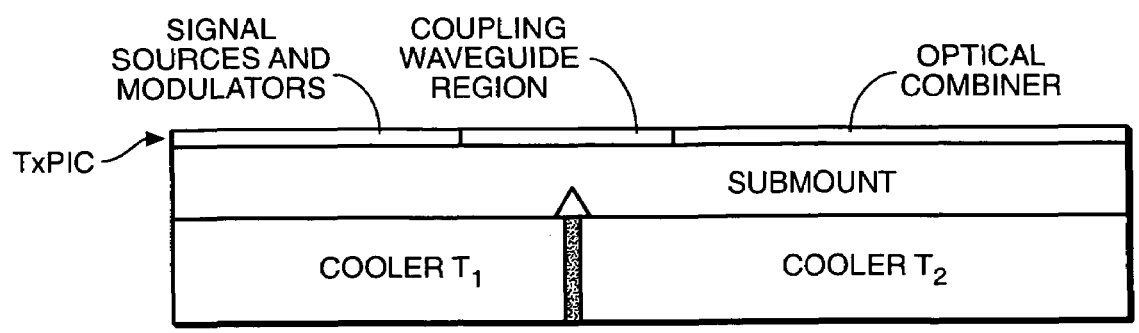
FIG._15
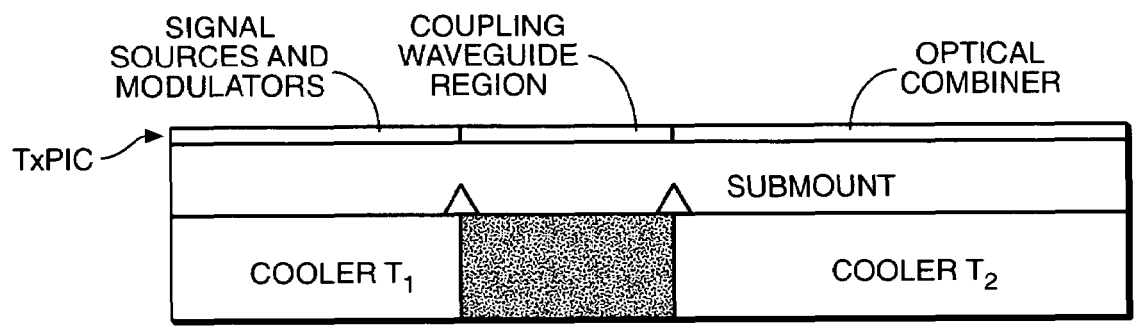
FIG._16

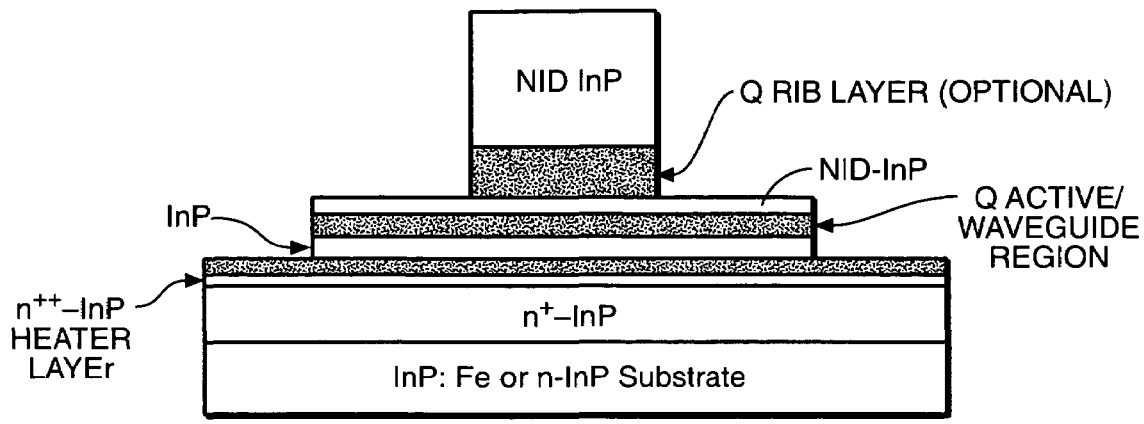
FIG._17
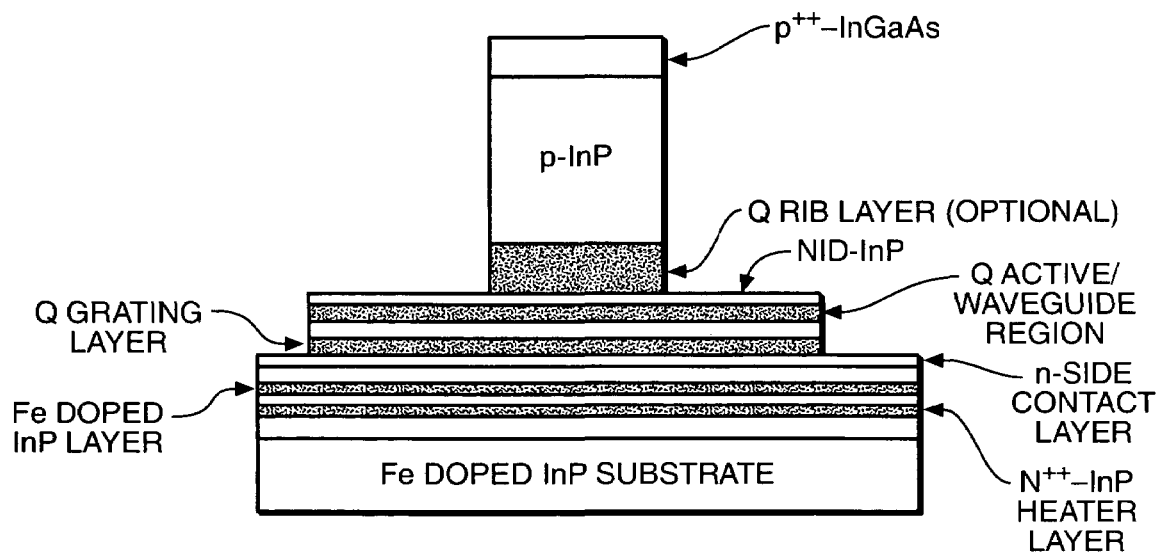
FIG._18

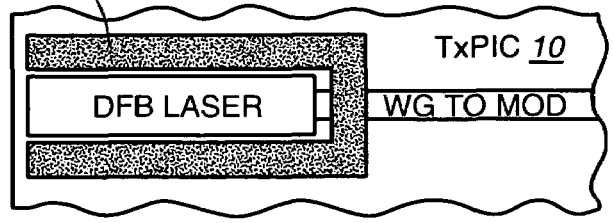
FIG._19
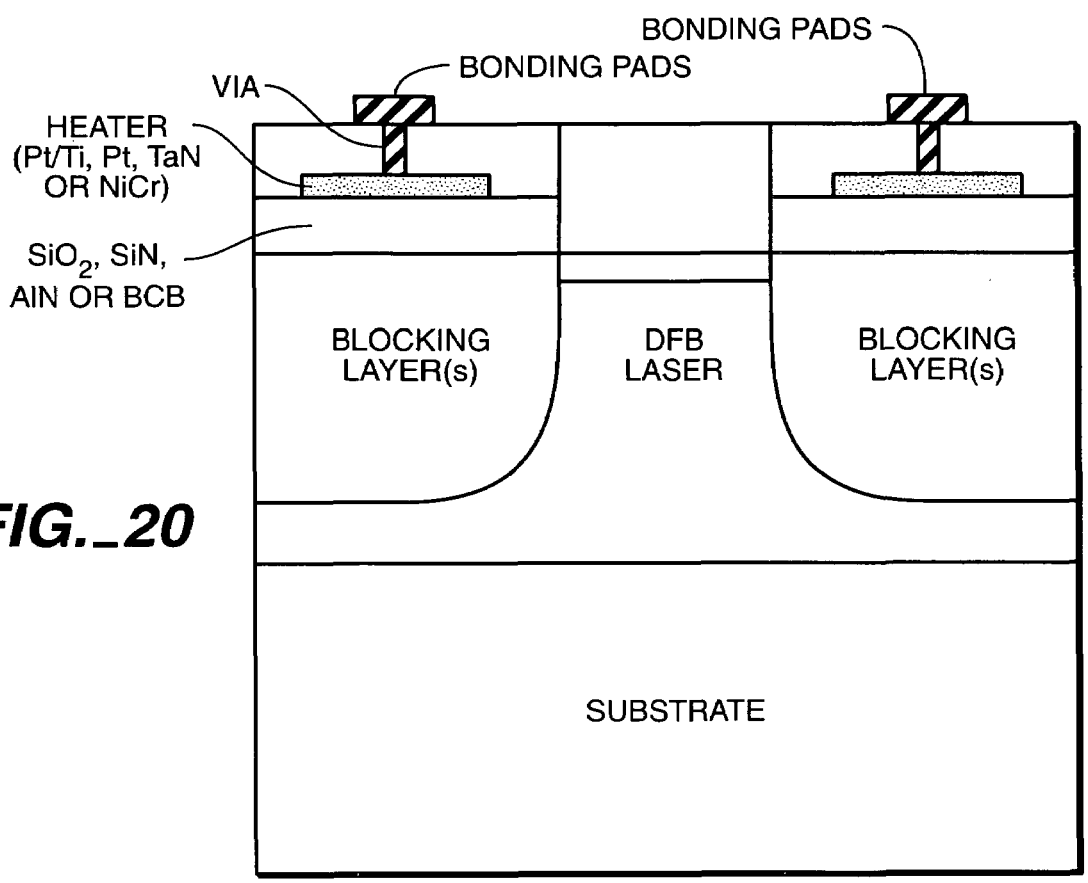
FIG._20
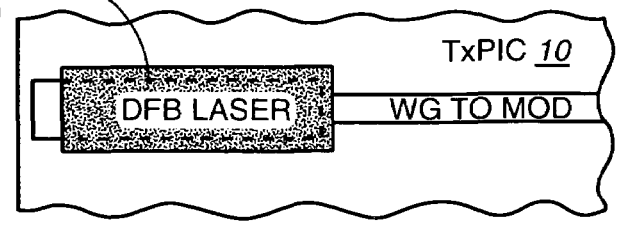
FIG._21

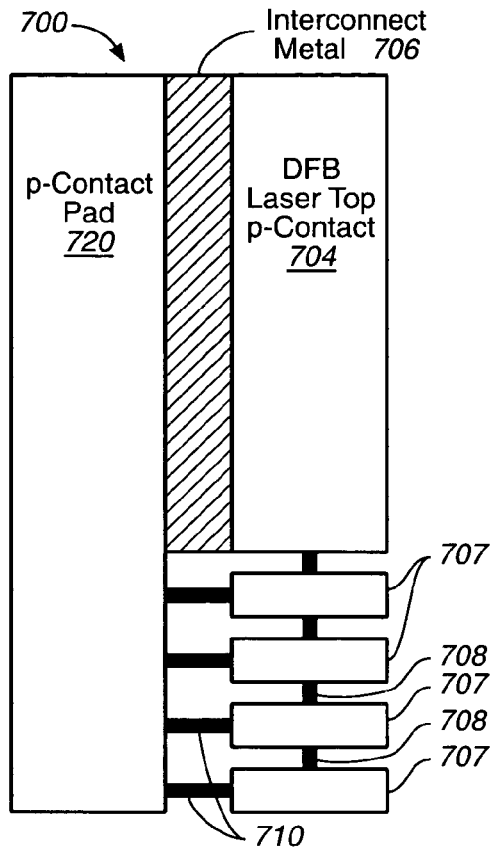
FIG._22
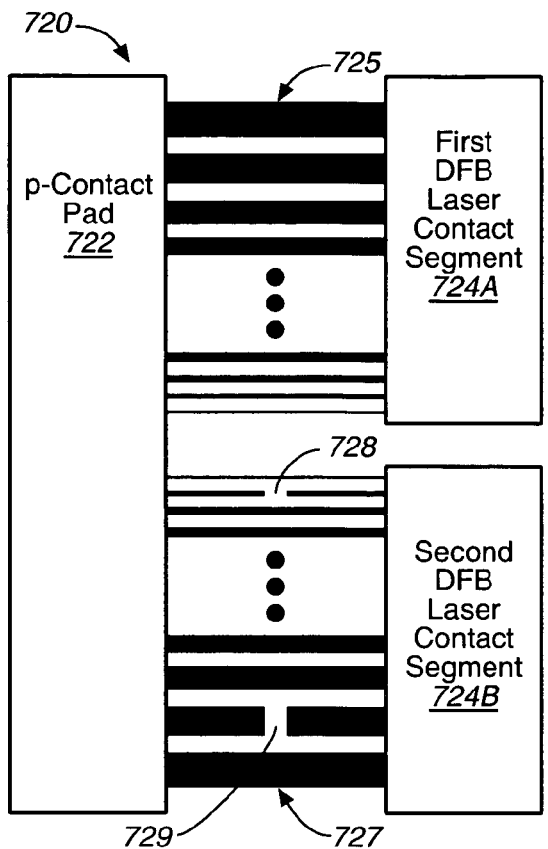
FIG._23
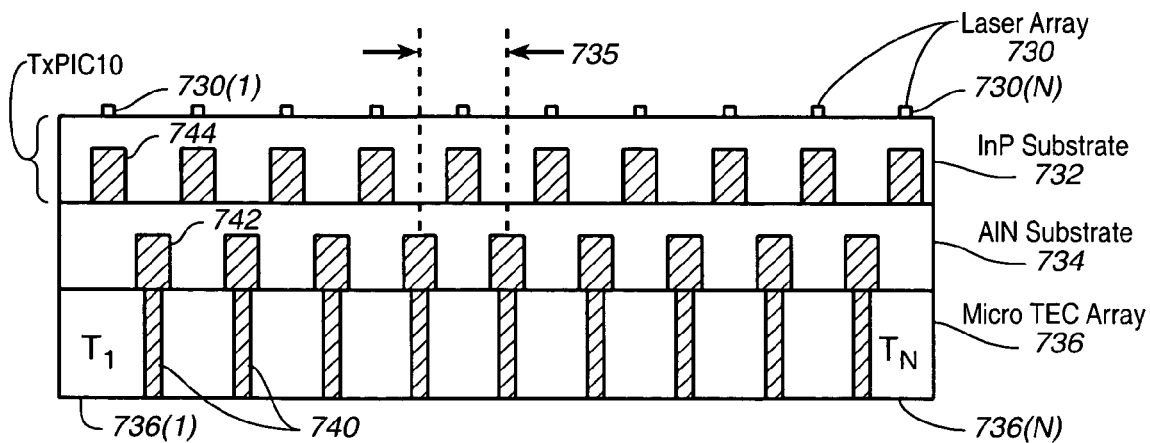
FIG._24

METHOD OF OPERATING AN ARRAY OF LASER SOURCES INTEGRATED IN A MONOLITHIC CHIP OR IN A PHOTONIC INTEGRATED CIRCUIT (PIC)

REFERENCE TO RELATED APPLICATION

This application is a division of U.S. parent patent application, Ser. No. 10/267,330, filed Oct. 8, 2002, which application claims priority to provisional application Serial No. 60/370,345, filed Oct. 9, 2001, and entitled, TRANSMITTER PHOTONIC INTEGRATED CIRCUIT (TxPIC) CHIP ARCHITECTURES AND DRIVE SYSTEMS AND WAVELENGTH STABILIZATION FOR TxPICs, and published on May 22, 2003 as Pub. No. US 2003/0095736 A1; and also claims priority to provisional applications, Serial Nos. 60/328,207, filed Oct. 9, 2001 and 60/328,332, filed Oct. 9, 2001, both now part of U.S. patent application, Ser. No. 10/267,331, filed Oct. 8, 2002 and entitled TRANSMITTER PHOTONIC INTEGRATED CIRCUITS (TxPIC) AND OPTICAL TRANSPORT NETWORKS EMPLOYING TxPICs, also published on May 22, 2003 as Pub. No. US 2003/0095737 A1; and further claims priority to provisional application Serial No. 60/378,010, filed May 10, 2002, now U.S. patent application Ser. No. 10/267,346, filed Oct. 8, 2002 and entitled, TRANSMITTER PHOTONIC INTEGRATED CIRCUIT (TxPIC) CHIP WITH ENHANCED POWER AND YIELD WITHOUT ON-CHIP AMPLIFICATION, published on May 1, 2003 as Pub. No. US 2003/0081878 A1; and further claims priority to provisional application, Serial No. 60/367,595, filed Mar. 25, 2002, now U.S. patent application Ser. No. 10/267,304, filed Oct. 8, 2002 and entitled, AN OPTICAL SIGNAL RECEIVER PHOTONIC INTEGRATED CIRCUIT (Rx-PIC), AN ASSOCIATED OPTICAL SIGNAL TRANSMITTER PHOTONIC INTEGRATED CIRCUIT (TxPIC) AND AN OPTICAL TRANSPORT NETWORK UTILIZING THESE CIRCUITS, published on Feb. 19, 2004 as Pub. No. US 2004/0033004 A1, all of which applications are incorporated herein by their reference in their entirety.

BACKGROUND OF THE INVENTION

1. Field of the Invention

This invention relates generally to wavelength tuning of laser sources integrated on a chip or in a photonic integrated circuit (PIC) and more particularly to a method of providing integrated, on-chip tuning of integrated laser source wavelengths with appropriate integrated, on-chip adjustment of their power levels.

Reference to wavelength stabilization is in regard to stabilizing the lasing wavelengths of a plurality of laser sources, such as DFB or DBR lasers, on a monolithic TxPICs having different operational wavelengths approximating a standardized wavelength grid, such as the ITU grid. Further, this application relates to optimization of the laser source wavelength grid with the optical multiplexer or combiner wavelength grid where the array of laser sources and multiplexer are integrated on the same PIC. Also, further, this application relates to creating the required output power comb versus the wavelengths of the modulated sources. As used herein, modulated sources may be comprised of directly modulated (DM) lasers or externally modulated lasers, such as SMLs, e.g., EMLs.

2. Description of the Related Art

If used throughout this description and the drawings, the following short terms have the following meanings unless otherwise stated:

1R—Re-amplification of the information signal.
2R—Optical signal regeneration that includes signal reshaping as well as signal regeneration or re-amplification.
3R—Optical signal regeneration that includes signal retiming as well as signal reshaping as well as regeneration or re-amplification.
4R—Any electronic reconditioning to correct for transmission impairments other than 3R processing, such as, but not limited to, FEC encoding, decoding and re-encoding.
A/D—Add/Drop.
APD—Avalanche Photodiode.
AWG—Arrayed Waveguide Grating.
BER—Bit Error Rate.
CD—Chromatic Dispersion.
CDWM—Cascaded Dielectric wavelength Multiplexer (Demultiplexer).
CoC—Chip on Carrier.
DBR—Distributed Bragg Reflector laser.
EDFAs—Erbium Doped Fiber Amplifiers.
DAWN—Digitally Amplified Wavelength Network.
DCF—Dispersion Compensating Fiber.
DEMUX—Demultiplexer.
DFB—Distributed Feedback laser.
DLM—Digital Line Modulator.
DM—Direct Modulation.
DON—Digital Optical Network as defined and used in this application.
EA—Electro-Absorption.
EAM—Electro-Absorption Modulator.
EDFA—Erbium Doped Fiber Amplifier.
EML—Electro-absorption Modulator/Laser.
EO—Electrical to Optical signal conversion (from the electrical domain into the optical domain).
FEC—Forward Error Correction.
GVD—Group Velocity Dispersion comprising CD and/or PMD.
ITU—International Telecommunication Union.
MMI—Multimode Interference combiner.
Modulated Sources—EMLs or SMLs, combinations of lasers and external modulators or DM lasers.
MPD—Monitoring Photodiode.
MZM—Mach-Zehnder Modulator.
MUX—Multiplexer.
NE—Network Element.
NF—Noise Figure: The ratio of input OSNR to output OSNR.
OADM—Optical Add Drop Multiplexer.
OE—Optical to Electrical signal conversion (from the optical domain into the electrical domain).
OEO—Optical to Electrical to Optical signal conversion (from the optical domain into the electrical domain with electrical signal regeneration and then converted back into optical domain) and also sometimes referred to as SONET regenerators.
OEO-REGEN—OEO signal REGEN using opto-electronic regeneration.
OO—Optical-Optical for signal re-amplification due to attenuation. EDFAs do this in current WDM systems.
OOO—Optical to Optical to Optical signal conversion (from the optical domain and remaining in the optical domain with optical signal regeneration and then forwarded in optical domain).

OOO-REGEN—OOO signal REGEN using all-optical regeneration.

OSNR—Optical Signal to Noise Ratio.

PIC—Photonic Integrated Circuit.

PIN—p-i-n semiconductor photodiode.

PMD—Polarization Mode Dispersion.

REGEN—digital optical signal regeneration, also referred to as re-mapping, is signal restoration, accomplished electronically or optically or a combination of both, which is required due to both optical signal degradation or distortion primarily occurring during optical signal propagation caused by the nature and quality of the signal itself or due to optical impairments incurred on the transport medium.

Rx—Receiver, here in reference to optical channel receivers.

RxPIC—Receiver Photonic Integrated Circuit.

SDH—Synchronous Digital Hierarchy.

SDM—Space Division Multiplexing.

Signal regeneration (regenerating)—Also, rejuvenation. This may entail 1R, 2R, 3R or 4R and in a broader sense signal A/D multiplexing, switching, routing, grooming, wavelength conversion as discussed, for example, in the book entitled, "Optical Networks" by Rajiv Ramaswami and Kumar N. Sivarajan, Second Edition, Morgan Kaufmann Publishers, 2002.

SMF—Single Mode Fiber.

SML—Semiconductor Modulator/Laser.

SOA—Semiconductor Optical Amplifier.

SONET—Synchronous Optical Network.

SSC—Spot Size Convert, sometimes referred to as a mode adapter.

TDM—Time Division Multiplexing.

TEC—Thermal Electric Cooler.

TRxPIC—Monolithic Transceiver Photonic Integrated Circuit.

Tx—Transmitter, here in reference to optical channel transmitters.

TxPIC—Transmitter Photonic Integrated Circuit.

VOA—Variable Optical Attenuator.

WDM—Wavelength Division Multiplexing. As used herein, WDM includes Dense Wavelength Division Multiplexing (DWDM).

It is known in the art to provide a photonic integrated circuit (PIC) chip comprising a plurality of aligned semiconductor lasers lasing at different wavelengths forming a wavelength grid of outputs which are optically coupled on the chip through passive waveguides to an optical combiner or multiplexer, where the combined output is generally amplified. Examples of such a PIC is disclosed in the paper of M. Bouda et al. entitled, "Compact High-Power Wavelength Selectable lasers for WDM Applications", *Conference on Optical Fiber Communication*, Technical Digest series, Vol. 1, pp. 178–180, Mar. 7–10, 2000, Baltimore Md., showing a ¼-shift DFB laser array optically coupled to a multi-mode interference (MMI) optical combiner with a semiconductor optical amplifier (SOA) to amplify the combined output. Another example is the article of Bardia Pezeshki et al. entitled, "12 nm Tunable WDM Source Using an Integrated Laser Array", *Electronic Letters*, Vol. 36(9), pp. 788–789, Apr. 27, 2000 also showing a ¼-shift DFB laser array optically coupled to a multi-mode interference (NMI) optical combiner with an optical amplifier to amplify the combined or multiplexed output. A further paper is to M. G. Young et al. entitled, "A 16×1 Wavelength Division Multiplexer with Integrated Distributed Bragg Reflector lasers and Electroabsorption Modulators", *IEEE Photonics Technology Letters*, Vol. 5(8), pp. 908–910, August, 1993 which disclosed an integrated PIC having modulated sources comprising DBR lasers and electro-absorption modulators (EAMs) coupled to a combiner with its output provided to an AR coated PIC facet via an SOA on-chip amplifier. Other examples are disclosed in U.S. Pat. No. 5,394,489 (modulated combiner output via an electro-absorption modulator); U.S. Pat. No. 5,612,968 (redundant DFB lasers); U.S. Pat. No. 5,805,755 (multiple combiner outputs); and U.S. Pat. No. 5,870,512 (modulated combiner output via a Mach-Zehnder modulator).

Also, known in the art is the integration in a single monolithic optical chip, i.e., a photonic integrated circuit (PIC), a plurality of semiconductor optical amplifiers (SOAs) with their optical outputs coupled via a plurality of passive waveguides to an AWG optical multiplexer to form a multiple wavelength laser source having multiple established laser cavities including these coupled optical components. See, for example, the paper of Charles H. Joyner et al., entitled, "Low-Threshold Nine-Channel Waveguide Grating Router-Based Continuous Wave Transmitter", *Journal of Lightwave Technology*, Vol. 17(4), pp. 647–651, April, 1999. To be noted is that there is an absence in the art, at least to the present knowledge of the inventors herein, of the teaching of an integrated laser modulated source array, such as in the form of modulated sources and wavelength selective optical multiplexer, e.g., such as an arrayed waveguide grating (AWG or Echelle grating In this disclosure, a wavelength selective multiplexer or combiner is defined as one that has less than 1/N insertion loss wherein N is the number of modulated sources being multiplexed.). The principal reason is that it is difficult to fabricate, on a repeated basis, an array of DFB lasers with a wavelength grid that simultaneously matches the wavelength grid of the a wavelength selective combiner (e.g., an AWG). The prior art is replete with control systems to control the temperature of laser diodes to control their temperatures, examples of which are disclosed in U.S. Pat. Nos. 5,949,562; 6,104,516; and 6,233,262 as well as in the article of D. Alfano entitled, "System-On-Chip Technology Adds Options for Laser Driver Control", *WDM Solutions*, pp. 43–48, November, 2001, as well as the control of DFB laser arrays as seen in published U.S. patent application US2001/0019562A1, published Sep. 6, 2001. Also, there are control systems to control the temperature of the wavelength grid of an AWG as set forth in U.S. Pat. No. 5,617,234.

Also, known in the art is a monolithic chip comprising the integration of plurality of distributed feedback (DBR) semiconductor lasers operating at different wavelengths with their outputs provided to an optical multiplexer in the form of an array waveguide grating (AWG) as disclosed in the article of S Ménézo et al. entitled, "10-Wavelength 200-GHz Channel Spacing Emitter Integrating DBR Lasers with a PHASAR on InP for WDM Applications", *IEEE Photonics Technology Letters*, Vol. 11(7), pp. 785–787, July, 1999. DBR laser sources are employed in the chip rather than DFB laser sources because they can be tuned to fit the wavelength comb of the AWG. However, these types of laser sources are more difficult to manufacture in an array and in monolithic form compared to DFB laser sources. But again, the integration of a DFB laser array with an AWG optical multiplexer with matching of their respective wavelength grids is difficult to achieve. Furthermore, none of these reference demonstrates the combination of modulated sources, such as, a modulated laser source (either directly modulated or externally modulated) with any type of source laser (DFB or DBR) in combination with a frequency selective multiplexer or combiner. Such sources are advantages as they provide the possibility of extremely high transmission capacities with the lowest optical loss and hence are part of the current invention.

Recently, U.S. Pat. No. 6,301,031 discloses an apparatus for wavelength channel tracking and alignment in an optical communication system. Disclosed in patent '031 is an optical combiner and feedback detection device preferably formed on the same substrate and a plurality of transmitter lasers having outputs coupled to the optical combiner. Part of the multiplexed signals from the optical combiner are tapped and provided to the input of the detection system which monitors the channel wavelengths to determine if the any one of the operating laser signal wavelengths is offset from its desired wavelength in a predetermined or standardized wavelength grid. The system also monitors a reference wavelength, $\lambda_0$, relative to the standardized wavelength grid to determine if the reference wavelength is offset from its desired wavelength in a standardized wavelength grid. Thus, two different sets of wavelengths are to be aligned to a standardized wavelength grid. First and second feedback loops, provided from detectors at the outputs of the detection system, respectively provide for alignment of the passband of the optical combiner, via the detected reference wavelength, $\lambda_0$, to a standardized wavelength grid and alignment of the respective wavelengths of the transmitter lasers to a desired wavelength on a standardized wavelength grid. Feedback signals affect an operating parameter of the laser sources and optical combiner, most notably their operating temperature where their operating wavelengths and passband, respectively, change due to changes in refractive index of their as-grown materials with ambient temperature variations. Patent '031 is, further, directed to monitor the output power of the multiplexed signals and adjustments are undertaken to the operating temperature and/or current of the transmitter lasers to optimize their power output. While the patent suggests that it is within the ability of those skilled in the art to provide such a monitoring system to change the operating temperatures of these optical components, other than detecting power, such as null crossing, tone detection, and the use of a wavelength selective device for the detection device, such as, wavelength routers, optical filtering device, fiber gratings or Fabry-Perot etalons, there is no disclosure or direction given as to how such a wavelength adjustment and feedback system may be implemented, particularly in the case where, importantly, the multiple transmitter lasers and the optical coupled optical combiner are both provided on the same substrate as a monolithic photonic integrated circuit (PIC).

Lastly, patent '031 indicates that the crux of the invention is not related to how the optical components are secured, whether discrete devices or combined on a single substrate, as the attributes of the invention would apply to both such cases. However, there is no disclosure how the invention is to be accomplished in the case of full integration of these optical components on a single PIC chip, in particular, what problems are encountered in such an integration and still achieve a wavelength control system with the dual function of monitoring and adjusting the individual wavelengths of the transmitter wavelengths to a standardized grid as well as the passband of the optical multiplexer to the same standardized grid.

It an object of this invention to provide for wavelength stabilization of laser sources on a chip or in a photonic integrated circuit (PIC).

SUMMARY OF THE INVENTION

According to this invention, a method of operating an array of laser sources integrated as an array in a single monolithic chip comprises the steps include designing the laser sources to have different target emission wavelengths so that together they form a spectral emission wavelength grid, coupling outputs from the laser sources to an array of gain/loss elements also integrated on the single monolithic chip, one each receiving the output from a respective laser source; and adjusting the outputs with the gain/loss elements so that the power levels across the laser source array are substantially uniform.

In the disclosure, there this provided a monolithic transmitter photonic integrated circuit (TxPIC) chip comprises an array of modulated sources formed on the PIC chip and having different operating wavelengths according to a standardized wavelength grid and providing signal outputs of different wavelengths. Pluralities of wavelength tuning elements are integrated on the chip, one associated with each of the modulated sources. An optical combiner is formed on the PIC chip and the signal outputs of the modulated sources are optically coupled to one or more inputs of the optical combiner and provided as a combined channel signal output from the combiner. The wavelength tuning elements provide for tuning the operating wavelength of the respective modulated sources to be approximate or to be chirped to the standardized wavelength grid. The wavelength tuning elements are temperature changing elements, current and voltage changing elements or bandgap changing elements.

A feature of this invention is a method of tuning optical components integrated on a monolithic chip, such as an optical transmitter photonic integrated circuit (TxPIC), is disclosed where a group of first optical components are each fabricated to have an operating wavelength approximating a wavelength on a standardized or predetermined wavelength grid and are each included with a local wavelength tuning component or element also integrated in the chip. Each of the first optical components is wavelength tuned through their local wavelength tuning component or element to achieve a closer wavelength response that approximates their wavelength on the wavelength grid.

First and second wavelength tuning elements may be associated with the drive current applied to each of the modulated sources or a thermal unit applied to each of the modulated sources and a means for tuning the wavelength grid of the multiplexer. The current may be applied to either the total unit or may be one or more separate section of the source wherein the current is varied to tune the emission wavelength. In the particular description here, examples of such tuning elements is directed to heater elements or thermal electric coolers (TECs) in, on or applied to the TxPIC. However, it will be understood by those knowledgeable of this art, that other such tuning elements can by utilized, such as the change of bias point on the laser sources as well as the additional of various current tuning sections. Moreover, the multiplexer or combiner illustrated in the embodiments of this invention is generally an arrayed waveguide grating (AWG), but it will be understood by those knowledgeable of this art, that other such combiners can be utilized such as a power combiner, e.g., star coupler, multi-mode interference (MMI) coupler or Echelle grating. Thus, these combiners are alternatives for use in the embodiments in this application whether free space power combiners or wavelength selective combiners. However, wavelength selective combiners are preferred since they will provide significantly lower insertion loss, especially for high channel counts. Low insertion loss multiplexing is very important to realize a practical TxPIC as sufficient launch power is required to be useful in most practical systems. This patent discloses practical means for realizing such sources, that is, multiple modulated sources combined with a wavelength selective multiplexer.

An optical transmitter photonic integrated circuit (TxPIC) has a plurality of laser signal sources, such as DFB laser sources, with outputs of different signal wavelengths approximated or chirped to a standardized wavelength grid, which sources are integrated on the same chip with corresponding electro-optic modulators, such as semiconductor electro-absorption (EA) modulators with their modulated outputs comprising channel signals provided as plural inputs to an integrated optical multiplexer, preferably an arrayed waveguide grating (AWG). The AWG functions as a channel signal multiplexer having a passband set to best approximate a standardized or predetermined wavelength grid and providing an output of the combined wavelength division multiplexed signals. A wavelength control system includes monitoring the multiplexed signal wavelengths and temperature changing elements for each of the integrated laser sources as well as the optical multiplexer so that adjustments can be made to the operational wavelengths of the individual laser sources as well as shifting of the passband of the optical multiplexer through changes in their operating temperatures to achieve optimization of the laser operational wavelengths and the AWG passband relative to the standardized wavelength grid.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is a schematic view of a first embodiment of this invention.

FIG. 1A is a lateral cross-sectional, schematic view of an example of an embodiment of an integrated DFB laser in the first embodiment of FIG. 1 which also includes the waveguide layer for one of the signal paths to the AWG.

FIG. 1B is a graphic view the power versus current (LI) curve for a direct modulated DFB laser.

FIG. 2 is a schematic view of a first embodiment of a particular arrangement of the optical components in the embodiment shown in FIG. 1.

FIG. 3 is a schematic view of a second embodiment of a particular arrangement of the optical components in the embodiment shown in FIG. 1.

FIG. 4A is a schematic view of a third embodiment of a particular arrangement of the optical components in the embodiment shown in FIG. 1.

FIG. 4B is a schematic view of a fourth embodiment of a particular arrangement of the optical components in the embodiment shown in FIG. 1.

FIG. 4C is a schematic view of a fifth embodiment of a particular arrangement of the optical components in the embodiment shown in FIG. 1.

FIG. 4D is a schematic view of a sixth embodiment of a particular arrangement of the optical components in the embodiment shown in FIG. 1.

FIGS. 5A and 5B are longitudinal cross-section, schematic views of a DFB, respectively, with a different heater element scheme for presetting the DFB transmission or operational wavelength to a standardized grid wavelength.

FIG. 6 is a schematic view of a second embodiment of this invention.

FIG. 7 is a schematic view of a simplified version of the embodiment shown in FIG. 6.

FIG. 8 is a schematic view of a third embodiment of this invention.

FIG. 9 is a schematic view of a wavelength locking scheme that may be utilized in this invention.

FIG. 10 is a schematic view of a third embodiment of this invention.

FIG. 11 is flowchart of the process for adjusting the wavelengths of the DFB laser sources.

FIG. 12A is a flowchart of one embodiment of a method for testing the TxPIC by tuning the passband of the AWG MUX to the wavelength of the laser.

FIG. 12B a flowchart of one embodiment of a method for fabricating a TxPIC with PDs and testing the TxPICs prior to cleaving from the wafer.

FIG. 13 is graphic illustration of the development of channel signal waveforms on a TxPIC relative to one channel.

FIG. 14 is a perspective view of a monolithic, ridge waveguide TxPIC utilizing two integrated modulators.

FIG. 15 is a diagrammatic side view of a first embodiment of a monolithic TxPIC with separate thermoelectric coolers (TEC) respectively for the integrated laser signal sources and the optical multiplexer.

FIG. 16 is a diagrammatic side view of a second embodiment of a monolithic TxPIC with separate thermoelectric coolers (TEC) respectively for the integrated laser signal sources and the optical multiplexer.

FIG. 17 is a diagrammatic side view of a monolithic, ridge waveguide TxPIC having a heater element fabricated directly in the TxPIC for controlling the temperature of the AWG.

FIG. 18 is a diagrammatic side view of a monolithic, ridge waveguide TxPIC having a heater element fabricated directly in the TxPIC for controlling the temperature of the laser sources.

FIG. 19 is a diagrammatic plan view of a portion of a TxPIC showing one laser source with an associated, surface heater element spatially adjacent to the laser source.

FIG. 20 is a diagrammatic cross-sectional view of a portion of a TxPIC showing one laser source with an associated, buried heater element.

FIG. 21 is a diagrammatic plan view of a portion of a TxPIC showing one laser source with an associated, surface heater element spatially overlying the laser source.

FIG. 22 is a diagrammatic plan view of the contact pad arrangement for a laser source in a PIC to tune the laser source wavelength via contact length trimming.

FIG. 23 is a diagrammatic plan view of the contact pad arrangement for a laser source in a PIC to tune the laser source wavelength via contact resistor trimming.

FIG. 24 is a diagrammatic side view of the deployment of micro TEC elements, one for each laser source, for tuning the individual laser source wavelengths.

DETAILED DESCRIPTION OF THE INVENTION

Reference is now made to FIG. 1 wherein there is shown an example of an embodiment of this invention comprising TxPIC chip 10 utilizing wavelength tuning elements for tuning the modulated source grid with the multiplexer grid, which are shown in FIG. 1 as thermal tuning elements. However, it should be understood that other wavelength tuning elements are contemplated in this invention, such as modulated source tuning by means of changing laser current and bias to change its refractive index and, therefore, the operating wavelength of a laser. Other wavelength tuning elements include: adding multiple sections to the laser and varying the current in each section (including, phase tuning, which is the provision of a phase section in a DFB or DBR laser), vernier tuning where the best passband response is chosen from multiple outputs of the optical multiplexer, the use of coolers to tune the wavelength grid or individual elements of the PIC, including TECs which are also shown in connection with the embodiments herein, and stress tuning such as through the use of bi-metals. Thus, the present invention contemplates wavelength tuning controlled by changes in temperature, voltage and current, or bandgap.

In the present exemplary embodiment, the tuning system shown in FIG. 1 comprises an optical transmitter photonic integrated circuit (TxPIC) chip 10. TxPIC chip 10 is constructed from Group III–V compound layers formed on an InP substrate, for example, formed in the InGaAsP/InP or InAlGaAs/InP regimes. The InP substrate may be semiconductive, e.g., n-InP, or semi-insulating, e.g., InP:Fe. In either case, as known in the art, the contacting to the laser is different. The semi-insulating substrate has the advantage of electrically isolating adjacent modulated sources from each other thereby reducing crosstalk.

TxPIC chip 10 comprises a plurality of integrated array laser sources LD(1) ... LD(N) which may be any temperature tunable semiconductor laser, such as DBR lasers or DFB lasers. An example of monolithic integration with DBR lasers is shown in the article of S. Menezo et al., previously cited, which is incorporated herein by its reference. Here, it is preferred, however, that laser sources LD(1) ... LD(N) are DFB lasers 12(1) ... 12(N), fabricated employing selective area growth (SAG) to provide a plurality of different operating or peak wavelengths wherein the wavelengths fall within or approximate a predetermined or standardized wavelength grid, for example, the ITU grid for G.692 ITU. However, the wavelength grid can be any deigned gird of wavelengths, such as with monotonic increasing or decreasing wavelength points on the grid (symmetric) or with wavelength points on a grid that are not in any ordered wavelength on a wavelength grid such as points such random wavelength points on a wavelength grid (asymmetric). The wavelengths of the laser sources may also be varied by other techniques that include multiple regrowths (with butt-joints) as well as disordering (also known as layer intermixing) either solely, in combination (including in combination with SAG). Also, note that the operating wavelengths may be varied in groups, for example, only varied every M elements in a total of N elements on a PIC chip, where 1<M<N depends on the wavelength grid spacing as well as the tuning range of each modulated source. There may be any selected number of laser sources 12 capable within the epitaxial limits of fabrication techniques for given chip dimensions. The number of such laser sources, and, therefore, the number of signal channels, on a chip 10 may number in the tens of channels. For redundancy purposes, more tunable laser sources as well as accompanying modulators may be incorporated into TxPIC chip 10 than the number of signal channels so that if one or more of the laser sources fail, the additional laser sources, normally not to be operated, can be placed in operation later to replace the defective on-chip laser sources. Furthermore, the redundant SMLs may improve the yield of the PIC (at the expense of increased die size) by providing multiple chances to achieve the requisite performance, wavelength and/or tuning range. In such a case, a wavelength tuning of the operational wavelength of these substituted laser or SML sources can be made if the operational channel or grid wavelength of the failed laser or SML source is within the tunable temperature range of the system as well as the substituted laser or SML source and its associated tuning element (e.g., heaters as explained below). There are several ways that redundancy may be achieved. In the first embodiment, redundant lasers are connected via a coupler (e.g., y-branch coupler) into a single modulator which is then coupled into the input channel of a multiplexer. In a second embodiment, redundant lasers plus redundant electro-optic modulators are connected via a coupler (e.g., y-branch coupler) into a single waveguide channel which is then coupled into a multiplexer. In a third embodiment, modulators are placed in series and only the desired modulator is utilized. The former embodiment is preferred when the main yield loss in a given channel is due to laser yield or wherein directly modulated lasers are utilized. The latter two embodiments are preferred when both the laser and external modulators contribute significantly to the yield loss in a given channel.

Reference is first made to FIG. 1A which illustrates an embodiment for the cross-section of the compound semiconductor materials for chip 10, particularly at the position of the DFB array, and in particular, a cross-section of a buried heterostructure DFB laser in the array. Other compound semiconductor layers or laser structures can be utilized or substituted for this structure as is known in the art. As an example, rather than buried structure, a ridge waveguide structure may be utilized as disclosed and described in U.S. patent application Ser. No. 10/267,346, and published as Pub. No. US23081878A1 on May 1, 2003, incorporated herein by its reference. Chip 10 comprises an n-doped InP substrate upon which is epitaxially deposited an InP buffer layer, both illustrated at 13. An InGaAsP grating layer 15 is epitaxially deposited on the buffer layer followed by an InP grating planarizing layer 17. The planarizing layer 17 may be, for example, InP. Next, an active region 19 is grown and is preferably comprised of a plurality of quantum well and barrier layers. Selective area growth (SAG) is employed using a dielectric (e.g., $SiO_2$ mask), as is known in the art, so that the thicknesses of the layers can be changed to effectively change the bandgap of the active region to thereby produce an array of DFB lasers having different operational wavelengths and designed, as a group, to be approximately on a standardized wavelength grid, such as the ITU grid. Note that other techniques may be used alternatively or in combination with each other or SAG to achieve the chirping of bandgaps across the laser array, including multiple regrowths or disordering. After the growth of the active region 19, an upper cladding layer 21 is formed comprising p-InP. At this point, the as-grown structure is etched back followed by a second epitaxial growth of InP:Fe, InP:O, InP:Fe:O, or undoped InAlAs or combinations thereof to form current blocking layers 23 and forming a current channel through active region 19 as is known in the art. This is followed by the growth of contact layer 25 of $p^+$-InGaAs. Appropriate metal contacts are patterned and applied to contact layer 25 and being separated from one another with a dielectric (e.g., $SiO_2$) passivation layer (not shown) so as to cover only the central region of the current channel of the device as is known in the art.

Associated with each DFB laser 12 is a temperature changing elements 14(1) . . . 14(N). Elements 14 may be comprised of a strip thin-film heater formed on adjacent sides of the DFB laser stripe as shown in FIG. 1, or the heater elements 14 may be formed as u-shaped strips as shown in FIG. 19 surrounding DFB laser 12. Heater elements 14 may be comprised of selectively deposited Pt/Ti bilayer, Pt film, NiCr film, TaN film or other materials as known in the art and are electrically contacted by bonding pads (not shown) at their ends. Alternatively, elements 14 may be a buried layer in the DFB structure such as schematically illustrated in FIG. 20. In FIG. 20, the DFB laser source comprises substrate 650 upon which is deposited DFB laser structure 652, in a manner similar to that explained in connection with previous embodiments. Blocking layers 654, such as Fe or O doped layers, are fabricated to form a confined or buried DFB laser structure which is contacted through contact layer 655. Blocking layers may be encapsulated with a layer 656 that may be comprised of $SiO_2$, SiN or AlN. On this insulating layer 656 is formed a pair of strip heaters 658 for DFB laser 652. Heaters 658 may be comprise of micro-strip layers of TiWN, W, Pt/Ti, Pt, TaN, NiCr, or other materials as is known in the art and are electrically contacted by bonding pads 660 on the surface of cover layer 664 comprised of $SiO_2$, SiN, AlN or BCB with vias 662 contacting strip heaters 658. Examples of such thin film heaters are also disclosed in U.S. Pat. No. 5,960,014 and in the article of S. Sakano et al. entitled, "Tunable DFB Laser with a Striped Thin-Film Heater", *IEEE Photonics Technology Letters*, Vol. 4(4), pp. 321–323, April, 1992, both of which are incorporated herein by their reference. Lastly, heater elements 14 may alternately be positioned above the laser contact stripe with the latter having an exposed contact at 12C such as illustrated in FIG. 21. Note that alternative to heater elements, tuning sections may be incorporated as part of the laser source structure. For example, this may consist of a separate contact for a phase tuning section deployed in a DFB or DBR laser.

A multi-layer stack of electrically resistive layers can be arranged to direct a flow of heat in a given or preferred direction. As an illustrative example, DFB lasers typically increase in wavelength by about 0.1 nm/° C. and are operable at temperatures of 70° C. If a tuning range of about 4 nm is desired, the DFB laser sources may be designed to be operable over a 40° C. temperature range, i.e., the TxPIC may operate at a temperature of 30° C. and each DFB laser may be locally heated up to 70° C. to achieve a 4 nm tuning range and to vary the operational wavelength of individual DFB lasers within this tunable wavelength range. Additionally, since DFB laser output power tends to decrease with operating temperature, SOAs may deployed also on TxPIC 10 in order to achieve sufficient gain to provide the desired channel output power over the entire range of operating temperatures of the DFB laser as well as equalize the powers, or provide a desired pre-emphasis of powers across the array for optimal transmission. Pre-emphasis is deliberate arranging of unequal individual optical channel powers from the TxPIC transmitter to compensate for channel-dependent unequal losses existing in transmission links.

With reference to heater elements 14(1) . . . 14(N) illustrated in FIG. 1, these heater elements may also take on several different types of geometric configurations, some of which are illustrated in FIGS. 19–21. They can be a resistive heater strip formed along either side of a DFB laser source, formed along both sides of each DFB laser source and connected to the same current source, or formed as a u-shaped resistive strip encompassing one end of the DFB laser structure at the device surface and electrically and thermally connecting the adjacent parallel resistive side strips together.

Reference is now made to FIGS. 5A and 5B illustrating another way of setting the wavelength of individual laser sources after TxPIC fabrication. In FIG. 5A, a longitudinal cross section of the DFB laser source 12 is shown which is similar that shown in FIG. 1A except that here a longitudinal cross-section is shown in a region with contact electrode set 90 for driving the laser source. In the case here, there is a plurality drive current electrodes of increasing monotonic width for driving the laser source at a predetermined current density and resulting operational wavelength. In practice, the electrodes 90A–90F of set 90 are each connected to a single common pad to the current source for each respective laser source. FIG. 5B is the same as FIG. 5A except the electrode set 92 is comprised of a plurality of electrode segments 92A–92E of substantially the same size or width so that the applied current across the segments is accomplished by cutting the interconnects from various electrodes to obtain a desired applied current level and possibly location along the length of the device. In FIG. 5A, however, finer incremental steps can be achieved in wire bonding interconnect cut back by selecting different size electrodes. A top view of this approach is depicted in FIG. 22. As shown in FIG. 22, a p-contact pad arrangement 700 is shown comprising a p-contact pad 702 connected via a interconnect metal 706 to a DFB laser top, p-contact 704. Also include are segmented contact portions 707 of DFB laser top, p-contact 704. These segmented contact portions 707 are connected to DFB contact 704 and p-contact pad 702, respectively, by small interconnects 708 and 710. These pad and contact interconnects 708 and 710 can be selectively trimmed, via a focused laser beam to remove an interconnect, to reduce the length of DFB contact 704 and the amount of pad 702-to-conatct 704 interconnect to minimize heater tuning requirements as well as potentially eliminate the need for on-chip heater elements altogether. The reduction in the amount of pad interconnect and laser contact length reduces current flow and applied bias to help tune the laser wavelength. Of course, the same approach here can be used in connection with DBR lasers.

The wavelengths of the individual DFB laser sources are set by at the factory by clipping trimming selective interconnects to the laser source in order to tune the emission wavelength of each respective laser to approximate the relative grid wavelength. Then, in the field, the entire wavelength grid of the laser sources is shifted via a TEC device secured to the bottom of chip 10 at the laser sources to adjust the laser source wavelength grid to the desired transmission laser wavelength grid. This can also be accomplished by phase tuning. In addition, local heaters 14(1) . . . 14(N), disclosed and discussed in connection with FIG. 1, may be employed to adjust, on a continuing basis, the operating wavelengths of the individual laser sources 12(1) . . . 12(N) to the their respective wavelengths in the desired or standardized transmission wavelength grid. Thus, the concept here is to initially adjust the wavelengths of the individual laser sources via current density control by selecting a desired number of contacts to be utilized from the current driving source followed by continual adjustment via the laser source heater control of FIG. 1 or the laser source wavelength grid via a temperature changing element such as a TEC control source, of the type shown for optical multiplexer 16 at 18 in FIG. 1, but as applied to the bottom surface of the PIC in the region of the DFB laser source array. Alternatively, instead of varying the average current density in the DFB by varying its effective length while keeping the current constant, the current density along the stripe width may be varied. This approach is shown schematically in FIG. 23. FIG. 23 is a contact arrangement 720 is shown comprising p-contact 722 with interconnects to DFB first contact segment 724A and second contact segment 724B. Contact segments 724A and 724B are directly above the laser cavity. First contact segment 724A is connected to p-contact pad 722 by a first segment resistor vernier 725 and the second contact segment 724B is connected to p-contact pad 722 by a second segment resistor vernier 727. Resistor verniers 725 and 727 are selectively laser trimmed, as indicated at both 728 and 729, to remove vernier resistor segment sections or portions from making conductive contact to laser contact segments 724A and 724B. In the example shown in FIG. 23, the trimming at 728 comprises fine wavelength tuning by trimming smaller width verniers of either resistor vernier 725 and 727, while the trimming at 729 comprises coarse wavelength tuning by trimming wider width verniers of either resistor vernier 725 and 727. Thus, the current to the lasers is adjusted by trimming the resistor networks 725 and 727 which provide a total tuning range of about 2 nm, roughly 250 GHz, and greatly minimizes the need for the on-chip heater element tuning and potentially eliminates the need of such on-chip heater elements. Of course, this contacting arrangement 720 can be applied to DBR lasers as well.

Accordingly, multiple contacts are made to the DFB sources and connected to a contact pad 722 with various size resistors (as opposed to conductive interconnects) in verniers 725 and 727. The interconnect resistors are of varying width, with a variety of widths, as shown in FIG. 23, connecting a single contact and contact pad. The resistors are then trimmed to vary the ratio of the currents into the different contacts, effectively providing a varying current density across the length of the DFB source while maintaining a constant contact length. This embodiment may be used in conjunction with heaters and a TEC as described above.

Also, included in TxPIC chip 10 is optical multiplexer 16. Optical multiplexer 16 may be comprised of either a multimode interference (MMI) or a star coupler of the type shown in previously mentioned U.S. Pat. Nos. 5,394,489 and 5,870,512 and the paper of M. Bouda et al., supra, or an arrayed waveguide grating (AWG) such as the structural type shown in the previous mentioned paper of Charles H. Joyner et al., which paper is incorporated herein by its reference as well as an Echelle grating. In principal, the AWG type or Echelle grating type of optical multiplexer is preferred because of its low insertion loss which are realized as a result of the wavelength selective nature of the devices. These disadvantages of these wavelength selective multiplexers is that they must be substantially matched a predetermined or standardized wavelength grid. Unfortunately, the wavelength grid of the modulated sources and that of the multiplexers are difficult to match with the current state of the art manufacturing techniques, and hence, require tuning to enable the grids of the multiplexer and sources to be matched or at least approximately matched.

Referring again to FIG. 1, a wavelength grid tuning element in the form of temperature changing element 18 my be comprised of a Peltier element or thermoelectric cooler (TEC) is mounted beneath optical multiplexer 16 on the bottom surface of chip 10. Temperature changing elements 14 and 18 are positioned to locally change the operating temperature of their respective optical components 12 and 16. Thus, these heater elements are provided with driving current to either increase or decrease their temperature.

It should be noted here that the temperature changing element 18 may be constructed to cover over the entire bottom surface of chip 10 rather than just positioned beneath optical multiplexer 16. In this case, temperature changing element 18 functions as a cooler for chip 10 from which the operating temperatures of DFB lasers 12 are respectively changed to bring and maintain their operating wavelengths to a desired operating wavelength within a predetermined wavelength grid, such as the ITU grid. However, in the embodiment illustrated here, the operating temperature of the optical multiplexer is controlled separately from that of the DFB laser sources so that the operating temperature of the laser sources 12 can be optimized to achieve and maintain the desired operating wavelength of these devices to the standardized wavelength grid and the operating temperature of optical multiplexer 16 can be optimized by shifting its wavelength grid to achieve and maintain its wavelength grid as close as possible to the standardized wavelength grid.

When fabricating TxPIC chip 10, certain procedures are followed on a repeated basis toward duplication of the desired Group III–V layer content, bandgap of the active region and confinement layers, position and separation of optical components in the chip, dielectric masking to achieve desired bandgap properties through selective area growth (SAG), and so on, as are known in the art. These procedures, in turn, depend upon the concentrates and flow rates of Group III–V constituents into the MOCVD or OMVPE reactor as well as the temperature of the reactor reaction zone at the substrate susceptor or tray, reactor pressure, and so on, as is well known in the art. Due to many different parameters and operating procedures, it is not always possible to achieve consistency in the designed operational wavelengths of DFB laser sources 12 or in the grating grid (grating arm lengths) of the optical multiplexer, in the case of an AWG filter, or the precise positioning of the input and output of wavelengths to the slab, space region or star coupler of an optical multiplexer, such as, a MMI coupler or an AWG filter. Also, these optical components age over time so that their initially designed wavelength or grid parameters may change due to aging, changing their peak operating wavelength or peak transmission response. This may occur due to a variety of issues, including variation in the stress of the chip which is typically mounted on a submount, e.g., AlN, via hard, e.g., AuSn, solder. Through the deployment of this invention, the operating wavelengths of the DFB lasers and the transmission grid of the optical multiplexer may be maintained through the wavelength control system disclosed in FIG. 1 so that the multiplexed wavelengths provided at the output of chip 10 are operating and maintained within the standardized wavelength grid.

DFB laser sources 12(1) ... 12(N) are optionally coupled to inputs of optical multiplexer 16 via passive waveguides 20(1) ... 20(N) formed in TxPIC chip 10. Optical multiplexer 16 includes at least one output 22 for output of multiplexed channel signals $\lambda_1$ ... $\lambda_N$, and is optically coupled to optical fiber 23 that includes optical booster amplifier 24 for amplifying the signals prior to their travel on fiber 25 to a fiber link such as a point-to-point optical transmission system. Amplifier 24 is a booster amplifier coupled directly to TxPIC 10 and may be comprised of a rare earth fiber amplifier such as an erbium doped fiber amplifier (EDFA).

Also, coupled to the multiplexed signal output fiber 23 is an optical coupler 26 that functions as a 1% tap, for example, where the tapped multiplexed channel signals are coupled to optical spectrum monitor 28. Monitor 28 may detect the power levels of the multiplexed signals and/or examine the wavelength spectrum of the signals and their spectral characteristics. The optical spectrum monitor function may take many forms. For example, wavelength detection can be accomplished by the use of fiber grating filters or a Fabry-Perot etalon filter with the deployment of pilot tones for each DFB laser source 12 such as disclosed in U.S. provisional application of Robert B. Taylor et al., Ser. No. 60/328,332, entitled, "Apparatus and Method of Wavelength Locking in an Optical Transmitter System", and assigned to the assignee herein, which provisional application is incorporated herein by its reference. A similar technique is also disclosed in the paper of K. J. Park et al. entitled, "A Multi-Wavelength Locker for WDM System", *Conference on Optical Fiber Communication* (OFC 2000), Technical Digest Series, pp. WE4-1 to WE4-4, Mar. 8, 2000. See also, another article of K. J. Park et al. entitled, "Simple Monitoring Technique for WDM Networks", *Electronic Letters*, Vol. 35(5), pp. 415–417, Mar. 4, 1999. Also, see U.S. Pat No. 6,233,262. These three references are incorporated herein by their reference.

The signal information from monitor 28 is provided as an input to wavelength control system 30 which comprises a controller microprocessor and associated memory 32 for receiving, monitoring and determining from each of the detected signal wavelengths variations from a reference or nominal and desired wavelength stored in memory 32. In the case here, temperature monitoring wavelength tuning is accomplished by changing the temperature of optical components. In particular, wavelength control system 30 provides two different temperature control signals, respectively, to temperature changing elements 14 of DFB laser sources 12 (signals $T_{L1}$, $T_{L2}$ ... $T_{LN}$) and to temperature changing element 18 ($T_C$) of optical multiplexer 16 to, respectively, control the wavelengths of operation of DFB laser sources 12 through temperature control signals, $T_{LN}$, provided from wavelength control system 30 to elements 18, and to provide a temperature control signal, $T_C$, from wavelength control system 30 to element 18 via associated control circuitry, which is explained below. The temperature of heater element 18 is monitored and adjusted whereas the temperature of elements 14 are only adjusted according to information processed from monitor 28. Wavelength control system 30 monitors the wavelengths in the output as received, via monitor 28, and determines, via stored data, as to the desired operating wavelengths to a standardized wavelength grid. A lookup table is utilized in memory 32 as to temperature changes related to DFB operational wavelengths, which values are compared to the current operational wavelengths to provide signals, $T_{LN}$, to temperature changing elements 14, via digital-to-analog converters 32(1) ... 32(N) to heater current drivers 34(1) ... 34(N) to provide current signals to the respective heater elements 14 of DFB laser resources 12(1) ... 12(N) correcting for changes in laser operating wavelengths from desired wavelengths in the standardized grid. Also, wavelength monitoring system 30 provides the plurality of current control signals, $I_C$, along lines 51 to laser source drivers 54 via digital-to-analog converters 56 to operate sources 12 at a designated bias voltage predetermined during the initial testing phase at the factory. Thus, drivers 52 receive signal data at 50 and directly modulate laser sources 12 relative to a predetermined and adjustable bias point about which the swing of the modulated signal is accomplished, as will be explained in greater detail later.

With appropriate corrections to change the operating temperatures of the respective laser sources 12 to cause their operational wavelengths to shift their desired operational peak wavelengths, the laser source wavelength grid, as a whole, is optimized with the fabricated wavelength passband of the optical multiplexer, such as in the case of an AWG 16. Also, while the diffracted wavelengths in the resulting passband of the optical multiplexer 16 may not be exactly those of the standardized wavelength grid, the grid as a whole can be varied a little with temperature to achieve the best AWG grid match to the operating wavelength grid of DFB laser sources 12(1) ... 12(N).

The control of the temperature for the temperature changing element 18 is shown in FIG. 1. Elements 18 is preferably a thermo-electric cooler (TEC). Its temperature is controlled through monitoring of the ambient temperature of optical multiplexer via thermistor 36. A bias is maintained on thermistor 36, via thermistor bias circuit 38, which has a set or adjustable bias at 40 provided to circuit 38. The temperature of TEC 18 is adjusted and maintained via TEC current driver 48. The input to driver 48 is control amplifier 44 which includes a comparator that receives the current multiplexer 16 temperature, $T_{ACT}$, for comparison, from thermistor 36 via actual temperature circuit 46, and set temperature, $T_{SET}$, from set temperature circuit 42 which is connected to wavelength control system 30 and contains the preset temperature conditions for temperature operation of multiplexer 16, as initially set, for example, at the factory and contained in memory 32.

In operation, wavelength control system 30 provides the preset temperature signal, $T_{SET}$, from memory 32 based upon data monitored and recorded at the factory relative to the multiplexer wavelength grid optimized to the standardized wavelength grid. This preset temperature condition is provided as temperature signal, $T_C$, to circuit 42 to digital-to-analog (DAC) circuit 48. Also, the ambient temperature of multiplexer 16 is monitored via thermistor 36 and processed at monitor circuit 46 to determine an analog value of the current temperature, $T_{ACT}$. Control amplifier provides a comparison of $T_{ACT}$ with $T_{SET}$ and provides to driver circuit 48 a signal indicative of whether the temperature of TEC 18 should be increased or decreased. Once the temperatures of elements 14 have been adjusted to optimize the individual operating wavelengths of DFB laser sources 12 to the standardized wavelength grid, adjustment is made via wavelength control system 30 and TEC current driver 48 to optimize the wavelength grid of optical multiplexer 16 to the best matched operational wavelength grid then established with the plurality of DFB lasers 12. To be noted is that it may be desired, at this point, to also readjust the temperature of one or more DFB lasers 12 to be a little off their peak transmission wavelength but within an acceptable tolerance range, such as, within +/−10% of the channel spacing, in order to better optimize the matching of the wavelength grid of DFB lasers 12 to the wavelength grid of optical multiplexer 16. Thus, it is contemplated by this invention to provide for not only adjustments to the DFB laser wavelength grid with the wavelength grid of multiplexer 16 but also to fine tune the individual wavelengths of DFB lasers 12 within acceptable tolerances to match the set fabricated filtering output wavelengths of the multiplexer 16 providing a set wavelength grid which can be wavelength adjusted through wavelength shifting of the optical multiplexer wavelength grid.

In the embodiment of FIG. 1, DFB lasers sources 12(1) ... 12(N) are directly modulated with the data or intelligence signals from signal sources via inputs 50. In this approach, the output light intensity of DFB lasers 12 is modulated by modulating the current injected into the lasers via current driver circuits 52 via drive lines 54. While direct modulation of DFB lasers brings about a certain amount of wavelength chirping, which is a function of current, the amount of chirping can be made small by providing DFB laser sources 12 with narrow optical spectral line width via fabrication of their bandgap and grating, such as, through the careful control techniques using selective area growth (SAG) and grating masks in MOCVD fabrication as is known in the art or other techniques of multiple regrowths or disordering as described previously.

Reference is now made to FIG. 1B which is for the purpose of explaining the direct modulation of the array DFB laser 12(1) . . . 12(N). FIG. 1B shows the intensity in terms of power versus current for laser modulation. DFB lasers, in general, are limited by the maximum current density that they can be driven at, which is indicated at 27 in FIG. 1B. The modulation along the current curve is designated as $\Delta I_{SWING}$ at 35 and is modulation between some maximum value, $I_{BIAS-MAX}$ at 29, and some minimum value, $I_{BIAS-MIN}$ at 31 where the latter is above the lasing threshold of the laser. The two points 29 ($I_{SWING-MAX}$) and 33 ($I_{BIAS-MIN}$) also establish the extinction ratio of modulation. The central region of $\Delta I_{SWING}$ is $I_{BIAS-NOMINAL}$ at 35. $I_{BIAS-NOMINAL}$ between $I_{BIAS-MAX}$ and $I_{BIAS-MIN}$ dictates the minimum performance to achieve a good extinction ratio. $I_{TUNE}$, which is the mean current applied to the DFB laser source, will be governed by the placement of $I_{BIAS-MAX}$ and $I_{BIAS-MIN}$ which, when moved along the power curve, can be deployed to tune the wavelength of the laser by current changes while $\Delta I_{SWING}$ is the modulation range defining the extinction ratio. In reality, $I_{TUNE}$ is, in its simplest form, the average current drive to the laser, i.e., $I_{BIAS-MAX}$ and $I_{BIAS-MIN}$ divided by two. So roughly, the average current is $I_{TUNE}$, which is change by $I_{SWING}$, and the modulation of the laser is going to be faster than the thermal time constant of the laser and, thus, not affected by a string of either binary 1's or 0's. So, there is a minimum bias at which to achieve the proper extinction ratio and a maximum bias based upon the reliability of the laser.

Thus, there are two cases here of tuning control to achieve proper wavelength and extinction ratio. These approaches are both illustrated in the diagram of FIG. 11. The first approach is the deployment of heaters 14(1) . . . 14(N) in FIG. 1 for tuning the individual laser wavelengths to be adjusted to the standardized wavelength grid. Wavelength tuning as accomplished by heaters 14 may be sufficient for accurate control of the individual wavelengths of the DFB lasers 12. Thus, the portion of the control scheme of FIG. 11 that is marked "OPTIONAL" may not be necessary.

The second approach is the deployment of heaters 14(1) . . . 14(N) as a coarse tuning of the laser wavelength and the current tuning of the individual lasers as a fine tuning of the laser wavelength. As shown by the diagram in FIG. 11, under the control of wavelength control system 30 and electrically connected modulator current drivers 52 via lines 51 and electrically connected laser heaters 14 via lines 53(1) . . . 53(N), a dual feedback loop is created from wavelength tuning DFB lasers 12 through operating temperature changes provided by both heaters 14 and current changes to the current bias of the drivers. As shown in FIG. 11, the monitored wavelengths via optical spectrum monitor 28 are compared at 37 to the designated laser source operating wavelengths as stored in memory 32. If the wavelength comparison is not a match at 39, then a determination is made if there is a significant error, indicated at 41, i.e., whether there is a sufficient deviation from the desired grid wavelength to require a change in the operational or transmission wavelength operation of the laser source. If no, then no correction is made, as indicated in FIG. 11. If yes, then a determination is made at 43 as to whether there is a large change in the laser operational wavelength, which is defined as a coarse error of one being out of the permitted band for wavelength operation of the laser relative to the standard gird wavelength, or even possibly within the operational wavelength of an adjacent laser. In most cases, a change in the heater bias, which can be designated as a coarse correction routine, is sufficient to correct the wavelength by increasing or decreasing the bias to the laser heater as indicated at 45, where the tuning is accomplished via system 30, as previously explained. However, fine tuning of the wavelength in some applications can be accomplished by the change of the current bias to the individual laser as well as an adjustment to its $I_{SWING}$. Thus, at decision making 43, if the error in operational wavelength is not large, a fine error determination can be made, as indicated at 47, and a fine correction routine is followed where the current of the DFB is tuned via a change in $I_{BIAS}$, up in amount to increase the wavelength a small amount and down in amount to decrease the wavelength a small amount, which function is indicated at 49. Also, as indicated at 55, $I_{SWING}$ is adjusted so that a good extinction ratio is maintained in modulation of the DFB laser relative to changes made to $I_{BIAS}(I_{TUNE})$. Note that a similar scheme may be employed for externally modulated sources, wherein the coarse tuning occurs via heaters or phase tuning of the laser and fine tuning occurs by the average current in the laser source.

Referring again to FIG. 1, as another embodiment, wavelength control system 30 may provide, in addition to temperature control signals, current control signals via lines 51 to DAC circuits 56 which are connected to current drivers 52. Thus, the response time of changes to operating wavelengths of the individual DFB laser sources 12 can be enhanced by providing an increase in current operation of a laser source to shift its output to a longer wavelength of operation toward, for example, its desired operating wavelength while a temperature change to increase the operating temperature of the same laser is applied via a signal $T_L$. Then, system 30 provides a gradual decrease in the drive current of driver circuit 52 simultaneously with an increase in the operating temperature of the same laser source. In this manner, a faster response in setting changes to the laser source operating wavelength can be successfully achieved. A similar control system to the foregoing is disclosed in U.S. Pat. No. 6,104,516, which patent is incorporated herein by reference. Again, this technique can be applied to the modulated sources, i.e., to both directly modulated sources and externally modulated sources.

One preferred combination of optical components for incorporation into TxPIC chip 10 is shown in FIGS. 2 and 3 comprising chips 10A and 10B, respectively, an InGaAsP/InP based regime. In FIG. 2, the TxPIC chip 10A includes integrated semiconductor optical amplifiers (SOAs) whereas in FIG. 3, the basic TxPIC chip 10B provides minimal components for an eight channel transmitter comprising a plurality of DFB laser sources 12(1) . . . 12(8); a plurality of temperature changing elements 14(1) . . . 14(8); an optical multiplexer 16 comprising, preferably, an AWG or other low-loss wavelength selective multiplexer, and a TEC unit 18 that covers the entire bottom surface of chip 10B. In both embodiments, the preferred optical multiplexer (MUX) is an arrayed waveguide grating (AWG) which is a wavelength dispersive grating device, which is also referred to in the art as a PHASER capable of performing MUX/DEMUX operations. These devices basically comprise two optical diffractive regions commonly referred to as slabs, free space regions or star couplers, between which are a plurality of waveguide grating arms having predetermined differences in their arm lengths so as to function as an arrayed waveguide grating.

It should be noted that in employing an embodiment such as shown in FIG. 3 where a TEC 18 is utilized in combination with individual heaters 14 for DFB laser sources 12, it is preferred that the TEC 18 be operated as a cooler rather than as a heater so that the junction temperature of the active sources on the TxPIC chip may be ultimately lower than compared to the case where the chip TEC 18, that thermally includes DFB laser sources 12, is utilized as a heater to tune the AWG wavelength grid.

In FIG. 2, TxPIC chip 10A comprises, in monolithic form, a plurality of direct modulated DFB laser sources 12(1) . . . 12(N) providing a set of output wavelengths $\lambda_1 \ldots \lambda_N$, respectively, placed on passive waveguides 57 coupling modulated signals to AWG 16 to its input slab or star coupler 60 via integrated semiconductor optical amplifiers (SOAs) 58(1) . . . 58(N) formed in passive waveguides 57. The purpose of SOAs 58 is to boost the intensity of the outputs of laser sources 12 to compensate for insertion loss of waveguides 57 as well as to provide for lower signal modulation, i.e., lower current swing in the modulation of current drivers (not shown in FIG. 2) thereby reducing the chirp effect in their modulation resulting in lower amplitude modulation outputs from laser sources 12 which are amplified by SOAs 58. Also, the SOAs can provide the ability to equalize the power across the array to account for varying efficiency and/or loss through the entire optical train for a give channel. Furthermore, the SOAs may be utilized to provide pre-emphasis of the channel powers for optimal transmission characteristics. AWG 16 is provided with a plurality of waveguide arms 62(1) . . . 62(N) that filter, according to the designed wavelength grid of the device, the modulated signals to slab 63 where the modulated signals are diffracted to a single output 22 which may be coupled as an output from chip 10 directly to boaster amplifier 24 as shown in FIG. 2. On the other hand, instead of booster fiber amplifier 24, a semiconductor laser amplifier, for example, gain-clamped-SOA (GC-SOA) 64, may be integrated into optical output waveguide 22 to boost the multiplexed channel signals before they are transferred off chip to compensate, for example, for insertion loss of AWG 16. In the case here, SOA 64 may be gain-clamped (GC), i.e., it includes a designated lasing wavelength having a peak wavelength different from any of the output wavelengths of DFB laser sources 12. Thus, feedback is created through an established laser cavity within the amplifying medium of the SOA causing oscillation at the designated wavelength inside the SOA cavity so that the lasing action clamps the gain of the SOA which also leads to high saturation input power. As a result, the gain contributed to the plural multiplexed wavelength signals remains substantially uniform in spite of dynamic changes in their intensity or in the absence, for example, of one or more wavelength signals from the multiplexed signal from AWG 16. Any developed ASE or residual gain clamped sign al from GC-SOA 64 may be filtered from the multiplexed channel signals via a filter for these wavelengths, outside the wavelength spectrum of the multiplexed channel signals by an on-chip or off-chip filter placed between GC-SOA 64 and fiber amplifier 24. As to on-chip filters, see U.S. patent application Ser. No. 10/385,574, filed Mar. 10, 2003 and published on Dec. 4, 2003 as Patent Application Pub. No. US2003/0223672A1, illustrating several such embodiments, which application is incorporated herein by its reference.

As previously indicated, TxPIC 10B in FIG. 3 is a monolithic chip comprising an array of eight DFB lasers sources 12(1) . . . 12(8) with associated heaters 14(1) . . . 14(8) with their light outputs coupled to input space region 60 of AWG 16 via passive waveguides 57. AWG 16 includes input space region 60 and output space region 63 between which is a plurality of waveguide arms 62(1) . . . 62(8) of differing lengths. In the case here, the entire chip 10B is, however, temperature controlled by TEC 18. In this case, as previously indicated, TEC unit 18 may be deployed to cool chip to a designated or predetermined temperature value from which temperature changing elements 14(1) . . . 14(8) are individually addressed to optimize the respective operational wavelengths of DFB laser sources 12(1) . . . 12(8) to tune their wavelengths to a standardized wavelength grid.

Reference is now made to a series of figures, FIGS. 4A–4B, which illustrate different architectural arrangements for integrated optical components provided on monolithic InP-based chip 10. FIG. 4A illustrates a further architectural arrangement for a TxPIC chip. The purpose of this embodiment is to illustrate other optical components that may be integrated into chip 10 as also discussed in patent application Ser. No. 10/267,331, supra, published on May 22, 2003 as Pub. No. US23095737A1, incorporated by reference. In FIG. 4A, in TxPIC chip 10C, DFB laser sources 70 are not directly modulated. Instead, these sources are operated cw and their light outputs are modulated in accordance with data or intelligence signals via optical modulators, for example, electro-absorption modulators (EAMs) 74. Alternatively, these modulators can be, instead Mach-Zehnder modulators. Also, chip 10C is replete with photodetectors, shown here as PIN photodiodes 68, 72, 76 and 80 in each optical waveguide path between integrated electro-optical components as well as at the back end of DFB sources 70 and at the light output of AWG 82. These photodiodes are provided at various locations in chip 10C for the purposes of performing in-line testing of the optical characteristics of a preceding optical component as well as optical component monitoring during its operation. For example, these photodiodes are employed to monitor and adjust both the applied positive bias of DFB laser sources 70 and SOA sources 78 as well as the applied negative bias of modulator 74.

As noted in FIG. 4A, the components that are in multiple form on the chip are designated with the identifier "(N)" which means a plurality of these elements or components are in separate optical paths optically coupling these components into a single optical component, in the case here an optical multiplexer in the form of AWG 82. This identification is also applicable to the chips 10E, 10D and 10F in respective FIGS. 4B, 4C and 4D, as discussed below.

In particular, TxPIC 10C in FIG. 4A comprises an array of DFB laser sources 70 each optically coupled at their light output to an electro-absorption modulator (EAM) 74 via a PIN photodiode 72. Photodiode 72 is useful in monitoring the intensity of the DFB laser source output and can, therefore, be utilized in a feedback scheme to maintain the desired level of laser source output power. Also, the back end of each DFB laser source 70 may include an optically coupled PIN photodiode 68. Photodiodes 68 detect a small portion of the laser power emitted out of the back end of laser sources 70 for measuring their power intensity for purposes, for example, of calibrating, during initial testing, the laser source relative to applied current and bias as well as for monitoring power and intensity during their cw operation. Also another important function of these photodiodes is to prevent unwanted reflections from the nearest cleaved facet, e.g., the rear TxPIC facet, from causing unstable change in the laser output wavelength. By the same token, PIN photodiodes 72 may be employed to monitor the power output of DFB laser sources 70, preferably on a periodic basis so as not to bring about a too significant insertion loss. Also, photodiodes 72 can also be employed to attenuate the output power of DFB laser sources 70 via an applied negative bias.

PIN photodiodes 76 are inserted after each EAM 74 for the purpose of calibrating the bias, current swing, and duty cycle control of each modulator. They also may be utilized as the a monitor of the power output of the DFB laser source via the EAM. SOAs 78 are provided to boost the power output from modulators 74. The set point and modulation swing of EAMs 74 can change with time as well as experience an insertion loss change in the modulator where the channel wavelength becomes misaligned with the desired operational wavelength and as well as with the transmitter laser wavelength grid. With photodiodes 76 and SOAs 78 as well as photodiodes 80, the modulator performance can be directly analyzed, readjustment can be made to the channel power via the channel SOA 78 and the performance and gain of SOAs 78 can be monitored and adjusted, respectively. This dynamic monitoring and adjusting function counteracts wavelength drift and power variations relative to predetermined and desired values. In this connection, it should be noted that the wavelength adjustments of the transmitter laser sources 70 can be adjusted in accordance with the teachings of FIG. 1 relative to $T_L$ values via wavelength control system 30 either as a preset value relative to the set AWG wavelength grid, or dynamic monitoring and changes in value over time. In the case of the former approach, i.e., the preset of the transmitter laser sources 70 to the standardized wavelength grid, adjustments can be made for smaller wavelength deviations and resulting power output deviations in channel signals from EAMs 74 by making adjustments to the gain of SOAs 78 where the modulated power output is detected and monitored via photodetectors 80.

It is within the scope of this invention that PINS 80 in the embodiment of FIG. 4A be initially employed to monitor the optical characteristics of the channel signals, in particular, the power output from SOAs 78, to determine settings for its gain after adjustments are made to DFB laser sources 70 to optimize their desired wavelength transmissions to the standardized wavelength grid. Then, PIN photodiodes 80 can be operated as saturable absorbers where their gain region is either unbiased or reversed biased, providing a net effect of lower absorption for the ON-state of modulator 74 and a high absorption for the OFF-state in order to enhance the modulator extinction ratio. Thus, photodiodes 80 can double as a photodetector for purposes of tap-monitoring of the laser diode power output and as a saturable absorber for enhancing the extinction ratio of modulators 74. More will be said about this functionality relative to the embodiment shown in FIG. 4B. Furthermore, photodiodes 80 and SOAs 78 can be used as optical modulators by applying time varying bias to them. For example, one or more of photodiodes 80 could be used to encode the signal channel with additional information useful for signal channel identification, wavelength locking, or data transmission additional to that encoded by EAMs 74. As an illustration, one of photodiodes 80 can have its bias voltage modulated by a sine wave or square waves, unique to the particular optical channel, to label the optical channel for use in channel identification and wavelength locking without demultiplexing the optical channels. Other modulations (tone burst, spread spectrum, multitone, etc.) can be used similarly for these purposes. Photodiodes 80 can also be used as voltage variable optical attenuators, useful for controlling individual optical channel powers It is within the scope of this invention to employ on-chip photodetectors, such as photodetectors 72 or 76 in FIG. 4A with integrated forward or upfront filters, e.g., a blazed grating to select a wavelength band around the desired peak wavelength, to detect and monitor wavelengths of the laser sources. Another approach would be that photodiodes 72 or 76 would be comprise an absorption filtering photodetector having an integrated front filter to spectrally narrow the input optical signal to the desired bandwidth of the signal desired to be detected. See, for example, the article of T. Cory et al. entitled, "Active Wavelength Measurement System Using an InGaAs-InP Quantum-Well Electroabsorption Filtering Detector", *IEEE Photonics Technology Letters*, Vol. 8(12), pp. 1686–1688, December, 1996, which article is incorporated herein by its reference. Also, the InGaAsP/InP or InAlGaAs/InP alloys can be employed to make such a device. The device works n the principal of absorbing wavelengths near the absorption edge of the device leaving another wavelength bandwidth monitored which is the desired bandwidth for the laser wavelength within the standardized wavelength grid.

Referring again to FIG. 4A, the modulated channel signals are combined in AWG 82. AWG 82 has at least one output for the multiplexed signals from PIC chip 10C. Another output may be included in the first order, second order or Nth order Brillouin zone for purposes of monitoring the power of the multiplexed channel signal output or the wavelengths of the transmitter laser sources or their transmission wavelength grid, which will be discussed in more detail in later embodiments.

Thus, it is an important feature of this invention to provide a photodetector (such as, a PIN or APD photodiode) to analyze the optical characteristics of a preceding integrated electro-optical component to analyze and/or monitor its operation and determine what its bias should be, particularly relative to other integrated electro-optical components, to achieve a predetermined wavelength, intensity, chirp, extinction ratio, etc. in the resultant signal along the plural optical waveguide paths to the input of the AWG. The photodiodes may be operated only at specific times for signal monitoring and at other times not negatively biased to achieve their intended detection function, i.e., remain either unbiased to be transparent and thereby ineffective in operation and generally transparent to the transmitter channel signals. In such a state, they may, to some extent, be absorptive of the signal light without any bias so that a small bias may be applied to them during their non-detection periods to optimize their transparency to the transmitter channel signals in order to render them non-contributive to any insertion loss. Also, any one set of on-chip SOAs or on-chip photodiodes in respective optical signal channels may be also be operated as low frequency or tone modulator for tag identification of the respective modulated sources for purpose of system or network identification of a particular modulated source on a particular TxPIC chip or for purposes of wavelength stabilization as set forth in FIG. 9. Thus, each modulated source is modulated with a different low frequency (e.g., in the range of about 1 KHz to 200 KHz) employed to identify each modulated source in the network. In either case, the low tone modulation does not substantially interfere with the channel signals and may be filtered out at the optical receiver or RxPIC if necessary.

Reference is now made to FIG. 4B which shows another architectural arrangement comprising TxPIC chip 10D. The arrangement of integrated optical components in TxPIC chip 10B substantially differs from TxPIC chip 10C in that there is a saturable absorber (SA) 78 that follows each EA modulator 74 as well as a reduction in the number of on-chip monitoring photodetectors. The integration of saturable absorber 75 after each modulator 74 provides a means to independently improve the extinction ratio of modulator 74. The extinction ratio of the modulated signal is an important parameter in optical communication systems. Often, tradeoffs occur in the design of the modulator to realize a high extinction ratio along with other desired parameters, such as, low insertion loss and desired alpha or chirp parameters of the modulator. Such a saturable absorber can also be incorporated immediately following SOA 78 in addition to or without the inclusion of saturable absorber 75. Saturable absorber 75 can share the same active region as that formed in DFB laser sources 70 and SOAs 78, such as illustrated at active region 19 in FIG. 1A or can be tuned to a different optimal wavelength by the techniques of SAG, multiple regrowths, and/or disordering. The active region of the saturable absorber 75 is either unbiased or reverse biased. The absorption region in the state of reversed bias will saturate at high input powers and the absorption will drop. The net effect is a lower absorption condition for the ON-state of signal modulation and a high absorption condition for the OFF-state of signal modulation thereby increasing the extinction ratio. In this embodiment, the saturable absorber 75 can also perform the function of a photodetector to monitor the optical properties of the light and modulation characteristics of EA modulator 74 in cases where it is not being deployed as an absorber.

As described previously, further functions of EAMs 74, SOAs 78, or photodiodes 80 include optical modulation, such as might be used to encode signal channels with additional information useful for functions such as signal channel identification, wavelength locking, or data transmission additional to that encoded by EAMs 74.

Reference is now made to the embodiment of FIG. 4C comprising TxPIC chip 10E. Chip 10E has the same general configuration as chip 10C except with fewer on-chip monitoring photodiodes and is provided with multiple or cascaded EA modulators fabricated in-line for each wavelength channel on chip 10E. Here, three such cascaded EAMs 74A, 74B and 74C are shown. Since the EA modulator is such a critical optical component in the TxPIC architecture, the incorporation of more than one modulator into each optical signal path will significantly increase the yield of operational TxPIC chips from each InP wafer. The chip or die can be probe tested and each modulator 74A, 74B and 74C tested and modulated to determine the one with the highest extinction ratio and the best or optimum chirp for subsequent wire bonding and ultimate utilization in signal modulation. The remaining modulators are slightly positively biased or not biased at all (zero potential) so that they remain transparent to the propagating signal light. Alternatively, one or more of EAMs 74 in each signal path, not employed directly for signal modulation, can be wire bonded to provide either a monitoring function, such as being operated as a photodiode or as a saturable absorber to improve the extinction ratio as discussed in connection with the embodiment of FIG. 4B. Lastly, two or more EAMs 74 in each path may be operated in tandem to function as a single signal modulator to achieve lower extinction ratio which is a functional utilization known in the art. Alternatively, the tandem modulators may be operated where a first of such modulators provides a constant pulse train and the second modulator encodes the data onto the pulse train.

Reference is now made to FIG. 4D illustrating another TxPIC architecture comprising TxPIC chip 10D which represents a "Minimal" version of a monolithic TxPIC chip comprising this invention. TxPIC chip 10D comprises a plurality of optical waveguide paths that each include, in optically coupled sequential relation, a PIN photodiode 68, a DFB laser source 70, an EA modulator 74, a monitoring PIN photodiode 76, all the outputs of which are coupled to inputs to the first order Brillouin zone of AWG 82. The multiplexed channel signals from AWG 82 are optically coupled off-chip to EDFA 24 for signal amplification prior to their transfer onto the optical transmission link. The size of monolithic chip 10D may be, for example, 5 mm by 3.5 mm. Also, a mode adaptor or converter (not shown) may be placed between monitoring PIN photodiodes 76 to insure that the modulated channel signals entering the inputs to AWG 82 are propagating in single mode. As previously indicated, photodiodes 68 monitor the intensity of their corresponding DFB laser sources 70 and PIN photodiodes 76 monitor their corresponding EAMs 74 relative to extinction ratio, chirp, intensity and peak-to-peak changes in modulation.

Reference is now made to FIGS. 6 and 7 illustrating a TxPIC package and associated electronic control comprising transmitter system 100 of this invention. In particular, system 100 utilizes signal modulation via on-chip electro-optic modulators 110(1) . . . 110(N) receiving light from cw operated DFB lasers 108(1) . . . 108(N). This differs from transmitter system 200 in FIGS. 8 and 9, to be discussed later, where there are no on-chip electro-optic modulators and the DFB laser sources are directly modulated.

As shown in FIG. 6, the transmitter PIC (TxPIC) chip 100 is an InP based chip, as illustrated in Ser. No. 60/328,207, incorporated by reference, or as shown in FIG. 1A relative to the structure for a DFB laser source. The optical paths making up the electro-optical components or elements comprising individual optical signal transmission paths may be InP buried heterostructures or ridge waveguide structures or a combination of both for different elements. As depicted in FIG. 6, TxPIC chip 100 is supported on TEC element 104 and, together, contained within a transmitter hermetic package 102. The DFB laser source paths include a plurality of optically connected electro-optical components, the number of which of such paths being, for example, N=4, 8, 10, 12, 16, 20 or 24. Each such path comprises, in optical series, a DFB monitoring photodetector 106(1) . . . 106(N); a DFB laser source 108(1) . . . 108(N) and associated heaters 111(1) . . . 111(N); an EA modulator (EAM) 110(1) . . . 110(N); a photodetector 122(1) . . . 112(N); a semiconductor optical amplifier (SOA) 114(1) . . . 114(N) and a photodetector 111(1) . . . 116(N). Photodetectors 106, 112 and 116 are shown as PIN photodiodes but can also be avalanche photodiodes (APDs). Also, the employment of SOAs 114 and associated photodiodes 116 may be eliminated from this embodiment. Also, as an alternative, a photodiode may be integrated in the optical paths between DFB laser sources 108 and EAMs 110, as indicated in FIG. 6 and already explained relative to FIG. 4A.

As shown in FIG. 6 as well as other embodiments, heaters 111(1) . . . 111(N) are connected to a common ground with other active components on TxPIC chip 100. However, alternatively, these heaters 111 may be connected to a separate ground in order to be able to measure the current through the heaters separate from other current flows on chip 100. In this way, the wavelength operation of the laser sources can be approximated since changes in the current flow through the heaters approximates changes in laser source wavelength. Therefore, these current adjustments tune the laser source wavelengths to their desire operating wavelengths.

Photodiodes 106 are employed to monitor the output of DFB laser 108 via the backlight emitted from the laser sources. In this manner, as is well known in the art, the intensity of the generated light from laser sources 108 is monitored via circuit 162 and a feedback loop is employed to control the operating current to laser sources 108. Photodetectors 112 monitor the modulated outputs of EAMs 110 for determining optical characteristics of the modulated signal, such as, intensity, peak-to-peak change, extinction ratio, chirp, etc. as well as the power exiting the combined laser plus modulator. SOAs 114 are optional in this configuration, particularly in the presence of an optical fiber amplifier 126 at the output of TxPIC 101. Amplifier 126 may be an erbium doped fiber amplifier or other such rare earth fiber amplifier. SOAs 114 provide amplification of the modulated signals from EAMs 110 and compensate for insertion loss of previous optical components. Photodetectors 116 provide for monitoring of the intensity or power of the amplified modulated signals from the output of SOAs 114. These photodetectors 116 may be used during manufacture for testing the modulated signal quality of all channels on TxPIC 101 to insure PIC quality and operation prior to their placement into hermetic sealed package 102. Photodetectors 116 may also be deployed during TxPIC in-field operation to monitor optical characteristics and parameters desired for each wavelength channel such as intensity of the channel signal and extinction ratio of the modulated signal. Also, very important to the utility of this invention is that photodiodes 116 may be employed on a continuous operating basis in TxPIC 110 as voltage optical attenuators (VOAs) or as saturable absorbers to equalize the power of the modulated channel signals across the modulated sources as well as utilized for low tone modulation for signal output encoding either to tag each of the modulated sources or for sending encoded service channel data or information from TxPIC 110 to another terminal or node on the network. This later function can be highly instrumental in the operation of TxPIC 110 wherein an integrated transmitter PIC has the capability of sending both high frequency multi-GHz channel signals as well as low frequency multi-KHz information signals into the optical transport network.

As described previously, photodetectors 112 can further serve as optical modulators or as variable optical attenuators, in addition to their roles as monitors. Multiple of these functions can be performed simultaneously by a single photodetector, or the functions can be distributed among multiple photodetectors.

All of the multiple outputs of the wavelength channels from photodetectors 116(1) . . . 116(N) are provided as inputs to an integrated optical combiner or multiplexer, here shown as AWG 118. AWG 118 provides at an output at the first order Brillouin zone comprising multiplexed channel signals, $\lambda_1 \ldots \lambda_N$, on output waveguide 120, which may also be comprised of a mode converter to match the single mode from AWG 118 to optical fiber 128 coupled to receive the multiplexed signals. Optical fiber 128 includes booster EDFA amplifier 126. Additional outputs in the first Brillouin zone may be provided for optimized combined signal output from AWG 118. One such first order zone output may also be utilized as a tap for monitoring the multiple wavelength signals coming from TxPIC 101. On the other hand, such monitoring taps can be taken from a higher order Brillouin zone. Such taps are shown in FIGS. 6 and 7 at higher order Brillouin zones at output waveguides 121 and 123 formed in TxPIC 101 which are, respectively, coupled to photodetectors 122 and 124, such as PIN photodiodes, integrated on TxPIC chip 101. The photo detected currents from photodetectors 122 and 124 are provided on a pair of output lines 129 to optical spectrum monitor 130. The operational wavelength monitoring photodetectors 122, 124 can be employed to determine if the operational wavelength of the DFB laser sources are off their desired operational wavelength as illustrated in FIG. 6A. As shown, the detection wavelength spectrum of the photodetectors can be deployed to discriminate if the operational wavelength is below (n+1) or above (n−1) the desired operational wavelength for a particular laser source. Monitor 130 has the same function as the optical spectrum monitor 28 in FIG. 1 for independently determining the optical characteristics of the individual signal channels and providing information signals along line 131 to controller 132. In the example here, the type of monitoring system chosen may be a tone monitoring system such as disclosed in the papers of K. J. Park et al., respectively entitled, "Simple Monitoring Technique for WDM Networks", *Electronic Letters*, Vol. 35(5), pp. 415–417, Mar. 4, 1999 and "A Multi-Wavelength Locker for WDM Systems", *Conference on Optical Fiber Communication* (OFC 2000), pp. WE 4-1/73to WE 4/3/75, Wednesday Mar. 8, 2000, both of which are incorporated herein by their reference. In this system, multiple low frequency pilot tones are provided to the DFB laser sources 108 via tone generator 156. Tone generator 156 provides one tone frequency to each laser source 108 which functions as an identification tag for each individual laser source and does not interfere with signal modulation via EAMs 110 because the frequency tones are transparent to the modulated channel signal. Tone generator 156 is coupled with the SOA bias control digital-to-analog (DAC) circuit 166 so that the multiple tones can be inserted into the optical path of each channel via SOAs 114. Thus, the tones provide a low frequency modulation in the signal stream through the low frequency modulation of SOAs 114 along with appropriate bias for channel signal amplification. Alternatively, the tones may be provided in the signal channels via a photodetector, such as PIN photodiodes 112, or superimposed on the bias from the DFB driver digital-to-analog (DAC) circuit 154. Thus, in the case where SOAs 114 are not to be included in the TxPIC architecture, the tones from generator 156 may be provided directly to photodetectors 116 which, in this case, are not provided with any bias for monitoring operations.

In this optical spectrum monitoring system, both AWG higher order photodetectors 122 and 124 are employed with outputs of these photodetectors with the sampled multiplexed signals are provided to optical spectrum monitor 130 which includes an etalon filter in the line 129A of one photodetector and the other line 129B is provided directly to system 130 where the signals are digitized, Fourier transformed and processed as disclosed in K. J. Park et al. For each pilot tone, the Fourier transform of the photocurrents from photodiodes 122 and 124 will contain a term proportional to the derivative of the etalon transmission peak which can be employed to provide an error signal for locking each of the respective DFB laser sources 108 to a desired wavelength on the standardized wavelength grid.

Other wavelength monitoring systems are within the contemplation and scope of this invention. For example, a single photodetector, such as PIN 124, may be employed for locking the output wavelengths of the DFB laser sources 108 to the peaks of wavelength grid of AWG 118. In this case, a characteristic pilot tone per each DFB laser source 108 is employed and the electrical output signal from the single photodiode 124 is fed to circuitry that provides for phase sensitive detection, i.e., one phase detector per DFB for locking the wavelength operation of each laser 108 to its respective transmission peak in the wavelength grid of AWG 118. See, for example, the paper of H. Lee et al. entitled, "Multichannel Wavelength Locking Using Transmission Peaks of an AWG for Multichannel Optical Transmission Systems", *IEEE Photonics Technology Letters*, Vol. 10(2), pp. 276–278, February, 1998 and U.S. Pat. No. 6,118,562, both of which are incorporated herein by their reference.

Also, another monitoring system that can be utilized for monitor 130 is shown in FIG. 10 and is disclosed in U.S. Pat. Nos. 5,825,792 and 6,005,995, which patents are incorporated herein by its reference. FIG. 10 is identical to FIG. 6 so that like elements are identified with the same numerical indicators in these figures. System 300 in FIG. 10, however, differs from system 100 in FIG. 6 in that the pair of photodetectors 122 and 124 are not utilized but rather a small portion of the multiplexed channel signals is tapped off fiber 128 via tap 302 and the tapped signal is directed to optical spectrum monitor 330 via optical fiber 304 where processing in accordance with U.S. Pat. No. 5,825,792 is conducted.

Monitor 330 provides differential output signal from the signal on waveguide 304 which is provided to a pair of photodetectors employed in the feedback loop from monitor 130 to controller 132, via line 130, to heater control circuit 158 to adjust and stabilize the wavelength generated by each laser source 108 to a standardized wavelength grid. In the case here, as well as in all other case of such monitoring systems, this wavelength adjustment is accomplished with respect to temperature changes imposed upon each of the laser source 108 via its respective heater 111(1) . . . 111(N) or other wavelength tuning element. However, it should be understood that other laser imposed changes can be utilized, such as current and voltage changes, phase changes, and stress changes as previously mentioned. The control signal provided for wavelength stabilization is provided in monitor 330 through the employment of a narrow passband wavelength transmission filter via a Fabry-Perot etalon in the manner illustrated in patent '792. The etalon is inclined at an angle to provide for tuning of laser sources 108 via the multiple transmission peaks provided by the etalon so that multiple peak points are obtained from the etalon at the wavelength spacing characteristic of the wavelength grid of the laser array. These peaks can be compared to the desired peaks of the standardized wavelength grid to adjust the individual operating wavelengths of laser sources 108 via heater elements 111 and heater DAC control circuit 158.

Having explained various wavelocking schemes relative to FIGS. 6 and 10, reference is again made to FIG. 6 to describe the remaining control circuitry for systems 100 and 300. As shown in FIG. 6, each of the EAMs 110(1) . . . 110(N) is coupled to a current circuit driver 134. Driver 134 provides the RF signal for modulation of EAMs 110. EAM bias control circuit 152 is provided to input B of driver circuit 134. Circuit 152 provides the bias point of operation for each of the modulators 110. The EAM peak-to-peak control 160 provides for the AC modulated swing to maximum and minimum swing points of the signal modulation and is coupled to input P of driver 134. EAM zero crossing control provides a means for changing the zero crossing of the signal compliments of the modulated signal to provide a better pulse transition from the electrical to the optical domain, which effectively changes the duty cycle of optical modulation. This control is employed in conjunction with bias control 150, for example, to advance the zero point crossing of the modulated signal. Lastly, driver circuit 134 is biased via lines 135 and 137.

Also shown in FIG. 6 is the control for monitoring and adjusting the temperature of TxPIC 101 within package 102 via TEC unit 104. Thermistor 103 is attached to TxPIC chip 101 to monitor its temperature and is coupled to current source 142 via line 141 and ground via line or ground point 139. Also, thermistor 103 is connected as one input to OP AMP 144. The inputs 141 and 143 of OP AMP 144 respectively receive a signal representative of the current temperature of TxPIC chip 101 via thermistor 103 and the desired or predetermined temperature provided from the system controller via temperature control digital-to-analog converter (DAC) circuit 140 via line 143. TEC unit 104 is coupled to receive the output from OP AMP 144 via line 136 and is also coupled to ground 139. Amplifier 144 provides an analog output representative of the amount of power change to be applied to TEC unit 104 for increasing or decreasing the temperature of TxPIC chip 101 in accordance with desired temperature setting represented by the signal from circuit 140 relative to the detected temperature sensed via biased thermistor 103. This type of temperature control circuitry is well known in the art.

FIG. 7 represents a bock diagram of the TxPIC chip 101 of FIG. 6 and, therefore, like elements have the same numerical identification where the previous description of these elements is equally applicable here. The major differences in FIG. 7, relative to FIG. 6, are two fold. First, TEC unit 104A is monitoring and controlling the temperature of operation of AWG 118 via controller 161. Thus, controller 161 controls the temperature of operation of AWG 118 via TEC unit 104A and the individual temperatures of heaters 111(1) . . . 111(N) based upon settings established at the factory for pre-setting both the operating wavelengths of the individual DFB laser sources 108(1) . . . 108(N) to a standardized wavelength grid as well as optimizing and maintain the temperature of AWG 118 so that the AWG wavelength grid best matches the wavelength grid of transmission wavelength peaks of the DFB laser array. In this case, the temperature of AWG 118 can be monitored via a first monitoring thermistor as well as the overall temperature of TxPIC chip 101 monitored via a second monitoring thermistor. In this particular situation, a second TEC unit (not shown) can be applied to the remaining portions of chip 101, i.e., other than AWG 118, for purposes of controlling the temperature of chip 101 not to be too high, i.e., provide for its cooling while heaters 111 are deployed to control the operating wavelengths of the individual DFB laser sources 108 to operate within the standardized wavelength grid.

The second major difference is the provision of a plurality of wavelength multiplexed signal outputs from AWG 118 which, in the example here, are shown as three outputs along the zero order Brillouin zone comprising output waveguides 120A, 120B and 120C. Furthermore, these outputs are optionally coupled to respective photodiodes 155, 157 and 159 integrally formed on TxPIC chip 101. The purpose of multiple outputs 120A–120C is to provide flexibility in providing the optimum output multiplexed signal from AWG 118 in terms of signal intensity and passband selectivity. During factory electro-optic circuit testing, photodetectors 155, 157 and 159 are deployed to monitor the AWG passband of each of the outputs 120A, 120B and 120C to determine which output has the optimum passband for the desired standardized wavelength grid. After this determination has been made, the photodetectors 155, 157 and 159 may be removed from TxPIC chip 101 by cleaving the chip along the cleave (dotted) line 165 and the chosen AWG output is thereafter coupled to the output optical fiber 128 (FIG. 6).

It should be noted at this point that, alternatively, photodetectors 155, 157 and 159 may not be cleaved from chip 101; rather, the in-line photodetector of the selected PIC multiplexed output is merely maintain inoperative with no applied bias, or with a small amount of positive bias as may be necessary to render the in-line detector transparent to the combined multiplexed output channel signals, while the other two monitoring photodetectors can be deployed for wavelength monitoring in lieu of photodetectors 122 and 124 discussed in connection with the embodiment of FIGS. 6 and 10. Lastly, any one of these photodetectors can be provided with an identifying tag, such as a low frequency tone, to identify itself in the network or to an optical receiver that is a particular TxPIC in the system for purposes, for example, of feedback of information from such a receiver as to the quality of transmitted channels signals in order that signal quality corrections may be made at the identified TxPIC. It should be noted that this scheme is not intended to replace similar data that may be in the OTN header for client signals as defined in ITU-T G.709. It is intended as a communication or service channel between transmitting and receiving modules.

Also, another feature of TxPIC chip 101 is that, multiple photodiodes or detectors, in addition to photodetectors 155, 156 and 157, can be provided in an array or multiple outputs from AWG 118, which outputs are at least equal in number to the number of signal channels fabricated on TxPIC chip 101. In this manner, if all of the multiple laser sources 108, electro-optic modulators 112 and SOAs 114 of TxPIC chip 101, then the N number of photodetectors 155, 157, 159 are merely cleaved at 165 off of chip 101 after testing of the AWG wavelength grid passband, for example. However, if any of these latter mentioned optical components, other than AWG 118, do not operate to desired expectations and specifications, TxPIC chip 101 can be still salvaged as an optical receiver PIC (RxPIC) by cleaving chip 101 along both cleave lines 163 and 165. In this case, one of the selected outputs from AWG 118 now functions as an input for a received multiplexed channel signals where AWG 118 now functions as an optical signal demultiplexer rather than an optical signal multiplexer. Multiple outputs on waveguides 118X from AWG 118 to photodiodes 116(1) ... 116(N) function as demultiplexed signal channel waveguides to these photodetectors in the defined chip portion 101CP and respectively detect channel signals for conversion to an electrical signal as known in the art. In this particular case, additional photodetectors 122A and 124A may also be already included in the original input side of AWG 118 at higher order Brillouin zones, as shown in FIG. 7, and employed to monitor the optical characteristics of the received channel signals, such as, signal intensity or power. In this embodiment, birefringent filters may be employed with the RxPIC chip to provide for polarization insensitive detection at the photodiodes 118X. It should be noted that an RxPIC AWG needs be polarization insensitive while it is not necessary for a TxPIC AWG. However, for this embodiment, polarization insensitive TxPIC AWGs can be fabricated to achieve complete fulfillment of this embodiment.

Reference is now made to the embodiments of FIGS. 8 and 9 where a direct modulation system 200 is disclosed for TxPIC chip 101A. In FIGS. 8 and 9, like number elements and components in previously discussed FIGS. 6, 7 and 10 found in FIGS. 8 and 9 function in the same manner as in previous embodiments and, therefore, the description in those embodiments is equally applicable to the embodiment of FIGS. 8 and 9. Here, however, the differences are that DFB laser sources 108(1) ... 108(N) are directly modulated via driver 134 as in the case of the embodiment of FIG. 1; optical spectrum monitor 230 utilizes only one photodetector 124 for feedback and wavelength stabilization of the respective operating wavelengths of DFB sources 108(1) ... 108(N); and a photodetectors 109(1) ... 109(N) are provided in the optical paths of the signal channels from DFB laser sources 108.

With reference to optical spectrum monitor 230, reference is made to the wavelength monitoring and correction scheme illustrated in FIG. 9. Before discussion of this wavelength monitoring and correction scheme, some attributes of this embodiment will be first discussed. TxPIC chip 10A is a version of TxPIC chip 101, similar to the embodiment of FIG. 3 except that photodetectors 109(1) ... 109(N) are provided between the array of laser sources 108(1) ... 108(N) and AWG 118 to monitor the output of their respective lasers. Photodetectors 109, whether the embodiment of FIG. 8 or FIG. 9, provide three different functions: DFB laser power monitoring; variable attenuation to the output of their respective DFB lasers; and apply a tone on the signal for purposes of wavelength locking relative to previously explained wavelength embodiments utilizing pilot tones for tagging array laser outputs. Relative to the first named function, the photodetectors 109(1) ... 109(N) may be deployed for monitoring the intensity output of their respective DFB laser source 108 to insure it is operating at the proper power level. Relative to the second named function, the photodetectors 109 can operate as attenuators through negative bias operation to render the outputs of the DFB lasers across the array uniform, independent of the individual laser bias conditions relative to each other. Relative to the third named function, the photodetectors can each be coupled to a tone generator to provide different tone tags to each laser channel signal for purposes of wavelength locking, as previously discussed in connection with FIG. 6 and K. J. Park et al. FM locking scheme, incorporated by reference. In order to perform these functions simultaneously, it is within the scope of this invention to provide cascaded photodetectors, such as shown in the case of additional photodiodes 109A(1) ... 109A(N) in FIG. 9. Additional such photodiodes can be provided in addition to those illustrated in FIG. 9. In this case, for example, photodiodes 109 are utilized, under negative bias, to provide for signal monitoring and selected channel signal attenuation to provide, for example, for power distribution per channel where the power across the respective signal channels may be uniform or non-uniform depending on requirements in the network, e.g., some channels may be required to have more power than other channels such as due higher insertion losses that will be experience by signals in these channels in the network. Another example is that an intensity or gain tilt may need to be applied across the signal channels of the modulated source array. This area of selective channel power distribution is called, pre-emphasis.

Photodiodes 109A are utilized to provide a channel identification tag, from tone generator 245, which tags are in the form of a low frequency or tone where a different frequency is superimposed on each modulated laser source output. This tone deployment is an alternate approach to the deployment of tones via tone generators 240(1) ... 240(N) directly to the direct modulation inputs of laser sources 108(1) ... 108(N) in FIG. 9.

While tones have been chosen to illustrate a particular form of optical modulation useful for channel identification and signal processing for wavelength locking, other modulation formats such as multitone, spread spectrum, square wave, tone burst, etc. are envisioned, depending on specific signal processing requirements. Similarly, while the variable optical attenuator role of the photodetectors has been discussed in connection with equalization of optical channel powers emerging from the TxPIC, more general relationships among individual optical channel powers are envisioned. In particular, pre-emphasis, i.e., deliberately arranging unequal individual optical channel powers from the transmitter to compensate for channel-dependent unequal losses in transmission links, is envisioned and enabled by the variable optical attenuator function on individual optical channels. This may also achieved by varying the average bias point of the laser sources to the extent that it does not compromise the reliability or transmission characteristics of the modulation of the modulators.

FIG. 9 is a block diagram of a "smaller version" of TxPIC chip 101 of FIG. 8, which is connected to a signal dithering system. In the embodiment of FIG. 8A, the higher order Brillouin zone output of integrated photodetector 124 provides an electrical output signal proportional to a small portion of the multiplexed channel signals. Each laser has its driver current modulated by a dither current, a low frequency AC component having a modulation depth and frequency. The AC modulation current causes a corresponding low frequency variation in laser wavelength. Electronic frequency filters permit the response at each dither frequency to be measured from the photodetector response. Feedback electronics provides a control loop for adjusting the dither modulation depth and bias point. Since each laser has its own unique dither frequency, its wavelength and power response may be identified by using a lock-in technique to analyze the frequency response of the photodetector at the dither frequency.

By dithering the wavelength of each laser at a low frequency dither frequency (e.g., in the range of about 1 KHz to about 200 KHz), the wavelength of the laser will oscillate with the low frequency dither. The modulation depth of the laser frequency shift is controlled to be appropriate for the passband and control loop electronics to form a stable control loop with the desired wavelength locking. At the optical receiver end, the small low-frequency amplitude variations in received channel signal power may be filtered out. Since the dither frequency is many orders of magnitude smaller than the bit rate, the instantaneous linewidth will appear fixed for even a large bit pattern (e.g., $10^6$ bits for the OC-192 standard).

A controller may monitor the change in power output at the dither frequency and employ a control loop to establish an operating point or reference point on the passband fringe or side of the peak passband of an Fabry-Perot etalon. Thus, the passband fringe of the etalon can be deployed to provide detection of signal intensity differences brought about by using different frequency tones. Thus, a pair of detectors, where one is a reference, can discern which direction, plus or minus, is an intensity change of one or all of the signal tone frequencies and there can identify a particular modulated source output and an indication of its operating wavelength. This approach can be characterized as intensity modulation (IM) detection whereas the previously approach can be characterized as frequency modulation (FM) detection.

It will be understood that the dithering can be performed on a single laser and the wavelength of the other lasers locked (assuming that they have the same wavelength response). Alternatively more than one laser may be dithered at a different dither frequency and independently adjusted to lock it to its corresponding desired wavelength. Thus, every laser may be dithered and independently locked or just a few lasers, like two or more lasers, may be dithered and locked, and only one laser is dithered and wavelength locked at any one given time. In this latter case, one channel may be locked, and the other channels adjusted based on the offset in temperature/current required to lock the laser. Alternatively, the locking may be cycled sequentially among lasers. If the array locking is cycled, an interpolation method may be used for some of the channels. It should be understood that in all of the foregoing cases, while the laser is locked to the peak of the passband response, it should be understood that the laser wavelength may, as well, be locked to the edges of the passband response rather than its peak, such as, in a manner shown in FIG. 6A.

In particular, as shown FIG. 9, DFB laser sources 108(1) ... 8(N) are modulated by current drivers 134(1) ... 134(N) which also include tone generators 240(1) ... 240(N), each of a different low frequency in the range, for example, of 1 KHz to 200 KHz for the purpose of providing channel identification relative to each channel wavelength as well as means to determine wavelength deviation from the desired grid wavelength of a laser source. The output of DFB laser sources 108 are monitored by photodiodes 109 (as previously discussed, photodiodes 109A are optional). The individual modulated outputs of laser sources 108 are then multiplexed via AWG 118 and provided on output 120 to EDFA 126. A portion of the multiplexed signal output of AWG 118 is taken, via higher order Brillouin zone detector 124, to optical spectrum monitor 230 via line 129 where the multiplexed signal is amplified at electronic amplifier 231. The signal is then divided via splitter 232 into multiple signals, one each for each of N channels and the respective split signals are provided to filters 233(1) ... 233(N) wherein the individual wavelengths are filtered based on their identification tag tone and the identified channel wavelengths are provided to controller 132 where the amplitude and phase of the channel signals are respectively determined and compared to the peak of the passband of each laser source grid wavelength from which a correction signal is derived, determinative of the amount of correction that is applicable to bring the operating wavelength of each of the respective lasers to its peak grid wavelength. This is accomplished by providing a change in the applied current or bias to the respective temperature changing elements 111(1) ... 111(N) for each laser source 108(1) ... 108(N), the latter of which is illustrated in FIG. 9.

Reference is now made to FIG. 12A which illustrates a flow chart for the procedure to set the wavelength grid of the AWG optical multiplexer to the set wavelengths of the DFB laser source, resulting in a DFB array wavelength grid for optimal matching with the AWG wavelength grid. This procedure is appropriate relative to the several embodiments of TxPICs disclosed herein. This function of setting wavelength grids is performed under digital computer control relative to the analog measurement of the AWG multiplexer temperature and the temperature setting and control of both the array of DFB laser sources and the AWG optical multiplexer. This testing, adjustment and optimization procedure is done at the factory where the optimized values are stored and saved for later use in the field upon installation, for example of a transmitter module included on a digital line module (DLM) in an optical transport network (OTN). First, a desired wavelength is selected relative to the standardized grid, indicated at 400, such as $\lambda_1$ for the first laser source indicated at 402. Adjustment of the laser source wavelength at 404 is made to be on the wavelength of the standard grid. If the adjustment at 408 is not achieved, the adjustment is redone again to make sure the selected laser source is operating properly. If the source is not operating properly and cannot be frequency tuned via its heater, the TxPIC chip is rejected and no more testing is done unless there are redundant laser sources built into the TxPIC chip that can be substituted for the inoperative laser/heater source.

If the desired adjustment in wavelength at 406 is achieved, then the temperature of the AWG multiplexer can be checked and varied as shown at 408 to optimize the matching of the adjustment of the first laser wavelength with the passband of the AWG. The AWG output from the TxPIC is checked to determine if the output peak power is optimized at 410 and if not, a readjustment is made. If the output peak power of the AWG is optimized to the first laser wavelength, the value is set relative to the temperature, $T_{AWG}$, for the AWG as indicated at 412, and the value results of the adjustment are saved as indicated at 414. If there are additional laser sources to check as queried at 416, the next laser source on the TxPIC chip is selected and the process of DFB laser source peak wavelength adjustment and rechecking and adjusting the output peak power of the AWG is accomplished with the value results saved. This process is repeated until the last laser source on the TxPIC chip has been adjusted and checked as queried at 416 at which time the saved value results of all of these adjustments are stored, as indicated at 420, in memory 422. The resulting stored values represent the optimized temperature settings for the individual laser sources and their best match to the wavelength grid of the AWG multiplexer. The resulting adjustments of the AWG wavelength grid relative to each of the several laser sources can be utilized to determine a final temperature value, $T_{AWG}$, for which the AWG wavelength grid is best matched to all of the wavelengths of the wavelength grid of the DFB laser array of the TxPIC. The stored information at 422 is then used in the field at the time of system installation or during later adjustments to check the data entries as to the original adjustments made at the factory and make any readjustments necessary to optimize the DFB laser source wavelength grid to the AWG wavelength grid in accordance with the stored data for the particular TxPIC chip.

It is within the scope of this invention to adjust the wavelength grid of the DFB laser sources by checking and adjusting only one or two of the DFB laser sources (usually only one) to determine the proper heater value for the check laser to be on the desired wavelength grid. Since the DFB laser array was preferably fabricated employing SAG, as set forth in U.S. patent application Ser. No. 10/267,346 supra, to fabricate each laser to proper material composition and bandgap to achieve a desired operational wavelength on the standardized grid, the heater value of the other DFB laser source heaters may also be set to this same value, based upon the accuracy of the SAG processing of these laser sources, thereby setting the wavelength grid of the DFB laser array. Then, the AWG wavelength grid can also be adjusted to thereafter to optimize its match to the .DFB array wavelength grid. In following this process, it may be necessary to consider readjusting the wavelength grid of the DFB laser array.

Reference is now made to FIG. 12B which illustrates a flow chart for the procedure for testing, at the wafer level, the lasers on the TxPIC chip to insure that the passband of the optical multiplexer match up with the lasers and make adjustments, such as through current or temperature adjustments at the respective lasers or temperature adjustments at the optical multiplexer to ensure achieving wavelength grid matching of the laser sources and the optical multiplexer after the TxPICs are cleaved from the InP wafer. Those TxPICs that are not properly grid matched can be possibly further worked to render them with proper operational characteristics including proper optical multiplexer passband requirements. However, those TxPICs that are not in proper functional order may be cleaved from the wafer and discarded without any further testing. In this manner TxPIC devices can be tested while still in the wafer saving time and resource expense later on in initially wire bonding and die-attaching the chips or subjecting the chips to a test probe and, in either case, testing them. If the chips can be tested before being cleaved from the InP wafer, resources deployed later on are saved from testing nonfunctional chips. The individual TxPIC chips in the wafer can be tested using a probe, such as illustrated in U.S. patent application Ser. No. 10/267,331 filed Oct. 8, 2002, supra. The TxPIC chip output is monitored by a photodiode at the output of the optical multiplexer, such as by means of probe testing one of the PIN photodiodes 155, 157, 159 as shown in FIG. 7. In this manner, with reference again to the TxPIC chip in FIG. 7, the in-wafer testing probe as shown in Ser. No. 10/267,331 be applied to each in-wafer chip with bias probes for DC bias of DFB laser sources, electro-absorption modulators 112 as well as DFB laser source drive signals to the DFB laser sources 108 and test modulation signals to the RF modulation lines to the respective modulators 112 wherein the signal output can be monitored at PIN photodiodes 155, 157 or 159.

The test procedure set forth in FIG. 12B is as follows. First, the TxPIC chips are formed on an InP wafer as indicated at 424 and as set forth in more detail in the incorporated provisional applications, in particular, U.S. patent application Ser. No. 10/267,346 supra. The TxPIC die are formed on the InP wafer, including appropriate lithographic procedures followed by contact metallization so that the TxPIC outputs can be checked via a photodiode as indicated in the previous paragraph. Next, a determination having been made that all TxPICs have not been tested at 426 and, if not, the probe tester is applied to an untested, in-wafer TxPIC wherein a test contact is applied to a photodiode (PD) output (428) at the TxPIC AWG output (FIG. 7 and PDs 155, 157 or 159) and a selected DFB laser source is driven by an appropriate applied bias (430) and its corresponding modulator is driven by an applied bias and test modulation signal (432) and the output from the arrayed waveguide grating is detected via the AWG output photodiode output via the testing probe, as indicated at 434. Then, the wavelength grid of the AWG is checked to see if its passband substantially matches the grid wavelength grid of the selected DFB laser source as indicated at 436. If not, then the selected DFB laser source is tuned via change in the applied bias or via applied electrical contact by the testing probe of the laser strip heater, such as heaters 111 shown in FIG. 7 (444). If they are not tunable to properly lie within the standardized grid and within the passband of the AWG, the chip or die will be noted or marked for rework or scrap (448)

when it is eventually cleaved from the wafer. If the selected DFB laser source is tunable, as indicated at 446, then, further testing is accomplished to determine if, in fact, the wavelength grid of the selected DFB laser source has substantially changed to match the passband of the AWG (without, of course, any applied temperature tuning to the AWG since the chip is being tested in-wafer). If yes, then a determination is made that all of the DFB laser sources on the TxPIC have been properly tested (438) to be within tunable limits of and lie in the passband of the AWG. If other DFB laser sources on the same in-wafer chip still need to be tested, the next laser source is selected (440) and the same process of laser operation (430), modulator operation (432) and testing (436) and tuning (444) is achieved until all of the laser sources on the in-wafer chip have been tested (438) at which point the next in-wafer TxPIC is selected (442) for testing by the testing probe. When all the TXPICs have been tested (426), the TxPICs are cleaved from the wafer, as indicated at 450, and those that have been indicated as capable of being marked for rework (448) are checked again to set if they are still capable of rework (452). If yes, they are reworked (454). If no, the chip is discarded (456). After reworked chips have been completed, they may again be tested (442) for wavelength grid being within the passband of the AWG in accordance with the flow of FIG. 12B. Items that may be reworked on TxPIC chips are, for example, electrical contact shorts, poor contacts or bonding pads, etc.

Matching the modulator design to each different laser source is important to achieve a high-performance Tx PIC. The chirp parameter and extinction ratio of a quantum well electro-absorption modulator 462 are a function of the change in absorption characteristics and refractive index of the modulator with bias voltage. Typically, a voltage bias may be selected over a range within which the chirp parameter shifts from positive to negative. It is desirable to have a controlled chirp selected to achieve a best transmission performance appropriate for the channel wavelength and the fiber dispersion. This can be achieved in several ways which may be utilized separately or in conjunction with one another. One way to adjust the characteristics of the optical modulator is to vary the DC bias and swing voltage of the modulator. A second is method is to vary the modulator structure along the different elements of the array. This may be achieved via SAG multiple regrowth techniques, or disordering. Alternatively, the modulator may comprise cascaded electro-absorption modulators 458A and 458B as illustrated in FIG. 13. The first electro-absorption modulator 458A is deployed to generate a periodic string of pulses at a clock frequency (e.g., 10 GHz). The pulses may be amplified in an optional semiconductor optical amplifier (SOA) to enhance the modulated signal amplitude and compensate for insertion loss of modulator 458A. The second electro-absorption modulator 458B may be used to provide a gating function to put data on the modulated signal from modulator 458A. One benefit of this embodiment is that it permits a RZ format. Additionally, by appropriately setting the electro-absorption modulator parameters, a controlled chirp may be achieved.

Reference is now made to FIG. 14. FIG. 14 illustrates a single optical waveguide or path of a SML in a TxPIC comprising a DFB laser 460, a first electro-absorption modulator 462, a second electro-absorption modulator 466 followed by a spot size converter (SSC) 468 which may also function as a saturable absorber (SA). This tandem modulator structure may include a semiconductor optical amplifier 464 between the first and second modulators 462 and 466. Such a semiconductor structure is formed on an InP substrate upon which are deposited an n-InP layer 470, a Q (InGaAsP or AlInGaAs Quaternary quantum well) quantum well region 472, p-InP layer 474, an optional Q (InGaAsP) layer 476 and a p-InP layer 478. On Layer 478 is deposited a contact layer (not shown comprising $p^{++}$-InGaAs. SSC 468 may include a taper 469 to maintain single mode consistency for input to an optical multiplexer (not shown) on the same TxPIC chip. See, also the article of Beck Mason et al. entitled, "40-GB/s Tandem Electroabsorption Modulator", *IEEE Photonics Technology Letters*, Vol. 14(1), pp. 27–29, January, 2002, which article is incorporated herein by its reference. Note that the other forms of this structure are also viable, included buried heterostructure forms as well as buried rib-loaded slab structures.

The tandem or multi-segment EA modulators 462 and 466 are designed to operate with NRZ pulses wherein modulator 466 includes an unpumped or partially pumped region 468 at the exit port of the modulator that functions as a saturable absorber. The saturable absorber can be reverse biased to provide more stable operating characteristics during high speed modulation. This is because absorber region 468 provides non-linear amplitude transmission characteristics which favor high amplitude modulated signals and, therefore, increases the extinction ratio of the channel modulator 462. This absorber can be positioned anywhere downstream in the optical waveguide path from modulator 466 before the optical multiplexer.

Referring now to FIG. 15, a two-section cooler 480 ($T_1$ and $T_2$), comprising sections 480A and 480B, may be deployed instead of a single cooler 18 illustrated in FIG. 3. The two-section cooler 480 provides for separate adjust the temperature of AWG section 486 and DFB laser source section 484 of TxPIC 482. To be noted is that TxPIC 482 is comparatively large, i.e., has an area of several square millimeters or more. A temperature gradient may be formed on TxPIC 482, i.e., different temperature zones may be formed on the TxPIC substrate although there will be a temperature gradient between the different temperature zones. A two-section heat sink 480 may be configured to provide separate temperature control for different portions of TxPIC submount 487 as shown in FIG. 15. The two-section heat sink may, for example, have a first portion 480A separated from a second portion 480B by a thin thermally insulating layer 490 to permit two separate temperature controllers (not shown) to independently regulate the temperature of each portion of the heat sink 480. If desired, a notch 492 or other thermal barrier may be formed into submount 487 to independently control heat transfer between different portions of submount 487. The size and arrangement of the two sections of heat sink 480 may, for example, be selected to form a first temperature zone 496 for AWG 486 and a second temperature zone 494 for the optical signal sources. Components of each optical signal source that have a response that is strongly dependent upon temperature, such as the DFB laser sources 484, are preferably located within second temperature zone 494. Components that are insensitive to small variations in temperature, such as., passive waveguides and/or EAM modulators 488, may reside in a resulting temperature gradient region between the two temperature zones 494 and 496.

Moreover, to enhance the separation of such components, passive waveguide section 488 coupling each optical signal source to AWG 486 may be extended in length to sufficiently space apart the AWG from temperature sensitive, semiconductor modulator/laser (SML) components, although this entails the use of more chip area. Alternatively, as shown in FIG. 16, the coolers' 480 ($T_1$ and $T_2$) may be confined more to TxPIC regions requiring temperature control, i.e., DFB laser sources 484 relative to TEC cooler 480A and AWG 486 relative to TEC cooler 480B were the thermally insulating region 491 separating temperature zones 494 and 496 is much larger compared to layer 490 in the embodiment in FIG. 15. This larger isolation of zones 494 and 496 provides for a greater degree in control of the overall temperature of the DFB laser sources 484 independent of the temperature control of AWG 486.

Note that the approach of FIGS. 15-16 may be further extended to provide per channel coolers for each of the laser sources as well as optionally an additional cooler for the AWG multiplexer. This is illustrated in FIG. 24 that shows: an array 736 of micro TECs 736(1) . . . 736(N) for individually controlling each laser source 730(1) . . . 730(N) in laser array 730(N), a patterned submount 732, preferably made from AlN, and a TxPIC chip 10 positioned on submount 734 again, laser sources 730(N) can be either DFB laser sources of DBR laser sources. A micro TEC array 736 may be defined as an array of TECs 736(1) . . . 736(N) with a spacing greater than 1 mm and preferably greater than 300–500 µm per channel. In order to optimize the thermal isolation between laser components 730(1) . . . 730(N), an array of thermal chokes 742 may be formed in submount 734 as shown in FIG. 24. These thermal chokes 742 are located between formed thermal channels 735 and are comprised of a material that has significantly lower thermal conductivity than the surrounding sub mount material. A preferred embodiment is to have thermal chokes 742 be comprised of an air gap. Furthermore, the thermal coupling to each individual laser source 730(1) . . . 730(N) may be improved by providing a thermal shunt 744 formed in vias on InP substrate 734. A thermal shunt 744 is respectively aligned with each laser source 730(1) . . . 730(N) and is filled with a material, e.g., Au, which has significantly higher thermal conductivity than the surrounding InP substrate bulk. In the ideal case, the via will reach up to the bottom or near the bottom of each laser source 730(N), but will not make electrical contact with the laser source 730(N). In addition to the laser source array 730, an individual TEC cooler may be provided in the AWG region as illustrated in FIG. 15 or 16. The embodiment of FIG. 24 is preferred in that TxPIC chip 10 is solely temperature-controlled with per channel thermal micro-TEC elements 736(1) . . . 736(N). Each microelement 736(N), which is only a couple of one hundred microns wide, e.g., 200 to 300 mm wide, individually control each channel 735 to a different temperature and, correspondingly hold each laser source 730(N) to a desired operating temperature. As a result, the junction temperature of the DFB lasers 730(N) is reduced and the tuning range of each laser source 730(N) is broadened. If desired or required, the tuning range of each laser source 730(N) may be further extended by providing a micro-tuning element (e.g., heater or current tuning) in addition to each micro TEC element 736(N). The laser sources 730(N) may be DFB or DBR lasers.

Referring again to FIGS. 15 and 16, note TxPIC chip 482 may be also mounted junction-down so that the junction region of its active, SML devices on the TxPIC are in closer proximity to heatsink 494. In a junction-up embodiment, TxPIC 482 may reside on a common temperature regulated heat sink, such as a TEC. As previously discussed, AWG 486 may have its own integrated local heater for controlling the temperature of AWG 486 independently of other components of the TxPIC. The local heater may comprise a microstrip thin film heater, such as a thin film of platinum, NiCr, or TaN, or other elements as commonly known in the art, patterned as a resistive heater element over the top of AWG 486. The heater may be placed on the top surface of AWG 486 or placed proximate to its sides. Alternatively, an electrically resistive element may be integrated into the semiconductor materials underlying AWG 486 for resistively heating it. Such a resistive element may be patterned such as by varying the electrical resistivity of a InP heater layer beneath the AWG as illustrated in FIG. 17. In FIG. 17, a cross-sectional representation of AWG 486 is illustrated comprising, as an example, a InP substrate 500, a n$^+$-InP layer 502, n$^{++}$-InP heater layer 504, Q layer 506 (which is the grating layer with a formed grating therein in the DFB laser source portion of the TxPIC), InP layer 508, Q (InGaAsP or AlInGaAs) multiple quantum well region 510, InP layer 512, optional Q rib, ridge waveguide layer 514, and NID (Non-intentionally doped) InP clad layer 516. Note in this cross-sectional view that heater layer 504 can be biased to adjust the temperature ambient of the overlying AWG free space regions and gratings formed in Q layer 510. Note that other embodiments are also feasible, including isolating a lower doped n-InP channel with semi-insulating layers (e.g., of InP) or alternatively utilizing InAlGaAs materials for the heater or current isolating layers.

In another approach, which has already been previously explained relative to FIG. 3, the TxPIC 482 may be mounted to a common cooler (e.g., a TEC) and the temperature of the cooler is selected to tune the refractive index of the AWG to achieve a desired passband response of the AWG. In this embodiment, the wavelength of each semiconductor laser is adjusted (e.g., by varying its drive current or by tuning its local temperature by its local thin film heater) and the wavelength grid of the AWG is tuned, via the TEC, to match the wavelength grid of the DFB laser sources.

In addition to temperature tuning of the refractive index of the AWG, the refractive index of the AWG to accomplish grid tuning may be varied using electrical methods, such as by applying a voltage or a current to the region of the AWG. For example, if the AWG is composed of PIN semiconductor layers similar to those of passive waveguide sections deployed in Mach Zehnder modulators, a reverse bias voltage may be applied to vary the refractive index of the AWG. By applying a forward bias, the charge density may be varied in AWG layers, also changing its relative refractive index. An electrically tunable AWG has the advantage that it may be used in a junction down configuration with the TxPIC chip flip-chip mounted to a common heat-sink. Note that it is preferable that for an electrically tuned AWG, only a limited portion of the AWG be tuned as the elements required to facilitate tuning (doped junctions) increase the loss of the device.

Reference is now made to FIG. 18 which illustrates in cross-section the DFB laser source section from a TxPIC chip. The device shown comprises an Fe doped InP substrate 620 upon which is sequentially deposited, employing MOCVD, n-InP buffer layer 622, n$^{++}$-InP heater layer 624, InP space layer 626, Fe doped InP buffer layer 628, InP space layer 630, n-InP contact layer 632, Q (InGaAsP or AlInGaAs) DFB grating layer 634, InP space layer 636 which also renders grating layer 632 substantially flat, Q (InGaAsP or AlInGaAs) multiple quantum well region 638, an InP layer 640, optional Q rib layer 642 forming part of the ridge waveguide structure comprising layers 642, 644 and 646, p-InP layer 644 and p$^{++}$-InGaAs contact layer 646. In the case here, n-side contact layer 632 is utilized for contacting to the DFB laser source. The p-side contact is, of course at layer 646. Thus, the current path and applied bias across the DFB laser source is between n and p contact layers 632 and 646 via the intervening layers. This applied bias does not pass through insulating buffer layer 626. Thus, a current path can be established through heater layer 624 With such an n-side contact layer in place, a Fe doped buffer layer can then be formed prior to the n-side contact layer and the n⁺-InP heater layer formed below Fe doped buffer layer. As a result, an electrical path separation for pumping of the DFB laser source is established from that for pumping heater layer 624. Note that in connection with the placement of heater layer 624 in FIG. 18, the heater layer and the grating layer 634 may be positioned on the p-side of the DFB laser structure, i.e., above active region 638. However, the DFB laser fabrication would be more difficult to achieve in such a case. The tuning occurs via increasing the temperature of the heater layer which then varies the modal index of the DFB and hence the emission wavelength of the source.

While the invention has been described in conjunction with several specific embodiments, it will be evident to those skilled in the art that many further alternatives, modifications and variations will be apparent in light of the foregoing description. For example, in the foregoing described TxPIC embodiments, mention is made that all of the on-chip generated channel signals provided from electro-optic modulator/laser (EML) sets or modulated sources are provided as an active output to the on-chip optical multiplexer. However, it is within the scope of this invention that some of the modulated sources may not be operated so as to function later on to increase the channel capacity of the TxPIC or to later replace inoperative modulated source signal channels. Thus, the invention described herein is intended to embrace all such alternatives, modifications, applications and variations as may fall within the spirit and scope of the appended claims.

What is claimed is:

1. A method of operating an array of integrated laser sources formed as an array in a single monolithic chip, comprising the steps of:
providing an integrated array of laser sources designed for operation at different emission wavelengths which together provide a desired grid of spectral emission wavelengths and providing an on-chip array of outputs into integrated waveguides;
adjusting each laser source wavelength over time so that the laser sources are maintained to approximate the desired grid of spectral emission wavelengths; and
adjusting internal of the waveguides the power level of the laser source outputs so that the power levels of their outputs across the laser source array are substantially uniform across the integrated waveguides.

2. The method of claim 1 wherein the step of adjusting laser source wavelength comprises the step of adjust the operating current to each laser so that the laser sources are maintained to approximate the desired grid of spectral emission wavelengths.

3. The method of claim 1 wherein the step of adjusting laser source wavelength comprises the steps of:
providing a plurality of tuning elements on the chip, each one integrated in close proximity to a respective laser source; and
adjusting the respective emission wavelengths of the laser sources via the tuning elements so that together the laser sources approximate the desired grid of spectral emission wavelengths.

4. The method of claim 1 comprising the further step of modulating the outputs from the laser sources with data signals.

5. The method of claim 1 comprising the further step of modulating the laser sources with data signals.

6. The method of claim 1 comprising the further step of utilizing an array of gain/loss elements integrated in the output waveguides, one each for a respective laser source, to provide for adjustment of the on-chip power level of the laser sources.

7. The method of claim 6 wherein the gain/loss elements are semiconductor optical amplifiers (SOAs), variable optical attenuators (VOAs) or photodiodes (PDs).

8. The method of claim 6 comprising the further steps of:
integrating an optical combiner that has a wavelength passband response on the single monolithic chip with the laser sources where the laser source outputs are received and combined via the optical combiner to provide a single output signal;
providing a second tuning element in proximity to the optical combiner; and
adjusting the second tuning element in conjunction with laser source tuning elements to adjust optical combiner wavelength passband response to be a closer match with the spectral emission wavelength grid of the laser sources.

9. The method of claim 8 wherein said optical combiner is an power combiner or a wavelength selective combiner.

10. The method of claim 9 wherein said combiner is a star coupler, multi-mode interference (MMI) coupler, an arrayed waveguide grating or an Echelle grating.

11. The method of claim 1 wherein the spectral emission wavelength grid approximates a standardized grid.

12. The method of claim 1 wherein the spectral emission wavelength grid is a symmetric or asymmetric wavelength grid.

13. The method of claim 1 wherein the laser sources are DFB lasers or DBR lasers.

14. The method of operating an array of laser sources integrated as an array in a single monolithic chip, comprising the steps of:
designing the laser sources to have different target emission wavelengths so that together they form a spectral emission wavelength grid;
coupling outputs from the laser sources to an array of gain/loss elements also integrated on the single monolithic chip, one each receiving the output from a respective laser source; and
adjusting the outputs with the gain/loss elements so that the power levels across the laser source array across are substantially uniform.

15. The method of claim 14 comprising the further step of adjusting the current to the laser sources so that the emission wavelength of each laser source is moved closer to its target emission wavelength.

16. The method of claim 14 comprising the further step of adjusting the emission wavelengths of the laser sources with an integrated array of first tuning elements, one each for each laser source, so that the emission wavelength of each laser source is moved closer to its target emission wavelength.

17. The method of claim 16 wherein said first tuning elements are temperature changing elements, current and voltage changing elements or bandgap changing elements.

18. The method of claim 14 comprising the further steps of both:
adjusting the current to the laser sources so that the emission wavelength of each laser source is moved closer to its target emission wavelength; and adjusting the emission wavelengths of the laser sources with an integrated array of first tuning elements, one each for each laser source, so that the emission wavelength of each laser source is moved closer to its target emission wavelength.

19. The method of claim 18 wherein said first tuning elements are temperature changing elements, current and voltage changing elements or bandgap changing elements.

20. The method of claim 14 wherein the gain/loss elements are semiconductor optical amplifiers (SOAs), variable optical attenuators (VOAs) or photodiodes (PDs).

21. The method of claim 14 wherein the spectral emission wavelength grid approximates a standardized grid.

22. The method of claim 14 wherein the spectral emission wavelength grid is a symmetric or asymmetric wavelength grid.

23. The method of claim 14 wherein the laser sources are DFB lasers or DBR lasers.

24. The method of claim 14 comprising the further step of modulating the outputs from the laser sources with data signals.

25. The method of claim 14 comprising the further step of modulating the laser sources with data signals.

26. The method of claim 14 comprising the further steps of:

integrating an optical combiner that has a wavelength passband response on the single monolithic chip with the laser sources where the laser source outputs are received and combined via the optical combiner to provide a single output signal;

providing a second tuning element in proximity to the optical combiner; and adjusting the second tuning element in conjunction with the first tuning elements to adjust optical combiner wavelength passband response to closer match with the spectral emission wavelength grid of the laser sources.

27. The method of claim 26 wherein said optical combiner is an power combiner or a wavelength selective combiner.

28. The method of claim 27 wherein said combiner is a star coupler, multi-mode interference (MMI) coupler, an arrayed waveguide grating or an Echelle grating.

29. The method of claim 26 comprising the further step of modulating the outputs from the laser sources with data signals.

30. The method of claim 26 comprising the further step of modulating the laser sources with data signals.

* * * * *